(12) United States Patent
Ashrafzadeh et al.

(10) Patent No.: US 9,536,800 B2
(45) Date of Patent: Jan. 3, 2017

(54) PACKAGED SEMICONDUCTOR DEVICES AND METHODS OF MANUFACTURING

(71) Applicant: Fairchild Semiconductor Corporation, San Jose, CA (US)

(72) Inventors: Ahmad R. Ashrafzadeh, Morgan Hill, CA (US); Adrian Mikolajczak, Los Altos, CA (US); Chung-Lin Wu, San Jose, CA (US); Maria Cristina Estacio, Lapulapu (PH)

(73) Assignee: Fairchild Semiconductor Corporation, San Jose, CA (US)

( * ) Notice: Subject to any disclaimer, the term of this patent is extended or adjusted under 35 U.S.C. 154(b) by 0 days.

(21) Appl. No.: 14/560,856

(22) Filed: Dec. 4, 2014

(65) Prior Publication Data

US 2015/0162270 A1 Jun. 11, 2015

Related U.S. Application Data

(60) Provisional application No. 61/913,267, filed on Dec. 7, 2013.

(51) Int. Cl.
*H01L 23/00* (2006.01)
*H01L 23/31* (2006.01)
*H01L 23/495* (2006.01)

(52) U.S. Cl.
CPC ..... *H01L 23/3107* (2013.01); *H01L 23/49503* (2013.01); *H01L 23/49541* (2013.01); *H01L 23/49548* (2013.01); *H01L 23/49551* (2013.01); *H01L 23/49562* (2013.01); *H01L 23/49575* (2013.01); *H01L 24/97* (2013.01);

(Continued)

(58) Field of Classification Search
CPC .......... H01L 2924/181; H01L 23/3107; H01L 23/49575; H01L 23/49541; H01L 23/49503
See application file for complete search history.

(56) References Cited

U.S. PATENT DOCUMENTS 5,977,630 A 11/1999 Woodworth et al.
6,040,626 A 3/2000 Cheah et al.
(Continued)

OTHER PUBLICATIONS

"CoolMOS (TM) in ThinPak 8×8—The new leadless SMD package for CoolMOS (TM)", Infineon Technologies AG, Product Brief, 2009, 2 pages.

(Continued)

*Primary Examiner* — Ngan Ngo
(74) *Attorney, Agent, or Firm* — Brake Hughes Bellermann LLP

(57) ABSTRACT

In one general aspect, a package can include a semiconductor die having a first terminal on a first side of the semiconductor die and a second terminal on a second side of the semiconductor die, a leadframe portion electrically coupled to the second terminal of the semiconductor die, and a molding compound. The first terminal on the first side of the semiconductor die, a first surface of the leadframe portion, and a first surface of the molding compound can define at least a portion of a first surface of the package. A second surface of the molding compound and a second surface of the leadframe portion can define at least a portion of a second surface of the package parallel to the first surface of the package, and the second surface can be on an opposite side of the package from the first surface of the package.

20 Claims, 20 Drawing Sheets

(52) U.S. Cl.
CPC .............. *H01L 2224/16245* (2013.01); *H01L 2924/13055* (2013.01); *H01L 2924/181* (2013.01)

(56) References Cited

U.S. PATENT DOCUMENTS

| | | | |
|---|---|---|---|
| 6,144,093 A | 11/2000 | Davis et al. |
| 6,255,722 B1 | 7/2001 | Ewer et al. |
| 6,297,552 B1 | 10/2001 | Davis et al. |
| 6,300,146 B1 | 10/2001 | Thierry |
| 6,362,964 B1 | 3/2002 | Dubhashi et al. |
| 6,396,127 B1 | 5/2002 | Munoz et al. |
| 6,396,138 B1 | 5/2002 | Cheah |
| 6,512,304 B2 | 1/2003 | Ewer |
| 6,593,622 B2 | 7/2003 | Kinzer et al. |
| 6,646,329 B2 | 11/2003 | Estacio et al. |
| 6,677,669 B2 | 1/2004 | Standing |
| 6,717,260 B2 | 4/2004 | Pavier et al. |
| 6,720,642 B1 | 4/2004 | Joshi et al. |
| 6,765,292 B2 | 7/2004 | Cheah et al. |
| 6,841,865 B2 | 1/2005 | Standing |
| 6,858,922 B2 | 2/2005 | Pavier |
| 6,891,256 B2 | 5/2005 | Joshi et al. |
| 6,924,175 B2 | 8/2005 | Pavier et al. |
| 7,034,385 B2 | 4/2006 | Ambrus |
| 7,045,884 B2 | 5/2006 | Standing |
| 7,095,099 B2 | 8/2006 | Oliver et al. |
| 7,119,447 B2 | 10/2006 | Larking |
| 7,122,884 B2 | 10/2006 | Cabahug et al. |
| 7,122,887 B2 | 10/2006 | Standing et al. |
| 7,202,557 B2 | 4/2007 | Oliver et al. |
| 7,230,333 B2 | 6/2007 | Standing |
| 7,235,877 B2 | 6/2007 | Pavier |
| 7,250,672 B2 | 7/2007 | Pavier et al. |
| 7,253,090 B2 | 8/2007 | Standing et al. |
| 7,285,866 B2 | 10/2007 | Standing et al. |
| 7,301,235 B2 | 11/2007 | Schaffer et al. |
| 7,315,081 B2 | 1/2008 | Standing |
| 7,323,361 B2 | 1/2008 | Chong et al. |
| 7,364,949 B2 | 4/2008 | Standing |
| 7,368,325 B2 | 5/2008 | Standing |
| 7,397,137 B2 | 7/2008 | Larking |
| 7,402,845 B2 | 7/2008 | Cheah et al. |
| 7,476,964 B2 | 1/2009 | Standing |
| 7,476,979 B2 | 1/2009 | Standing et al. |
| 7,482,681 B2 | 1/2009 | Standing |
| 7,547,964 B2 | 6/2009 | Pavier et al. |
| 7,554,188 B2 | 6/2009 | Hauenstein |
| 7,573,107 B2 | 8/2009 | Guerra et al. |
| 7,579,680 B2 | 8/2009 | Chong et al. |
| 7,592,688 B2 | 9/2009 | Standing |
| 7,615,854 B2 | 11/2009 | Montgomery |
| 7,618,896 B2 | 11/2009 | Joshi et al. |
| 7,619,302 B2 | 11/2009 | Hauenstein |
| 7,671,455 B2 | 3/2010 | Pavier |
| 7,678,609 B2 | 3/2010 | Pavier |
| 7,723,830 B2 | 5/2010 | Hauenstein |
| 7,728,420 B2 | 6/2010 | Cheah et al. |
| 7,745,930 B2 | 6/2010 | Connah et al. |
| RE41,559 E | 8/2010 | Cardwell |
| 7,772,681 B2 | 8/2010 | Joshi et al. |
| 7,777,315 B2 * | 8/2010 | Noquil ................ H01L 23/4334 257/666 |
| 7,804,131 B2 | 9/2010 | Cheah et al. |
| 7,821,133 B2 | 10/2010 | Schofield et al. |
| 7,867,823 B2 | 1/2011 | Hu et al. |
| 7,898,067 B2 | 3/2011 | Jereza |
| 7,898,093 B1 | 3/2011 | Darveaux et al. |
| 7,902,809 B2 | 3/2011 | Briere et al. |
| 7,915,721 B2 | 3/2011 | Liu et al. |
| 7,923,300 B2 | 4/2011 | Bell et al. |
| 7,948,069 B2 | 5/2011 | Zhuang |
| 7,968,984 B2 | 6/2011 | Standing et al. |
| 7,994,615 B2 | 8/2011 | Cho |
| 7,999,365 B2 | 8/2011 | Hu et al. |
| 8,026,580 B2 | 9/2011 | Pavier |
| 8,061,023 B2 | 11/2011 | Standing |
| 8,089,147 B2 | 1/2012 | Pavier et al. |
| 8,093,695 B2 | 1/2012 | Cho |
| 8,097,938 B2 | 1/2012 | Standing et al. |
| 8,102,668 B2 | 1/2012 | Hauenstein et al. |
| 8,143,729 B2 | 3/2012 | Pavier et al. |
| 8,148,815 B2 | 4/2012 | Girdhar et al. |
| 8,163,601 B2 | 4/2012 | Gong et al. |
| 8,193,612 B2 | 6/2012 | Beach et al. |
| 8,198,712 B2 | 6/2012 | Zhuang et al. |
| 8,222,718 B2 | 7/2012 | Jereza et al. |
| 8,232,635 B2 | 7/2012 | Zhuang |
| 8,236,613 B2 | 8/2012 | Gong |
| 8,253,224 B2 | 8/2012 | Hu et al. |
| 8,294,208 B2 | 10/2012 | Burke |
| 8,319,321 B2 | 11/2012 | Cho |
| 8,344,464 B2 | 1/2013 | Cho |
| 8,344,499 B2 | 1/2013 | Gong et al. |
| 8,354,733 B2 | 1/2013 | Chang |
| 8,390,131 B2 | 3/2013 | Fuchs et al. |
| 8,395,253 B2 | 3/2013 | Zhuang |
| 8,426,952 B2 | 4/2013 | Cho et al. |
| 8,445,999 B2 | 5/2013 | Cho |
| 8,466,546 B2 | 6/2013 | Farlow et al. |
| 8,497,573 B2 | 7/2013 | Cho et al. |
| 8,497,574 B2 | 7/2013 | Cho et al. |
| 8,525,334 B2 | 9/2013 | Cardwell |
| 8,531,016 B2 | 9/2013 | Cho |
| 8,552,543 B2 | 10/2013 | Pavier |
| 8,564,124 B2 | 10/2013 | Briere et al. |
| 8,569,883 B2 | 10/2013 | Hauenstein |
| 8,575,736 B2 | 11/2013 | Cho |
| 8,575,737 B2 | 11/2013 | Cho |
| 8,581,343 B1 | 11/2013 | Desbiens et al. |
| 8,587,101 B2 | 11/2013 | Fernando et al. |
| 8,604,611 B2 | 12/2013 | Hauenstein |
| 8,614,503 B2 | 12/2013 | Cho |
| 8,629,566 B2 | 1/2014 | Shivkumar et al. |
| 8,648,449 B2 | 2/2014 | Polhemus et al. |
| 8,664,754 B2 | 3/2014 | Cho et al. |
| 8,680,627 B2 | 3/2014 | Cho et al. |
| 8,680,661 B2 | 3/2014 | Cho |
| 8,680,666 B2 | 3/2014 | Hauenstein |
| 8,686,554 B2 | 4/2014 | Standing |
| 8,692,360 B1 | 4/2014 | Desbiens et al. |
| 2002/0179994 A1 | 12/2002 | Chen et al. |
| 2006/0175700 A1 | 8/2006 | Kagii et al. |
| 2007/0001278 A1 | 1/2007 | Jeon et al. |
| 2007/0040260 A1 | 2/2007 | Otremba |
| 2007/0249092 A1 | 10/2007 | Joshi et al. |
| 2007/0267726 A1 | 11/2007 | Noquil |
| 2008/0023807 A1 | 1/2008 | Noquil et al. |
| 2008/0230879 A1 | 9/2008 | Sharma et al. |
| 2009/0057869 A1 | 3/2009 | Hebert et al. |
| 2009/0190320 A1 | 7/2009 | Shimizu et al. |
| 2009/0218676 A1 | 9/2009 | Muto et al. |
| 2010/0117225 A1 | 5/2010 | Shiraishi et al. |
| 2010/0155915 A1 | 6/2010 | Bell et al. |
| 2011/0074007 A1 | 3/2011 | Lopez et al. |
| 2011/0140249 A1 | 6/2011 | Lee et al. |
| 2011/0156229 A1 | 6/2011 | Shinohara |
| 2011/0227207 A1 | 9/2011 | Yilmaz et al. |
| 2012/0098117 A1 | 4/2012 | Sato et al. |
| 2012/0104580 A1 * | 5/2012 | Feng .................... H01L 21/561 257/673 |
| 2012/0273873 A1 | 11/2012 | Grey |
| 2013/0009300 A1 | 1/2013 | Yato et al. |
| 2013/0134524 A1 | 5/2013 | Cho |
| 2013/0313696 A1 | 11/2013 | Hsieh et al. |
| 2014/0264806 A1 * | 9/2014 | Arbuthnot ............... H01L 24/67 257/676 |

OTHER PUBLICATIONS

"GaAs Integrated Circuit µPG2404T6Q", Data Sheet, NEC Electronics Corporation, Oct. 2008, 11 pages.

(56) References Cited

OTHER PUBLICATIONS

"Q&A ThinPAK 8×8—New leadless SMD package for CoolMOS", Infineon Technologies AG, May 2010, 29 pages.
Peinhopf, Wolfgang, "Cooling of ThinPAK 8×8", Infineon Technologies AG, Application Note AN 2012-04, V1.0, Apr. 2012, 10 pages.
Kilger, Thomas, "Recommendations for Board Assembly of Infineon CanPAK (TM)", Infineon Technologies AG, Feb. 28, 2011, 38 pages.
"Leverage Your Performance With CanPAK", Infineon Technologies AG, Product Brief, Aug. 2013, 2 pages.
Sawle, Andrew et al., "DirectFET—A Proprietary New Source Mounted Power Package for Board Mounted Power", International Rectifier, Dec. 31, 2010, 5 pages.
"DirectFET Technology Board Mounting Application Note", International Rectifier, Application Note AN-1035, Version 25, Dec. 2012, 40 pages.
Islam, Nokibul et al."Molded Flip Chip-FCmBGA", IMAPS International Conference and Exhibition on Device Packaging, Mar. 17-20, 2008, 5 pages.
International Search Report and Written Opinion from corresponding application PCT/US2014/068741, mailed Mar. 30, 2015, 11 pages.
"GaAs Integrated Circuit μPG2404T6Q" Data Sheet, Renesas NEC, Oct. 2008, 9 pages.
"CoolMOS (TM) in ThinPak 8×8—The new leadless SMD package for CoolMOS (TM)", Infineon Product Brief, 2009, 2 pages.
"DirectFET Technology Board Mounting Application Note" International Rectifier, Application Note AN-1035, Version 25, Dec. 2012, 40 pages.
"Q&A ThinPAK 8×8—New leadless SMD package for CoolMOS" Infineon, May 2010, 29 pages.
Kilger, Thomas, "Recommendations for Board Assembly of Infineon CanPAK (TM)" Infineon Technologies AG, Feb. 28, 2011, 38 pages.
Peinhopf, Wolfgang, "Cooling of ThinPAK 8×8", Infineon, Application Note AN 2012-04, V1.0, Apr. 2012, 10 pp.

* cited by examiner

```
┌─────────────────────────────────────────┐
│ A leadframe portion including a first   │
│ segment and a second segment including  │
│ a pillar is formed 1900                 │
└─────────────────────────────────────────┘
                    │
                    ▼
┌─────────────────────────────────────────┐
│ The pillar of the second segement of    │
│ the leadframe portion is modified 1910  │
└─────────────────────────────────────────┘
                    │
                    ▼
┌─────────────────────────────────────────┐
│ A semiconductor die is coupled to the   │
│ pillar using a conductive contact 1920  │
└─────────────────────────────────────────┘
```

FIG. 19

```
┌─────────────────────────────────────────┐
│ A leadframe portion including a first   │
│ segment and a second segment including  │
│ a pillar is formed 2000                 │
└─────────────────────────────────────────┘
                    │
                    ▼
┌─────────────────────────────────────────┐
│ A portion of the leadframe portion is   │
│ bent 2010                               │
└─────────────────────────────────────────┘
                    │
                    ▼
┌─────────────────────────────────────────┐
│ A semiconductor die is coupled to the   │
│ pillar using a conductive contact 2020  │
└─────────────────────────────────────────┘
```

FIG. 20

PACKAGED SEMICONDUCTOR DEVICES AND METHODS OF MANUFACTURING

RELATED APPLICATION

This application claims priority to and the benefit of U.S. Provisional Application No. 61/913,267, entitled, "Packaged Semiconductor Devices and Methods of Manufacturing," filed Dec. 7, 2013, which is incorporated herein by reference in its entirety.

TECHNICAL FIELD

This description relates to packaged semiconductor devices. In particular, the description relates to packaged semiconductor apparatuses and methods for manufacturing such apparatuses.

BACKGROUND

A number of different types of semiconductor packages have been designed over the years for a variety of purposes and electronic systems. These semiconductor packages can have many different advantages include heat sinking advantages. However, many of the semiconductor packages lack the ability to be connected in a variety of systems, orientations, may be relatively large, difficult to assemble, and/or expensive to produce. In addition, many of the semiconductor packages may be relatively difficult to integrate with other semiconductor packages or devices in a system. Thus, a need exists for systems, methods, and apparatus to address the shortfalls of present technology and to provide other new and innovative semiconductor packaging features.

SUMMARY

In one general aspect, a package can include a semiconductor die having a first terminal on a first side of the semiconductor die and a second terminal on a second side of the semiconductor die, a leadframe portion electrically coupled to the second terminal of the semiconductor die, and a molding compound. The first terminal on the first side of the semiconductor die, a first surface of the leadframe portion, and a first surface of the molding compound can define at least a portion of a first surface of the package. A second surface of the molding compound and a second surface of the leadframe portion can define at least a portion of a second surface of the package parallel to the first surface of the package, and the second surface can be on an opposite side of the package from the first surface of the package.

In another general aspect, an apparatus can include a package having a first surface, a second surface parallel to the first surface, the second surface being on a side of the package opposite the first surface, and a third surface orthogonal to the first surface and orthogonal to the second surface. The apparatus can also include a semiconductor die having a first terminal with a surface included in the first surface and having a second terminal disposed in an interior portion of the package. The apparatus can further include a leadframe portion electrically coupled to the second terminal of the semiconductor die, the leadframe portion having a first surface included in a portion of the first surface of the package, a second surface included in a portion of the second surface of the package, and a third surface included in a portion of the third surface of the package.

In another general aspect, an apparatus can include a package having a surface on a first side and a second surface parallel to the first surface, the second surface being on a side of the package opposite the first surface. The apparatus can also include a first plurality of contact surfaces disposed within the first surface of the package and a second plurality of contact surfaces disposed within the second surface of the package. The apparatus can further include a semiconductor die. The semiconductor die can include a first terminal electrically coupled to a first contact surface from the first plurality of contact surfaces and electrically coupled to a first contact surface from the second plurality of contact surfaces. The semiconductor die can also include a second terminal electrically coupled to a second contact surface from the first plurality of contact surfaces and electrically coupled to a second contact surface from the second plurality of contact surfaces.

BRIEF DESCRIPTION OF THE DRAWINGS

FIG. 19 is a flowchart that illustrates a method for producing a leadframe portion of a device, according to an implementation.

FIG. 20 is a flowchart that illustrates another method for producing a leadframe portion of a device, according to an implementation.

DETAILED DESCRIPTION

This document describes various implementations of packaged semiconductor devices (devices) and methods of producing such devices. The devices described herein may have a number of advantages over known (or conventional) devices. For example, the devices described herein may have smaller form factors than known (or conventional) devices, while providing improved flexibility when implementing those devices in an electrical system. For instance, such improved flexibility can be achieved by the device implementations disclosed herein, as those devices can include electrical contact surfaces for one or more terminals of a given device on multiple surfaces of the device, allowing multiple alternatives for connecting the device in a electrical system (e.g., on a printed circuit board).

The devices described herein may also allow for a reduced number of leadframe terminals or portions over known (or conventional) devices. For example, a three terminal discrete (semiconductor) device may be packaged, using the approaches described herein, in a semiconductor device package having two leadframe terminals (with contact surfaces on multiple surfaces of the packaged device), where the third terminal of the discrete device may be electrically contacted using a surface of the semiconductor device that is exposed in the packaged device. The devices described herein also allow for implanting bridged devices (multiple devices with separate leadframes implemented in a single packaged device), as well as packaged devices including multiple die implemented on a single leadframe. Furthermore, processing methods described herein may provide cost advantages over known (or conventional) approaches, as the disclosed methods my have relatively fewer processing operations than known (or conventional) approaches, thus reducing overall manufacturing cost as compared with known (or conventional) approaches.

Figure 1A:
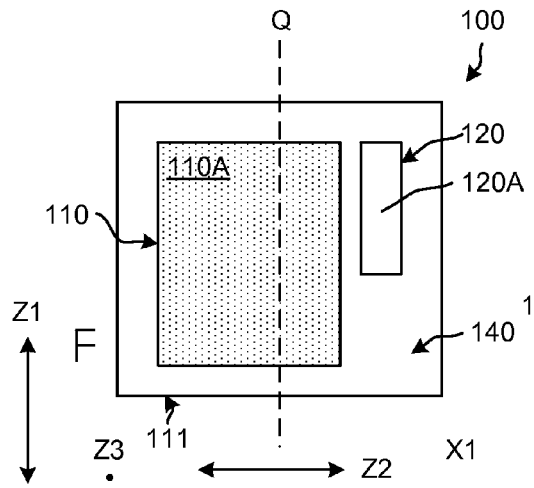
FIGS. 1A through 1E are schematic block diagrams illustrating a packaged semiconductor device, according to an implementation.

FIGS. 1A through 1E are schematic block diagrams illustrating a packaged semiconductor device 100 (also can be referred to as device 100), according to an implementation. As shown in FIG. 1A, a side X1 (also can be referred to as an X1 side) of the device 100 has an exposed surface 110A (e.g., a first exposed surface) of a first leadframe portion 110 and an exposed surface 120A (e.g., a second exposed surface) of a second leadframe portion 120. The leadframe portion 110 and leadframe portion 120 can collectively define a leadframe (e.g., a single leadframe). The exposed surfaces 110A and 120A of the leadframe portions 110 and 120 (and other exposed leadframe surfaces described herein) may also be referred to as exposed areas, exposed portions, exposed leadframe portions, contacts, leads or terminals, among other terms. Also, with respect to the embodiments described herein, a leadframe portion, such as the first leadframe portion 110 and the second leadframe portion 120, may also be referred to as a portion of a leadframe, a leadframe section, a section of a leadframe, a part of a leadframe, a leadframe, and so forth. Depending on the particular implementation, the leadframe portions of the device 100 may be formed (e.g., using the approaches described herein) from copper, alloys of copper, or any number of other materials that are suitable for forming leadframes for packaged semiconductor devices.

In an example embodiment, the exposed surface 110A may (via the first leadframe portion 110) be electrically connected (e.g., shorted, coupled) to a first terminal of a discrete semiconductor device that is included in the device 100. Similarly, the exposed surface 120A may (via the second leadframe portion 120) be electrically connected (e.g., shorted, coupled) to a second terminal of the discrete semiconductor device that is included in the device 100.

As also shown in FIG. 1A, the device 100 includes a molding compound 140 that may be used to, at least partially, encase (e.g., cover) (or can encapsulate in some implementations) the first leadframe portion 110, the second leadframe portion 120 and the semiconductor device. The molding compound 140 may be a liquid molding compound that that is injected or flowed into a tool holding the first leadframe portion 110, the second leadframe portion 120 and the semiconductor device and then heat cured to harden the molding compound. In other implementations, the molding compound 140 may be a thermoset plastic molding compound. In still other implementations, other molding compounds may be used. In some implementations, the molding compound 140 can be referred to as a molding without the term compound. In some implementations, the molding compound can include a variety of materials such as a plastic, a resin, an epoxy, a phenolic hardener, a silica material, and/or so forth.

Figure 1B:
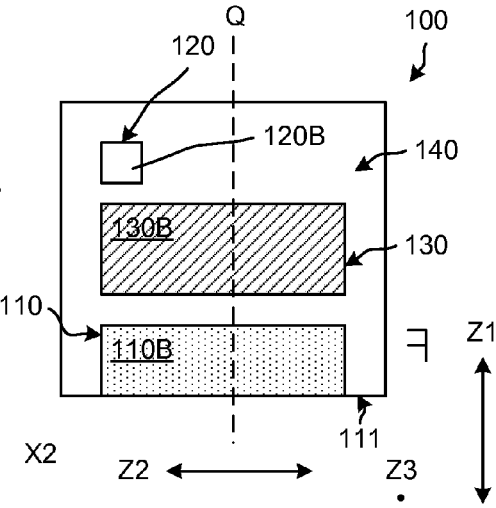

FIG. 1B, is a block diagram that schematically illustrates an inverted (backside or side X2 (also can be referred to as an X2 side)) view of the device 100 of FIG. 1A. In FIGS. 1A and 1B, the reference character F shows the spatial relationship (or spatial orientation) between the views illustrated in FIGS. 1A and 1B (i.e., that the view of the device 100 shown in FIG. 1B is rotated (e.g., horizontally rotated) 180 degrees about axis Q from the view of the device 100 shown in FIG. 1A). As illustrated in FIG. 1B, the device 100 includes a second exposed surface 110B of the first leadframe portion 110 and a second exposed surface 120B of the second leadframe portion 120. As shown in FIG. 1B, the device 100 also includes a semiconductor die 130 (with an exposed surface 130B of the semiconductor die 130 on the side X2 of the device 100) that can have a discrete semiconductor device implemented therein.

In the device 100, the exposed surface 110A and the exposed surface 110B (shown in FIGS. 1A and 1B) may be surfaces of the first leadframe portion 110 that are exposed through (not encapsulated in) the molding compound 140. As illustrated in FIG. 1B, the first leadframe portion 110 extends to the edge (or terminal side surface) of the device 100. In such an approach, the exposed surface 110B of the first leadframe portion 110 may also extend along, at least a part of, a bottom edge 111 of the device 100. In other words, in the device 100, the exposed surface 110B of the first leadframe portion 110 may define an electrical contact (terminal, lead or so forth) on both the surface (the X2 side) of the device 100 shown in FIG. 1B and along, at least part of, the bottom edge 111 of the device 100, as illustrated in FIGS. 1A and 1B.

Figure 1C:
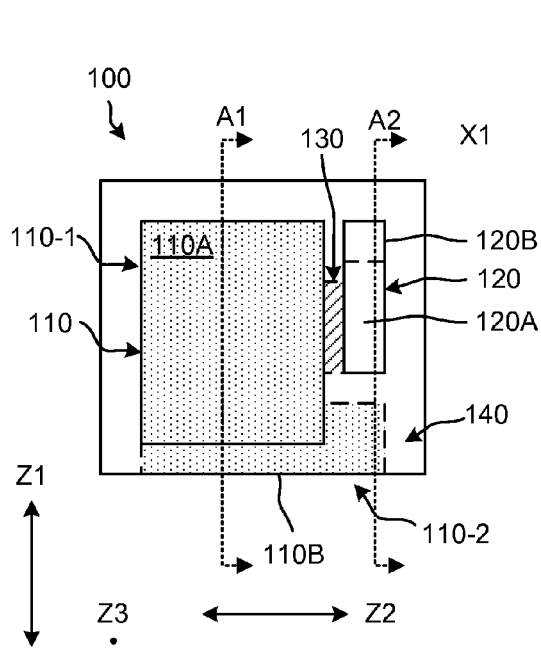
Figure 1D:
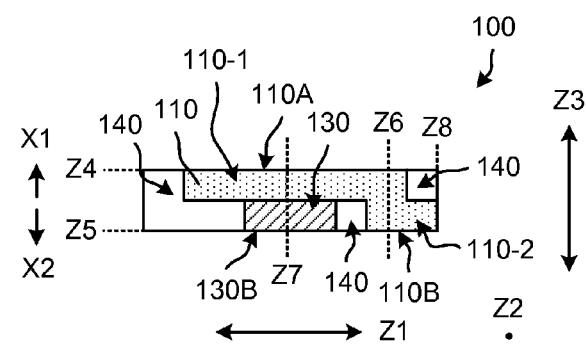
Figure 1E:
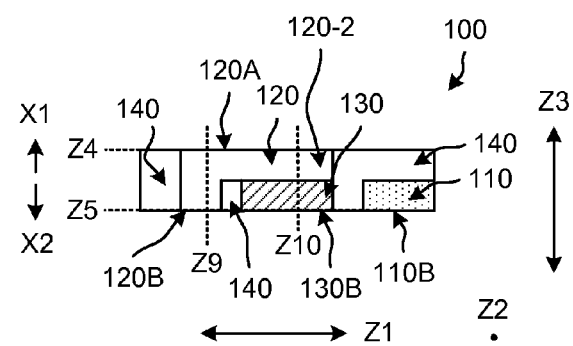

In this implementation, the exposed surface 110A, the exposed surface 120A, and a surface (e.g., a top surface) of the molding compound 140 are aligned within (e.g., aligned along, define) a plane Z4 (shown in FIGS. 1D and 1E). The plane Z4 is aligned along directions Z1 and Z2 (which can be referred to as horizontal directions or as lateral directions). Direction Z1 is substantially orthogonal to the direction Z2.

Similarly, in this implementation, the exposed surface 110B, the exposed surface 120B, the exposed surface 130B of the semiconductor die 130, and a surface (e.g., a bottom surface) of the molding compound 140 are aligned within (e.g., aligned along, define) a plane Z5 (shown in FIGS. 1D and 1E). The plane Z5 is aligned along directions Z1 and Z2.

As shown in FIGS. 1A through 1E, a portion of the device 100, or a direction toward which the exposed surface 130B of the semiconductor die 130 is facing (substantially along the direction Z3) can be referred to as a top portion or an upward direction. In some implementations, a portion of the device 100, or a direction into the exposed surface 130B of the semiconductor die 130 (substantially along the direction Z3) can be referred to as a bottom portion or a downward direction.

Direction Z3 is aligned orthogonal to (or normal to) the planes Z4 and Z5 and is orthogonal to directions Z1 and Z2. In the implementations described herein, the vertical direction is normal to a plane along which the semiconductor die 130 is aligned (e.g., the plane Z5). The directions Z1, Z2, and Z3, planes Z4 and Z5, and sides X1 and X2 are used throughout the various views of the implementations described throughout the figures for simplicity.

As mentioned above, the semiconductor die 130 can include a variety of semiconductor devices. For instance, the semiconductor die 130 may have a high-voltage (HV) or low-voltage (LV) transistor implemented therein, such as a field-effect transistor (referred to hereafter as a "FET") (e.g., a vertical FET, a lateral FET) or a bipolar-junction transistor (referred to hereafter as a "BJT") (e.g., a vertical BJT, a lateral BJT). In some implementations where the semiconductor die 130 includes a vertical FET or a vertical BJT, the exposed surface 130B of the semiconductor die 130 shown in FIG. 1B may define a terminal of the discrete semiconductor device.

For instance, in implementations where the semiconductor die 130 includes a discrete FET (HV or LV), the exposed surface 130B of the semiconductor die shown in FIG. 1B may define a drain contact of the FET (through a substrate of the semiconductor die 130). Likewise, in implementations where the semiconductor die 130 includes a BJT (HV or LV), the exposed surface 130B of the semiconductor die 130 shown in FIG. 1B may define a collector contact of the BJT (through a substrate of the semiconductor die 130). In certain embodiments, the exposed surface 130B of the semiconductor die 130 may be electrically coupled with a printed circuit board or other type of external device (e.g., another packaged device) in order to connect the terminal of the semiconductor device defined by the exposed surface 130B with other elements of an electrical device, such as circuit elements of a cellular phone, as one example.

In implementations where the semiconductor die 130 includes a FET (many of the elements of the FET are not shown), the first leadframe portion 110 (including the exposed surfaces 110A and/or 110B) may define (be coupled with) a source terminal of the FET. For instance, the first leadframe portion 110 may be electrically coupled with a source of the FET (implemented in the semiconductor die 130) using conductive contact (or multiple conductive contacts) between the first leadframe portion 110 and a bond pad (or bond pads) on the semiconductor die 130, where the bond pad(s) are electrically coupled (e.g., shorted to) source diffusion of the FET. Such conductive contacts may be implemented using a number of materials, such as solder, a conductive epoxy, a metal, and/or other material.

Further in such implementations, the second leadframe portion 120 (including the exposed surfaces 120A and/or 120B) may define (be coupled with) a gate terminal (electrode) of the FET (implemented in the semiconductor die 130). The second leadframe portion 120 may be electrically coupled with a gate terminal of the FET using a conductive contact (or multiple conductive contacts), such as described herein, between the second leadframe portion 120 and a bond pad (or bond pads) on the semiconductor die 130, where the bond pad(s) are electrically coupled to (e.g., shorted to) a gate electrode (e.g., a polysilicon gate) of the FET. The source of the FET may be electrically connected with other circuit elements external to the device 100 via the exposed surfaces 110A and/or 110B. Similarly, the gate of the FET may be electrically connected with other circuit elements external to the device 100 via the exposed surfaces 120A and/or 120B.

In implementations where the semiconductor die 130 includes a BJT (many of the elements of the BJT are not shown), the first leadframe portion 110 (including the exposed portions 110A and 110B) may define (be coupled with) an emitter of the BJT (implemented in the semiconductor die 130). For instance, the first leadframe portion 110 may be electrically coupled with the emitter of the BJT using a conductive contact (or multiple conductive contacts) between the first leadframe portion 110 and a bond pad (or bond pads) on the semiconductor die 130, where the bond pad(s) are electrically coupled (e.g., shorted to) emitter terminal of the BJT. Further in such implementations, the second leadframe portion 120 (including exposed portions 120A and 120B) may define (be coupled with) a base terminal (electrode) of the BJT (implemented in the semiconductor die 130). The second leadframe portion 120 may be electrically coupled with the base terminal of the BJT using a conductive contact (or multiple conductive contacts) between the second leadframe portion 120 and a bond pad (or bond pads) on the semiconductor die 130, where the bond pad(s) are electrically coupled (e.g., shorted to) base terminal of the BJT. In such an approach, the emitter of the BJT may be electrically connected with other circuit elements external to the device 100 via the exposed surfaces 110A and/or 110B. Similarly, the base of the BJT may be electrically connected with other circuit elements external to the device 100 via the exposed surfaces 120A and/or 120B.

In other implementations, other discrete semiconductor devices may be implemented in the semiconductor die 130. For example, the semiconductor die 130 may have an insulated gate bipolar transistor (IGBT) implemented therein. In such an approach, the exposed surface of the semiconductor die 130 shown in FIG. 1B may define a collector terminal of the IGBT. The exposed surface 110A and 110B (and the first leadframe portion 110) may define an emitter terminal of the IGBT. Also, the exposed surfaces 120A and 120B (and the second leadframe portion 120) may define a gate terminal of the IGBT. In still other embodiments, the device 100 may be used implement other discrete semiconductor devices, such as a superjunction FET, a SiC BJT, or other transistor, among other types of devices, such as those described herein.

In some implementations, the semiconductor die 130 can be, or can include, a circuit such as a filter circuit, a controller circuit, a driver circuit, a communication circuit (e.g., a receiver and/or transmitter), and/or so forth. In some implementations, the semiconductor die 130 can be, or can include special purpose logic circuitry, combinational logic, a field programmable gate array (FPGA), an application-specific integrated circuit (ASIC). In some implementations, the device 100 can be used for many different types of systems such as power management systems, radio frequency (RF) systems, controller systems, computing systems, digital and/or analog systems, etc.

FIG. 1C is an alternate view of the side X1 of the device 100 (in a same orientation as in FIG. 1A) showing the exposed surface 110B of the first leadframe portion 110, the exposed surface 120B of the second leadframe portion 120 and the semiconductor die 130 using dashed lines and like shadings for like elements of in FIGS. 1A and 1B. Accordingly, FIG. 1C shows the relative arrangement of the first leadframe portion 110, the second leadframe portion 120 and the semiconductor die 130 as partially covered in the molding compound 140 in the device 100. In certain embodiments, the first leadframe portion 110 can be a first single, (physically and electrically) contiguous leadframe portion, such as illustrated in FIG. 1D. Likewise, the second leadframe portion 120 can be a second single, (physically and electrically) contiguous leadframe portion, such as illustrated in FIG. 1E. The first leadframe portion 110 and the second leadframe portion 120 can be formed using a number of techniques, which are described below in more detail.

In some implementations, one or more of the leadframe portions, 110, 120 can be referred to as having one or more segments (or portions or sub-portions). For example, the leadframe portion 110 has a first segment 110-1 associated with the exposed surface 110A and the leadframe portion 110 has a second segment 110-2 associated with the exposed surface 110B. The first segment 110-1 has at least a portion disposed directly above (along direction Z3) and directly coupled to a portion of the second segment 110-2. In other words, the first segment 110-1 of the leadframe portion 110 is stacked on the second segment 110-2 of the leadframe portion 110. This concept is illustrated and described in more detail in connection with FIG. 1D.

FIG. 1D is a cross-sectional view of the device 100 along the section line A1 in FIG. 1C. As illustrated in the cross-sectional view of FIG. 1D, the first leadframe portion 110 is a contiguous leadframe section with the exposed surface 110A being disposed along the X1 side (e.g., top side) of the device 100 and the exposed surface 110B being disposed along the X2 side (e.g., bottom surface) of the device 100 and a portion of an edge of the device 100 (along a plane Z8, as is discussed further below). As also shown in FIG. 1D, the semiconductor die 130 is coupled with the first leadframe portion 110, while the exposed surface 130B of the semiconductor die 130 is disposed along the bottom surface of the device 100. As previously discussed, and as can be seen in FIG. 1D, the first leadframe portion 110 and the semiconductor die 130 are, at least partially, covered by the molding compound 140, where the exposed surfaces 110A, 110 B, and 130B are substantially coplanar with corresponding sides of the device 100.

As shown in FIG. 1D, at least the first segment 110-1 and the second segment 110-2 define the leadframe portion 110. Specifically, the leadframe portion 110 has a z-shape or a bent shape. As illustrated in FIG. 1D, a cross-section of the first segment 110-1 is aligned along a first longitudinal axis parallel to direction Z1, and a cross-section of the second segment 110-2 is aligned along a second longitudinal axis also parallel to direction Z1. Also, the exposed surface 110A of the first segment 110-1 is aligned along the plane Z4, and the exposed surface 110B of the second segment 110-2 is aligned along the plane Z5. The first segment 110-1 of the leadframe portion 110 and the second segment 110-2 of the leadframe portion 110 are coupled together such that a vertical line Z6 (aligned along direction Z3) through the device 100 intersects the exposed surface 110A of the first segment 110-1 and the exposed surface 110B of the second segment 110-2. Similarly, the semiconductor die 130 and the first segment 110-1 of the leadframe portion 110 are coupled together such that a vertical line Z7 (aligned along direction Z3) thorough the device intersects the exposed surface 110A of the first segment 110-1 and the exposed surface 130B of the semiconductor die 130.

As illustrated in FIG. 1D, a side surface of the device 100 is aligned along plane Z8. A side surface of the leadframe portion 110 (e.g., an exposed side surface of the second segment 110-2 of the leadframe portion 110) and a side surface of the molding compound 140 are aligned along (or define) the plane Z8 (shown on the right side of FIG. 1D). In some implementations, one or more side surfaces of the device 100 can be encapsulated within the molding compound 140 so that a side surface of, for example, the leadframe portion 110 is not exposed. Such a configuration is illustrated on the left side of the device 100 in FIG. 1D. In some implementations, the left side of the device 100 can be configured so that a side surface of the leadframe portion 110 on the left side of the device 100 is also exposed.

As illustrated in FIG. 1D, a terminal (e.g., a source terminal, a drain terminal, a gate terminal) of the semiconductor die 130 may be exposed (e.g., electrically exposed) to the side X1 of the device 100 and to the side X2 of the device 100 via the first leadframe portion 110. Specifically, the semiconductor die 130 is electrically coupled to the exposed surface 110A of the leadframe portion 110 via the first segment 110-1 of the leadframe portion 110. Also, the semiconductor die 130 is electrically coupled to the exposed surface 110B of the leadframe portion 110 via the second segment 110-2 of the leadframe portion 110.

FIG. 1E is a cross-sectional view of the device 100 along the section line A2 in FIG. 1C. As illustrated in the cross-sectional view of FIG. 1E, the second leadframe portion 120 is a contiguous leadframe section with the exposed surface 120A being disposed along the side X1 of the device 100 and the exposed surface 120B being disposed along the bottom surface of the device 100. As also shown in FIG. 1E, the semiconductor die 130 is coupled with the second leadframe portion 120, while the exposed surface 130B of the semiconductor die 130 is disposed along the side X2 (e.g., bottom surface) of the device 100. Further, a part of the first leadframe portion 110 is also present in the cross-sectional view of the device 100 shown in FIG. 1E. As previously discussed, and as can be seen in FIG. 1E, the first leadframe portion 110, the second leadframe portion 120 and the semiconductor die 130 are, at least partially, covered by the molding compound 140, where the exposed surfaces 110 B, 120A, 120B and 130B are substantially coplanar with corresponding sides of the device 100.

As shown in FIG. 1E, at least a first segment 120-1 and a second segment 120-2 define the leadframe portion 120. The exposed surface 120A of the first segment 120-1 is aligned along the plane Z4, and the exposed surface 120B of the second segment 120-2 is aligned along the plane Z5. The first segment 120-1 of the leadframe portion 120 and the second segment 120-2 of the leadframe portion 120 are coupled together such that a vertical line Z9 (aligned along direction Z3) through the device 100 intersects the exposed surface 120A of the first segment 120-1 and the exposed surface 120B of the second segment 120-2. Accordingly, the first segment 120-1 of the leadframe portion 120 is stacked on the second segment 120-2 of the leadframe portion 120.

Similarly, the semiconductor die 130 and the first segment 120-1 of the leadframe portion 120 are coupled together such that a vertical line Z10 (aligned along direction Z3) through the device 100 intersects the exposed surface 120A of the first segment 120-1 and the exposed surface 130B of the semiconductor die 130. Although not shown in FIG. 1E, in some implementations, a side surface of the leadframe portion 120 (or a portion thereof) can be exposed rather than encapsulated by molding compound 140.

Although not illustrated in FIGS. 1A through 1E, additional leadframe portions can be included in the device 100. In some implementations, less leadframe portions than shown can be included in the device 100. In some implementations, more than one semiconductor die (similar to semiconductor die 130) can be included in the device 100. Variations, such as those described above, of the device 100 shown in FIGS. 1A through 1E are described below in connection with the remaining figures.

As illustrated in FIG. 1E, a terminal (e.g., a source terminal, a drain terminal, a gate terminal) of the semiconductor die 130 is exposed (e.g., electrically exposed) to the side X1 of the device 100 and to the side X2 of the device 100 via the leadframe portion 120. Specifically, the semiconductor die 130 is electrically coupled to the exposed surface 120A of the leadframe portion 120 via the first segment 120-1 of the leadframe portion 120. Also, the semiconductor die 130 is electrically coupled to the exposed surface 120B of the leadframe portion 120 via the second segment 120-2 of the leadframe portion 120.

As shown and described above, multiple terminals of the semiconductor die 130 can be exposed on multiple sides of the device 100 using multiple leadframe portions. For example, a first terminal of the semiconductor die 130 can be exposed on both side X1 and side X2 of the device 100 via the leadframe portion 110, and a second terminal the semiconductor die 130 can be exposed on both side X1 and side X2 of the device 100 via the leadframe portion 120. Also, a third terminal of the semiconductor die 130 can be directly exposed on at least one side (e.g., side X2) of the device 100. In addition, one or more of the terminals of the semiconductor die 130 can be exposed to one or more side surfaces of the device 100 via one or more of the leadframe portions (e.g., leadframe portion 110, leadframe portion 120).

In some implementations, the semiconductor die 130 of the device 100 (or package) can have a first terminal (e.g., a drain terminal) on the first side (e.g., X2 side) of the semiconductor die 130 and can have a second terminal (e.g., a source terminal, a gate terminal) on a second side (e.g., X1 side) of the semiconductor die 130. The leadframe portion 110 is electrically coupled to the second terminal of the semiconductor die 130. The first terminal on the first side of the semiconductor die 130, a first surface (e.g., surface 110B) of the leadframe portion 110, and a first surface of the molding compound 140 (e.g., a surface on the X2 side) can define at least a portion of a first surface of the device 100 (e.g., a surface on the X2 side). A second surface of the molding compound 140 (e.g., a surface on the X1 side) and a second surface of the leadframe portion 110 (e.g., surface 110A) can define at least a portion of a second surface of the device 100 (e.g., a surface on the X1 side) parallel to the first surface of the device 100, and the second surface can be on an opposite side of the device 100 from the first surface of the device 100. The leadframe portion (e.g., leadframe portion 110) has a first segment aligned along a plane parallel to a plane along which a second segment of the leadframe portion (e.g., leadframe portion 110) is aligned.

If the leadframe portion 110 is a first leadframe portion, the leadframe portion 120 can be a second leadframe portion electrically coupled to a third terminal (e.g., a source terminal, a gate terminal) on the second side (e.g., X1 side) of the semiconductor die 130. The second leadframe can have a first surface (e.g., surface 120B) included in the portion of the first surface of the device 100 and having a second surface (e.g., surface 120A) included in the portion of the second surface of the device 100. The first surface (e.g., surface on side X2) of the device 100 is a planar (e.g., substantially planar) surface, and the second surface (e.g., surface on side X2) of the device 100 is a planar (e.g., substantially planar) surface.

In some implementations, the device 100 can be characterized as having a first surface (e.g., a surface on side X2) and a second surface (e.g., a surface on side X1) parallel to the first surface. The device 100 has a third surface (e.g., surface aligned along direction Z3) orthogonal to the first surface and orthogonal to the second surface. The semiconductor die 130 has a first terminal with a surface included in the first surface and has a second terminal disposed in an interior portion of the device 100 (e.g., disposed vertically. A leadframe portion (e.g., leadframe portion 110) is electrically coupled to the second terminal of the semiconductor die 130, and the leadframe portion has a first surface included in a portion of the first surface of the device 100, a second surface included in a portion of the second surface of the device 100, and a third surface defining included in a portion of the third surface of the device 100. The third surface of the leadframe portion can be associated with a tie bar (or protrusion) of the leadframe portion.

In some implementations, the leadframe portion is a first leadframe portion and the device 100 has a fourth surface orthogonal to the first surface (and the second surface and parallel to the third surface). The device 100 can have a second leadframe portion (e.g., leadframe portion 120) electrically coupled to a third terminal of the semiconductor die, and the second leadframe portion having a first surface included in the portion of the first surface of the device 100, a second surface included in the portion of the second surface of the device 100, and a third surface included in a portion of the fourth surface of the device 100.

In some implementations, the device 100 has a surface on a first side and a second surface parallel to the first surface where the second surface is on a side of the device 100 opposite the first surface. The device 100 can have a first plurality of contact surfaces (e.g., exposed contact surfaces such as 110A or 110B) disposed within the first surface of the device 100 (e.g., a first surface on side X1), and a second plurality of contact surfaces disposed within the second surface of the device 100 (e.g., a first surface on side X1). The semiconductor die 130 can include a first terminal (e.g., a source terminal) electrically coupled to a first contact surface from the first plurality of contact surfaces and electrically coupled to a first contact surface from the second plurality of contact surfaces, and a second terminal (e.g., a gate terminal) electrically coupled to a second contact surface from the first plurality of contact surfaces and electrically coupled to a second contact surface from the second plurality of contact surfaces. The semiconductor die 130 can include a drain terminal exposed through the molding compound 140. The first plurality of contact surfaces define a pattern (e.g., a spatial pattern on the surface of the device 100) different from a pattern defined by the second plurality of contact surfaces.

Figure 2A:
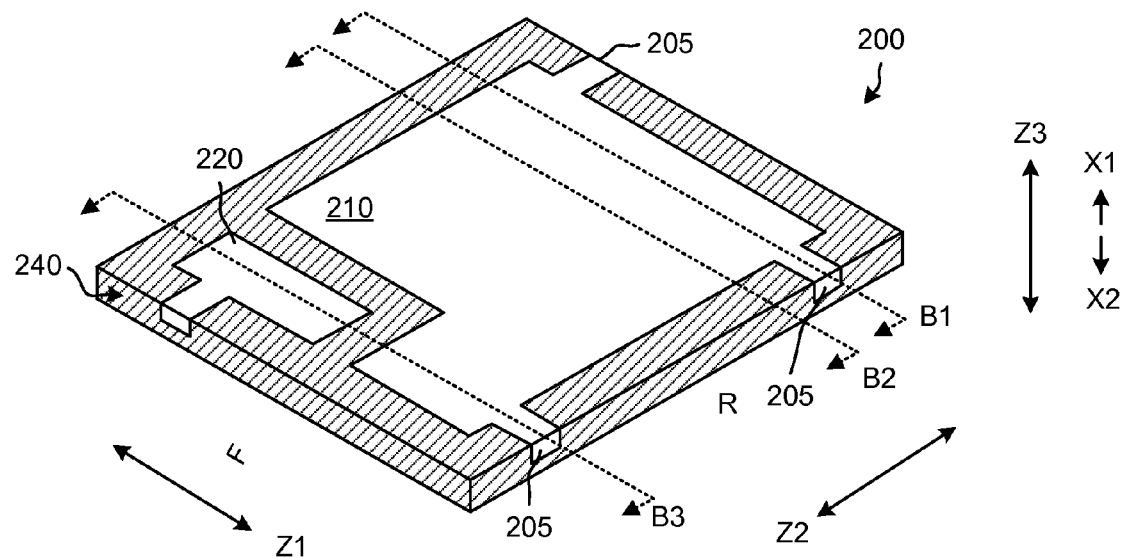
FIGS. 2A through 2I are diagrams illustrating various views of packaged semiconductor devices, according to a number of implementations.
Figure 2B:
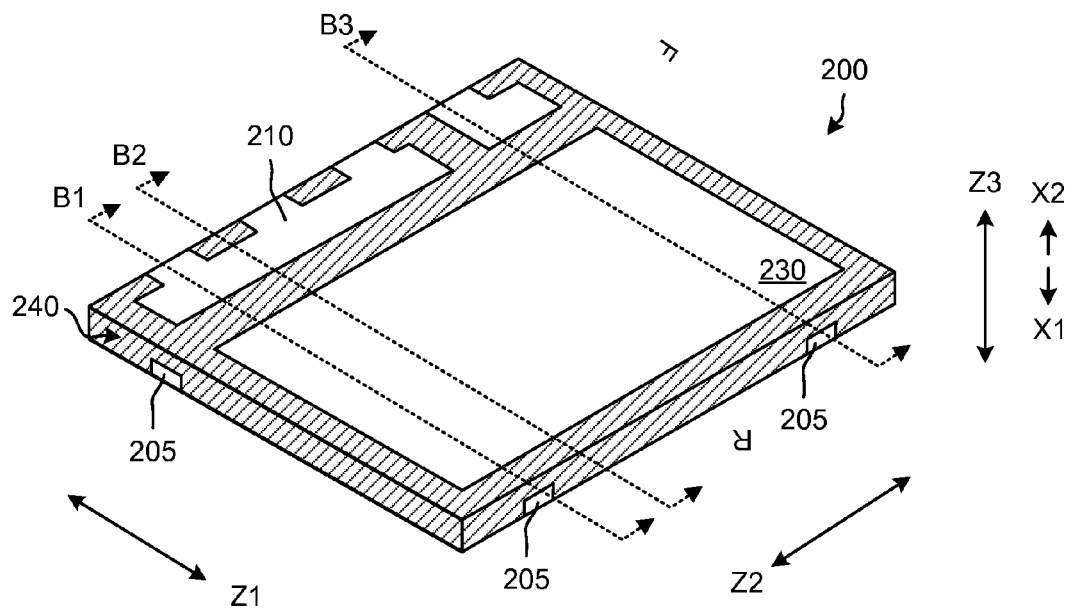
Figure 2C:
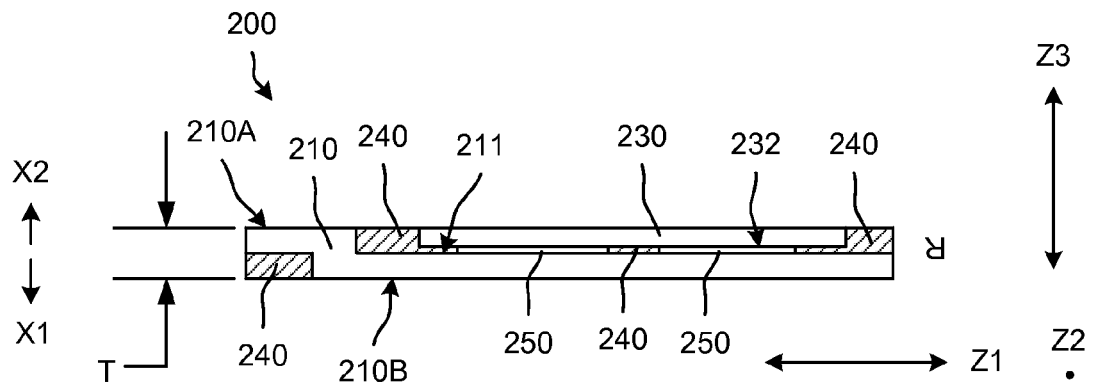
Figure 2D:
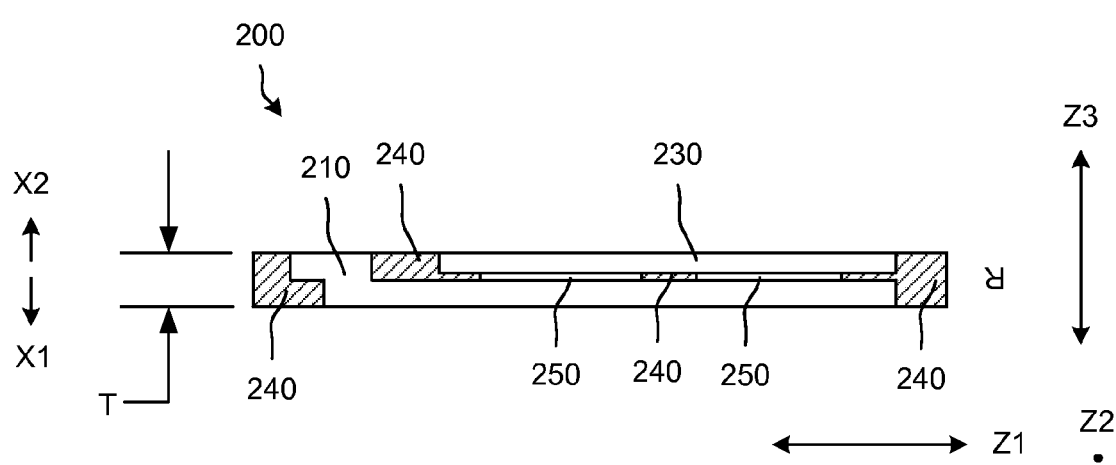
Figure 2E:
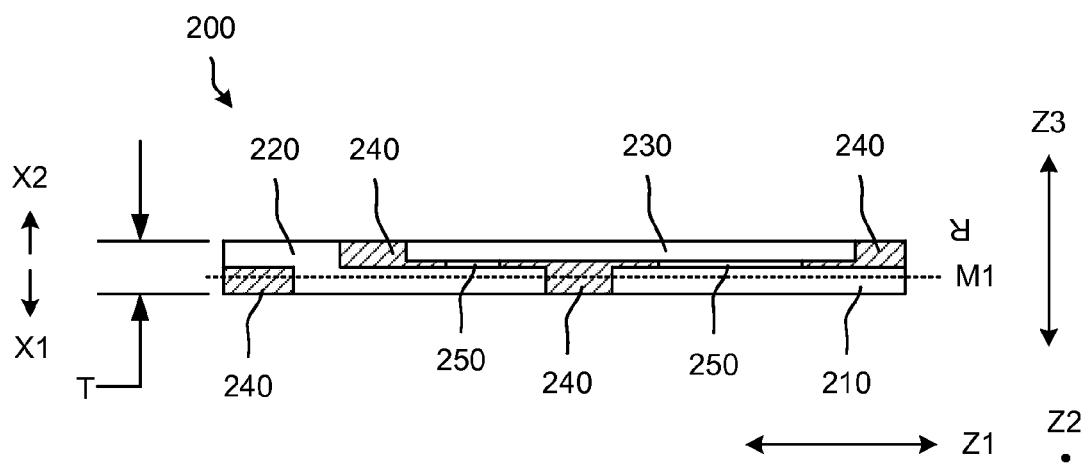
Figure 2F:
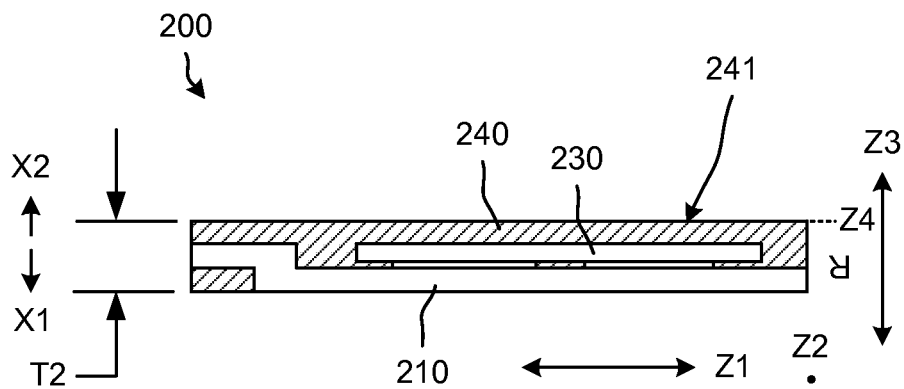
Figure 2G:
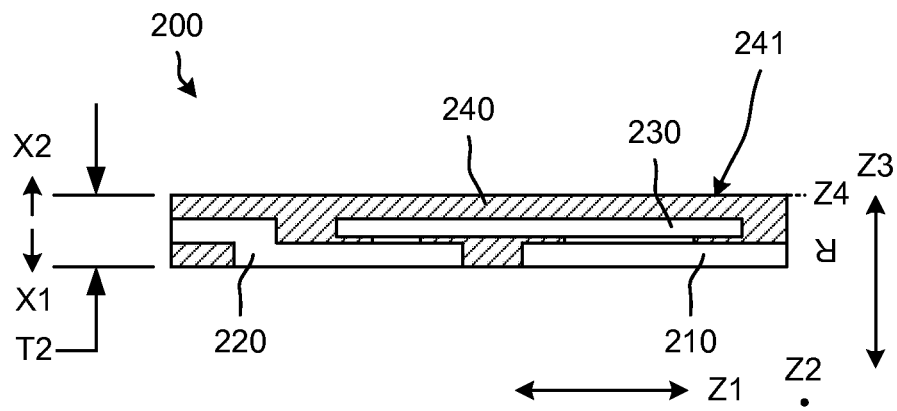
Figure 2H:
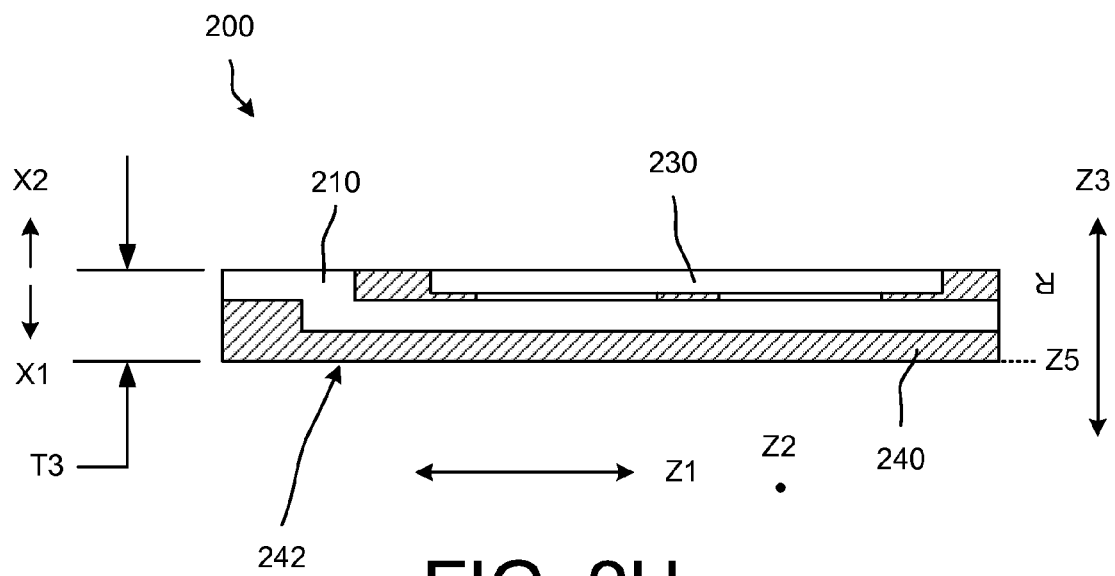
Figure 2I:
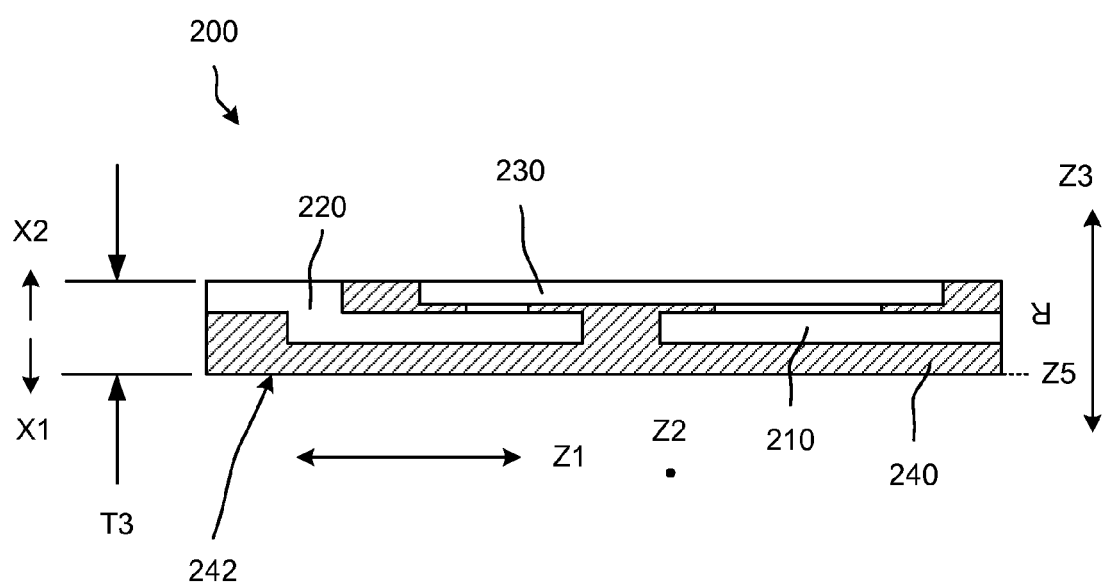

FIGS. 2A through 2I are diagrams illustrating packaged semiconductor devices, according to a number of implementations. The packaged semiconductor devices illustrated in FIGS. 2A through 2I may be used, in certain embodiments, to implement the device 100 shown and described in connection with FIGS. 1A through 1E. FIGS. 2A through 2E illustrate a packaged semiconductor device 200 (also can be referred to as a device 200), FIGS. 2F through 2G illustrate a first variation of the packaged semiconductor device 200 and FIGS. 2H through 2I illustrate a second variation of the packaged semiconductor device 200. As with the device 100, the devices illustrated in FIGS. 2A through 2I may have a discrete semiconductor device implemented therein. For example, the device 200 (and variations thereof) may have (or include) a HV or LV discrete transistor (FET, BJT, IGBT, etc.) implemented therein. In other embodiments, such as those described herein, packaged semiconductor devices in accordance with embodiments described herein may have a number of other types of semiconductor devices implemented therein and/or may have two or more semiconductor devices (e.g., on one or more semiconductor die) implemented therein.

For purposes of illustration, the packaged semiconductor device 200 is described herein as having a FET transistor implemented therein. However, as indicated above, in other embodiments, other types of semiconductor devices may be implemented in the device 200 (and variations thereof). Further, in FIGS. 2A through 2I, elements of the device 200 that correspond with like elements of the device 100 are referenced with corresponding 200 series reference numbers. For example, reference number 240 in FIGS. 2A through 2I is used to refer to a molding compound of the device 200, which corresponds with the reference number 140 of the molding compound of the device 100.

FIG. 2A is a perspective drawing illustrating a side X1 of the device 200. As shown in FIG. 2A, the device 200 includes a first leadframe portion 210, a second leadframe portion 220 and a molding compound 240. In this embodiment, the first leadframe portion 210 may define a source contact of the FET that is implemented therein. Again, in other embodiments, the device 200 may have a different semiconductor device implemented therein, and the device 200 is described as having a FET implemented therein merely for purposes of illustration. Also in this embodiment, the second leadframe portion 220 may define a gate contact for the FET that is implemented therein. As shown in FIG. 2A, the molding compound 240 may, at least partially, cover the first leadframe portion 210 and the second leadframe portion 220, leaving one or more exposed surfaces of the first leadframe portion 210 and the second leadframe portion 220 accessible for establishing electrical contacts with the FET.

FIG. 2B is a perspective drawing of an inverted (backside, second side or a side X2) view of the device 200 of FIG. 2A. In FIGS. 2A and 2B, the reference characters F and R show the orientation relationships between the views illustrated in FIGS. 2A and 2B (i.e., that the view of the device 200 shown in FIG. 2B is rotated 180 degrees (e.g., flipped) from the view of the device 200 shown in FIG. 2A). As illustrated in FIG. 2B, the device 200 includes, on its side X2, an exposed surface of the first leadframe portion 210 and an exposed surface of the second leadframe portion 220. Therefore, a source terminal (via the first leadframe portion 210) and a gate terminal (via the second leadframe portion 220) of the FET implemented in the device 200 are accessible on the side X1 of the device 200 (e.g., shown in FIG. 2A) and on the backside (e.g., the side X2) of the device 200 (e.g., shown in FIG. 2B).

As is also illustrated in FIGS. 2A and 2B, the first leadframe portion 210 and the second leadframe portion 220 may also have exposed surfaces on at least one edge (or side surface (e.g., terminal side surface)) of the device 200 (aligned in a plane along the direction Z3) for electrically connecting, respectively, to the source and the gate of the FET implemented in the device 200. As shown in FIGS. 2A and 2B, these exposed surfaces, for the leadframe portion 210, may be defined by protrusions 205 of the leadframe portion 210. Such protrusions 205 (which are not labeled for the leadframe portion 220), may be defined by tie bars that are used to connect different leadframe portions (of one or more leadframes), so as to maintain their spatial orientation during assembly of associated packaged semiconductor devices.

The protrusions 205 may be exposed along the edges (side surfaces) of the device 200 when the device is molded or may be exposed as a result of a singulation process used to separate individual package semiconductor devices from a grouping of packaged semiconductor devices. Such protrusions (tie bars) and groupings of device, as well as example singulation processes, are further described below with respect to FIGS. 3A through 3E and FIGS. 15A through 16B.

As shown in FIG. 2B, the device 200 also includes a semiconductor die 230 that has an exposed surface that is accessible on the second side (e.g., the side X2) of the device 200 shown in FIG. 2B. In this example, the exposed surface of the semiconductor die 230 may define a drain contact of a FET, which can be implemented in the semiconductor die 230. The exposed surfaces of the first leadframe portion 210, the second leadframe portion 220 and the semiconductor die 230 shown in FIG. 2B may be used to electrically connect the FET implemented in the device 200 with other elements of a circuit, such as on a PCB. For example, the FET implemented in the device 200 may be connected with other circuit elements of an electronic device, such as a cellular phone, using the exposed surfaces of the first leadframe portion 210, the second leadframe portion 220 and the semiconductor die 230.

For example, the side X1 of the device 200 can be coupled to a circuit board (not shown). While the side X1 of the device 200 is coupled to the circuit board, the side X2 can be coupled to another device (not shown) or another circuit board. In other embodiments, the side X1 can be couple to a device other than a circuit board. Accordingly, both sides (i.e., side X1 and side X2) can be coupled to two different elements at the same time or simultaneously. In some implementations, one or more side surfaces (aligned along direction Z3 and orthogonal to planes along which the surface on the X1 side and the surface on the X2 side of the device 100 are aligned) can be coupled to one or more elements.

FIGS. 2C through 2E are cross-sectional views of the device 200 along, respectively, the section lines B1, B2 and B3 shown in FIGS. 2A and 2B. The orientation of the device 200 in FIGS. 2C through 2E, as compared with the orientations of the device 200 in FIGS. 2A and 2B is shown the reference character "R" in each of those drawings. As shown by reference character "R", the device 200 in FIGS. 2C through 2E is shown side X2 (the side illustrated in FIG. 2B) up. Accordingly, with respect to the following discussion of FIGS. 2C through 2E, the side X2 of the device 200 can be referred to as a top side (or top surface) of the device 200 and the side X1 of the device 200 can be referred to as a bottom side (or bottom surface) of the device 200. As indicated in FIGS. 2C through 2E the device 200 may have a thickness T, which, in certain embodiments may be in a range of 100-500 μm.

As illustrated in the cross-sectional view of FIG. 2C (taken along section line B1 of FIGS. 2A and 2B), the first leadframe portion 210 is a contiguous leadframe section with exposed surfaces disposed along, at least portions of, the (e.g., planar) left edge (or left side surface) of the device 200, the (e.g., planar) side X2 (e.g., top side) of the device 200, the (e.g., planar) side X1 (e.g., bottom side) of the device 200 and the (e.g., planar) right edge (or right side surface) of the device 200. As also shown in FIG. 2C, the semiconductor die 230, which may include the FET of the device 200, can be coupled with the first leadframe portion 210 using conductive contacts 250 (e.g. to connect the first leadframe portion 210 with a source of the FET). These conductive contacts 250 may electrically (and physically) couple the first leadframe portion 210 and the semiconductor die 230 (via one or more bond pads on the semiconductor die 230). The conductive contacts 250 may include, for example, solder that is deposited on the first leadframe portion 210 and/or solder (e.g., solder balls) that is/are disposed on the semiconductor die 230 prior to attachment with the first leadframe portion 210. In some implementations, one or more of the conductive contacts can include a conductive epoxy, or another conductive material, such as a metal.

As further shown in FIG. 2C, the semiconductor die 230 has an exposed surface disposed along the side X2 (e.g., top side) of the device 200. In the device 200, as shown in FIG. 2C, the molding compound 240 may, at least partially, cover the first leadframe portion 210 and the semiconductor die 230. Furthermore, the molding compound 240 may also be disposed between the conductive contacts 250 in the device 200. Further, as shown in FIGS. 2A and 2B, the section line B1 extends through a protrusion 205. Accordingly, the leadframe portion 210, as shown in FIG. 2C, extends to a side surface (a right side surface) along the X1 side of the device 200.

As illustrated in at least FIG. 2C, a terminal (on side X1) of the semiconductor die 230 can be electrically exposed to side X1 of the device 200 and to side X2 of the device 200 via the first leadframe portion 210. In other words, the first leadframe portion 210 can function as an electrical contact on each side (i.e., side X1 and side X2) of the device 200. Specifically, a surface 232 of the semiconductor die 230 (the X1 side of the semiconductor die) is electrically coupled to a surface 211 of the first leadframe portion 210 via the conductive contacts 250. Accordingly, the surface 232 of the semiconductor die 230 can be electrically connected to exposed surface 210A of the first leadframe portion 210, and to exposed surface 210B of the first leadframe portion 210.

FIG. 2D illustrates a cross-sectional view of the device 200 (along the section line B2 of FIGS. 2A and 2B), where the device 200 has a same orientation of the device 200 as in FIG. 2C. Additionally, the cross-sectional view of the device 200 in FIG. 2D is similar to the cross-sectional view of the device 200 shown in FIG. 2C, except that the first leadframe portion 210 does not extend to the left edge (or left side surface) of the device 200, or to the right edge (or right side surface) of the device 200, which may also be seen with further reference to FIGS. 2A and 2B. The additional details of the device 200 discussed with respect to FIG. 2C, for purposes of brevity and clarity, are not repeated again here with respect to FIG. 2D.

As illustrated in the cross-sectional view of FIG. 2E (along section line B3 of FIGS. 2A and 2B), the second leadframe portion 220 is a contiguous leadframe section with exposed surfaces disposed along, at least portions of, the left edge (left side surface) of the device 200, the side X2 of the device 200 and the bottom surface of the device 200. Also, a part of the first leadframe portion 210 is also present in the cross-sectional view of the device 200 shown in FIG. 2E, with exposed surfaces disposed along the bottom surface of the device 200 and a right edge of the device 200. As illustrated in FIG. 2E, a source terminal of a FET included on the semiconductor die 230 can be coupled with the first leadframe portion 210 and a gate terminal of the FET included on the semiconductor die 230 can be coupled with the second leadframe portion 220 using conductive contacts 250, such as those described herein.

As further shown in FIG. 2E (as in FIGS. 2C and 2D), the semiconductor die 230 has an exposed surface disposed along the side X2 (e.g., top side) of the device 200. In the device 200 as shown in FIG. 2E, the molding compound 240 may, at least partially, surround or cover the first leadframe portion 210, the second leadframe portion 220 and the semiconductor die 230. Furthermore, the molding compound 240 may also be disposed between the conductive contacts 250 in the device 200 and between the first leadframe portion 210 and the second leadframe portion 220.

As illustrated in FIG. 2E, a plane (or line) M1 is illustrated through a portion of the device 200. The plane M1, which is aligned along direction Z1, intersects the molding compound 240, the first leadframe portion 210, and the second leadframe portion. In this implementation, a first portion of the molding compound 240 is disposed on the left side (e.g., left lateral side) of the first leadframe portion 220 along plane M1, and a second portion of molding compound 240 is disposed between the first leadframe portion 220 and the second leadframe portion 210 along plane M1. Also, a right edge of the second leadframe portion 210 is at a terminal edge or side surface of the device 200.

FIGS. 2F and 2I illustrate variations of the packaged semiconductor device 200 shown in FIGS. 2A through 2E. As illustrated in FIGS. 2F and 2G, the device 200 has a thickness of T2, and as illustrated in FIGS. 2H and 2I, the device 200 has a thickness of T3. The thickness T2 and the thickness T3 each may be greater than the thickness T of the device 200 shown in FIGS. 2C through 2E. Also, the orientations of the variations of the device 200 shown in FIGS. 2F through 2I are similar to the orientation of the device 200 as shown in FIGS. 2C through 2E, as is indicated by the reference character R.

As compared with the device 200 of FIGS. 2A through 2E, the variation of the device 200 shown in FIGS. 2F and 2G has molding compound 240 disposed over a length of the side X2 (e.g., top side) of the device 200. The molding compound 240 has a surface 241 aligned along plane Z4. In other words, the molding compound 240 is disposed over an entire surface of the side X2 (e.g., top side) of the device 200, and extends (e.g., extends laterally along direction Z1) from a first terminal side surface (e.g., a left terminal side surface) of the device 200 to a second terminal side surface (e.g., a right terminal side surface) of the device 200. In some implementations, the molding compound 240 can be disposed over less than an entire surface of the X2 side of the device 200.

Accordingly, as shown in FIG. 2F (which corresponds with the cross-sectional view of the device 200 along section line B1 in FIGS. 2A and 2B), the first leadframe portion 210 and the semiconductor die 230 do not have exposed surfaces on the side X2 (e.g., top side) of the device 200. Further, as shown in FIG. 2G (which corresponds with the cross-sectional view of the device 200 along the section line B3 in FIGS. 2A and 2B), the second leadframe portion 220 and the semiconductor die 230 do not have exposed surfaces along the side X2 of the device 200. Accordingly, the semiconductor die 230 is encapsulated within the molding compound 240.

As compared with the variation of the device 200 shown in FIGS. 2F and 2G, the variation of the device 200 shown in FIGS. 2H and 2I has molding compound 240 disposed over a length of the side X1 (e.g., bottom side) of the device 200 rather than the side X1. As shown in FIGS. 2H and 2I, the molding compound 240 has a surface 242 aligned along plane Z5. In other words, the molding compound 240 is disposed over an entire surface of the side X2 (e.g., bottom side) of the device 200, and extends (e.g., extends laterally along direction Z1) from a first terminal side surface (e.g., a left terminal side surface) of the device 200 to a second terminal side surface (e.g., a right terminal side surface) of the device 200. In some implementations, the molding compound 240 can be disposed over less than an entire surface of the bottom side of the device 200.

Accordingly, as shown in FIG. 2H (which corresponds with the cross-sectional view of the device 200 along section line B1), the first leadframe portion 210 does not have an exposed surface on the bottom side (side X1) of the device 200. Further, as shown in FIG. 2I (which corresponds with the cross-sectional view of the device 200 along the section line B3), the first leadframe portion 210 and the second leadframe portion 220 do not have exposed surfaces along the bottom side of the device 200. In the variation of the device 200 shown in FIGS. 2H and 2I, at least a portion of the semiconductor die 230 has an exposed surface.

FIGS. 3A through 3E are diagrams illustrating a processing flow for producing packaged semiconductor devices, according to an implementation. The process illustrated by FIGS. 3A through 3E may be used to produce the packaged semiconductor devices described herein. For instance, the process illustrated by FIGS. 3A through 3E may be used to produce the packaged semiconductor devices 100, 200 variously illustrated in and described in connection with FIGS. 1A through 2I. The process of FIGS. 3A through 3E may also be used to produce packaged semiconductor devices using the various leadframes illustrated in FIGS. 4 through 6C, as well as to produce other packaged semiconductor devices, such as those illustrated in FIGS. 7A through 10B, FIG. 13 and FIG. 15A through 16B.

Additionally, packaged semiconductor devices produced using the process of FIGS. 3A through 3E may be used to produce the devices illustrated in FIGS. 11 through 12B and 14A through 14B. In certain implementations, one or more operations of the process shown in FIGS. 3A through 3B may be omitted or may be substituted with an alternative operation (or operations). In still other implementations, additional operations, other than those illustrated in FIGS. 3A through 3E, may be used to produce packaged semiconductor devices, such as those described herein.

Figure 3A:
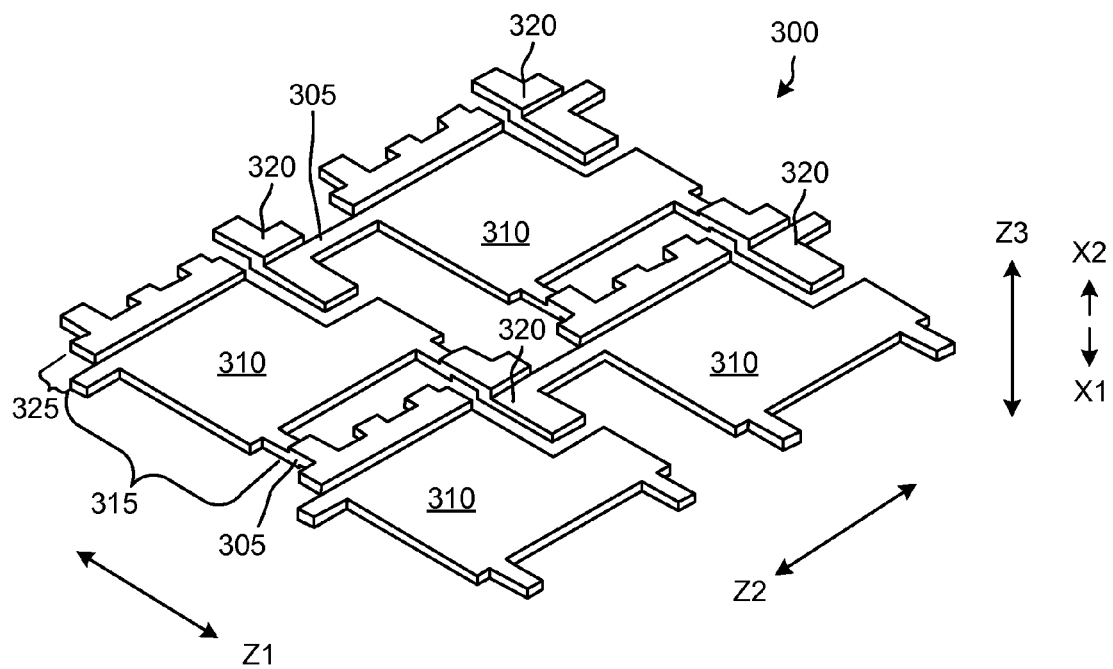
FIGS. 3A through 3E are diagrams illustrating a processing flow for producing packaged semiconductor devices, according to an implementation.
Figure 3B:
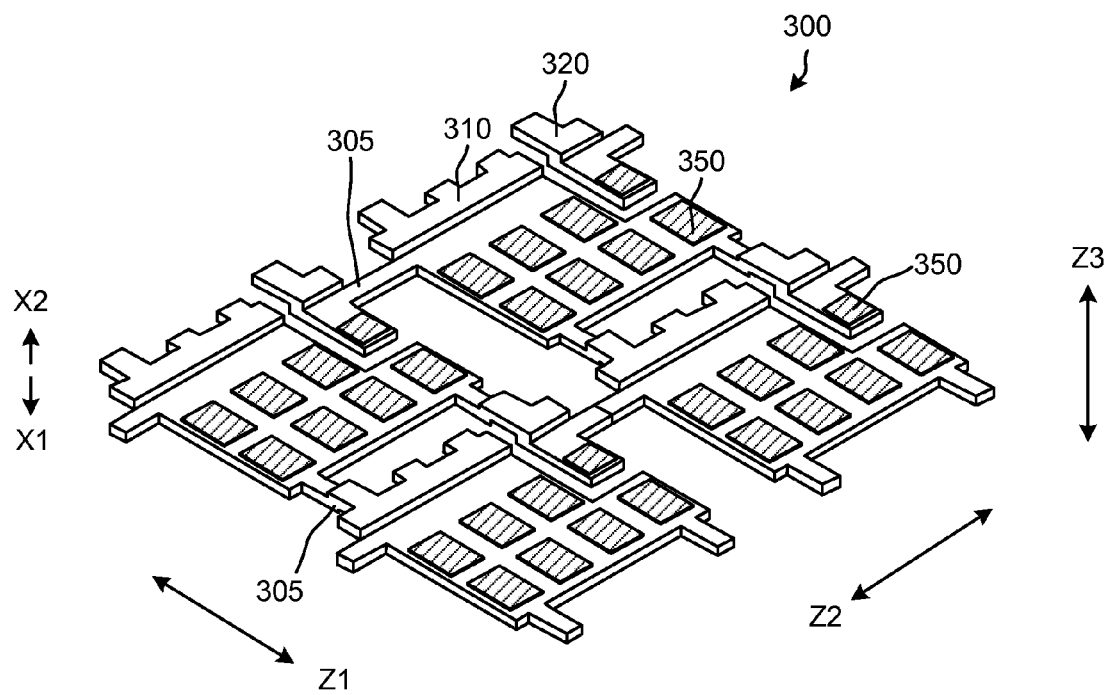

Referring to FIG. 3A, a grouping of leadframes 300 (also can be referred to as a grouping) is illustrated. In some implementation, the grouping of leadframes 300 can be referred to as a set of leadframes. In some implementations, each leadframe from the grouping of leadframe 300 can include multiple leadframe portions (e.g., a leadframe portion 110 and/or leadframe portion 120 shown in FIG. 1A).

In this implementation, the grouping 300 shown in FIG. 3A includes four leadframes. In other embodiments, a grouping of leadframes may include more leadframes or less leadframes. For instance, in one embodiment, a grouping of leadframes may include five or more leadframes. In other embodiments, a grouping of leadframes may include three or less leadframes. Also, in certain embodiments, the grouping 300 may include a frame (not shown) that is disposed around the grouping 300 (which may be referred to an outer frame or structural support frame) and is physically connected to the portions of the individual leadframes, so as to maintain the positional orientation of the leadframes (and their leadframe portions) during a process of producing a packaged semiconductor device, such as the process illustrated by FIGS. 3A through 3E. Such a frame, and the leadframes of the grouping 300 may be formed (e.g., monolithically formed) from a single piece of material, such as a copper sheet, for example. Examples of such outer frames are discussed below in connection with FIGS. 15A-16B.

In an embodiment, each leadframe of the grouping 300 (or each leadframe of other leadframe groupings) may be included in a separate packaged semiconductor device. In other embodiments, multiple leadframes of the grouping 300 (or multiple leadframes of other leadframe groupings) may be included in a single packaged semiconductor device. For instance two, four, or more leadframes (e.g., each being coupled with one or more semiconductor dice) may be included in a single packaged semiconductor device.

For the embodiment shown in FIG. 3A, each of the four leadframes in the grouping 300 includes a first leadframe portion 310 and a second leadframe portion 320. As indicated above, the leadframes of the grouping 300 may be formed (monolithically formed) from a single piece of material (leadframe material), such as a sheet of copper or other appropriate material for forming leadframes of packaged semiconductor devices. Various approaches may be used to form the leadframes of the grouping 300. For example, a stamping process or an etching process may be used to form the grouping 130, such as to form the openings between the leadframes, as well as to form the first leadframe portion 310 and the second leadframe portion 320 of each leadframe of the grouping 300.

In certain embodiments, an etch process (or processes) may be used to form the grouping 300. In one such approach, a copper sheet may be patterned with a first etch blocking mask on a first side (e.g., a side X1) of the copper sheet, where the first block etch blocking mask defines portions of the first side of the copper sheet that are to be etched and portions of the first side of the copper sheet that are not to be etched. In this example, the copper sheet may also be patterned with a second etch blocking mask on a second side (e.g., a side X2) of the copper sheet (opposite the first side), where the second etch blocking mask defines portions of the second side of the copper sheet that are to be etched and portions of the second side of the copper sheet that are not to be etched.

After forming the first and second blocking masks, the copper sheet may be etched (simultaneously or sequentially) on the first side (the X1 side) and the second side (the X2 side) to etch the portions on each side of the copper sheet that are not protected by the blocking masks. In such an approach, using the first blocking mask and the second blocking mask, surfaces on opposing sides of the copper sheet at a given location of the sheet can both be etched, can be etched only on the first (X1) side of the sheet, or can be etched only on the second (X2) side of the sheet.

The grouping 300 may be formed using such an approach that includes performing an etch process on each side of a copper sheet (simultaneously or sequentially) that etches through half the thickness of the copper sheet. In this example, the openings in the leadframe, e.g., between leadframe portions, can be formed by etching those portions of the copper sheet from both sides. Because each etch process (on each side of the copper sheet) removes half the thickness of the copper sheet, etching from both sides will completely remove (fully etch) those portions of the copper sheet, such as was described above with respect to FIG. 3A.

Portions of the grouping 300 that are intended to remain the full thickness of the copper sheet, such as tie bars 305 (which may also be referred to as protrusions, as in FIGS. 2A through 2C) between leadframe portions, may not be etched from either side of the copper sheet, or may be etched from the side X1 or the side X2. Those portions (tie bars or protrusions) would have a thickness that is equal (substantially equal) to a starting thickness of the copper sheet used to form the grouping 300. This process and resulting structure will be described in more detail below in connection with FIGS. 4 through 6C. Furthermore, in certain embodiments, the tie bars 305 may, after a molding process, have exposed surfaces on corresponding surfaces of a packaged semiconductor device (e.g., an X1 side surface, an X2 side surface and/or one or more edge surfaces.

Also as may be seen in FIG. 3A, the leadframe portions 310 include a first segment 315 (also can be referred to as a lower portion) (e.g., where a semiconductor die is attached) and a second segment 325 (also can be referred to as an upper portion) (that defines exposed surfaces of a leadframe, such as the exposed surfaces 110A and 120A in the device 100). The first segments 315 of the leadframes may be referred to as die attach paddles, paddles, die attach surfaces, and so on.

Using the etching approach described above, the first segments 315 of the grouping 300 may be formed by etching only from a first side (e.g., the side X2 in FIG. 3A) of a copper sheet used to form the grouping 300, while the second segment 325 may be formed by etching only from a second side (e.g., the side X1 in FIG. 3A) of the copper sheet used to form the grouping 300.

A frame (not shown) may be disposed around the grouping 300 and attached to the leadframes (to maintain the physical orientation of the leadframes such as was discussed above). In an embodiment, such a frame (which may also be referred to as an outer frame, such as shown in FIG. 15A through 16B) may be formed from the copper sheet used to form the grouping 300 using the etching process (or processes) that is/are used to form the leadframes of the grouping 300. In other embodiments, a stamping process (metal deformation process) may be used in combination with one or more etch processes to form a leadframe grouping.

After forming the grouping 300, conductive contacts 350 (may also be referred to as conductive material patches, or patches) may be applied to the leadframe portions 310 and 320. The conductive contacts 350 (which may be formed from solder or other conductive material) may be applied in alignment with bond pads on a semiconductor die or semiconductor dice that are to be attached to each leadframe of the grouping 300. Alternatively, conductive balls (bumps) (e.g., made of solder or other conductive material) may be formed on contact (bond) pads of each semiconductor die that is to be attached to the leadframes of the grouping 300. In other embodiments, both the conductive contacts 350 and conductive bumps may be used to attach semiconductor dice to the leadframes of the grouping 300. The arrangement (pattern) and size of the conductive contacts 350 may reduce undesired rotation and/or tilt of a semiconductor die when it is affixed to the leadframe portions 310 and 320.

Figure 3C:
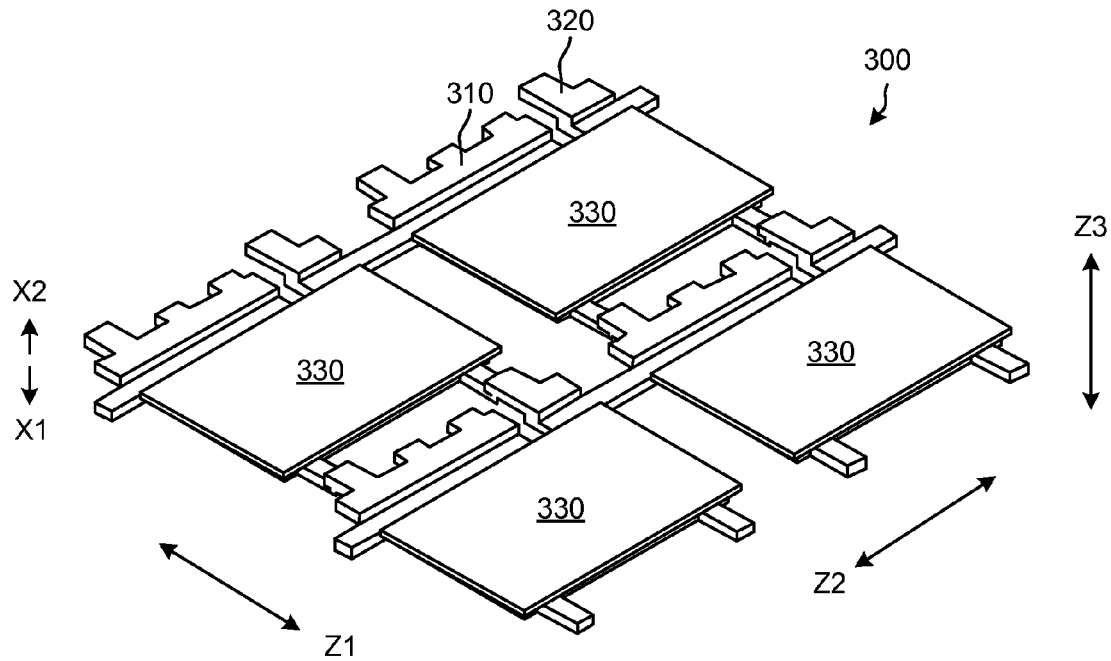
Figure 3D:
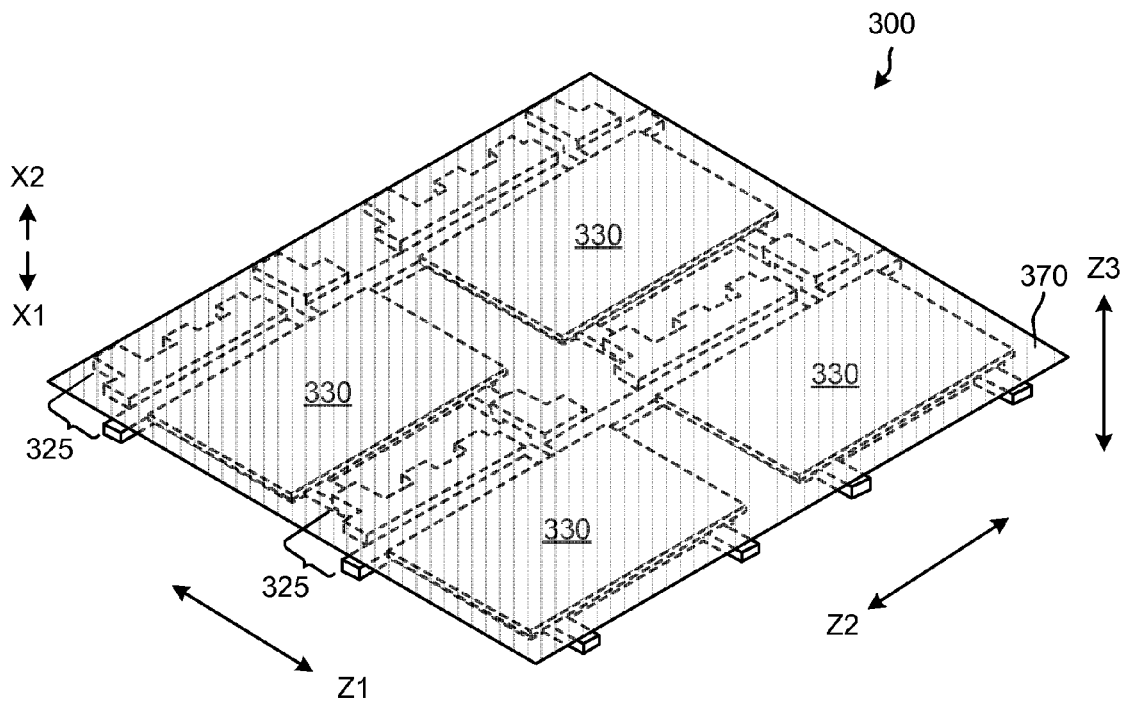

FIG. 3C shows the grouping 300 after respective semiconductor die of four semiconductor dice 330 have been placed on each of the leadframes of the grouping 300. Once the semiconductor dice 330 have been placed, the conductive contacts 350 and/or conductive bumps, if formed from solder, can be reflowed in order establish low resistance electrical connections between the leadframes portions 310, 320 and their respective semiconductor dice 330, as well as to physically affix the semiconductor dice 330 with the leadframe portions 310 and 320. Although not shown in FIG. 3C, in some implementations, multiple separate semiconductor die can be coupled to each leadframe of the grouping 300. In other embodiments, other approaches may be used to physically affix the semiconductor dice 300 with the leadframe portions 310 and 320, such as performing a cure operation to cure a conductive epoxy.

After forming low resistance electrical connections and affixing the semiconductor dice 300 with the leadframes, an adhesive 370 (e.g., a protective tape) may be affixed to the grouping 300. In an embodiment, the adhesive 370 may be adhered to side X2 surfaces of the semiconductor dice 330 and also affixed with side X2 surfaces of the second segments 325 of the leadframes of the grouping 300. In such an approach, the side X2 surfaces of the semiconductor dice 330 and the side X2 surfaces of the second segments 325 may be coplanar (substantially coplanar). In this example, the adhesive 370 would not contact the first segments 315 of the leadframes of the grouping 300. The adhesive 370 prevents molding compound from flowing onto the side X2 surfaces of the semiconductor dice 330 and the side X2 surfaces of the second segments 325 of the leadframes.

After placing the adhesive 370, the grouping 300 may be placed in a molding tool, which may include a well that has a depth that is equal to an overall thickness of the grouping 300 and has a width and a length that allow the grouping 300 to be received in the well, but prevent movement of the grouping 300 in the well. Molding compound (in a liquid state) may then be flowed (or injected) into the well of the molding tool, filling the well to a height that is equal (substantially equal) with the height of the side X2 surfaces of the semiconductor dice 330 and the side X2 surfaces of the second segments 325 of the leadframes.

While the height of the side X2 surfaces of the semiconductor dice 330 and the side X2 surfaces of the second segments 325 of the leadframes of the grouping 330 are substantially coplanar in the embodiment shown in FIGS. 3A through 3E, in other embodiments, the side X2 surfaces of the semiconductor die 330 and the side X2 surfaces of the second segments 325 of the leadframes of the grouping 330 may not be coplanar and may have different heights. For example, the side X2 surfaces of the semiconductor dice 330 may be higher or lower (along direction Z3) than the side X2 surfaces of the second segments 325 of the leadframes of the grouping 330. In such instances, the molding compound, when flowed or injected, may cover either the side X2 surfaces of the semiconductor dice 330 or the side X2 surfaces of the second segments 325 of the leadframes in the grouping 300, depending on which of the surfaces are lower (along direction Z3).

Figure 3E:
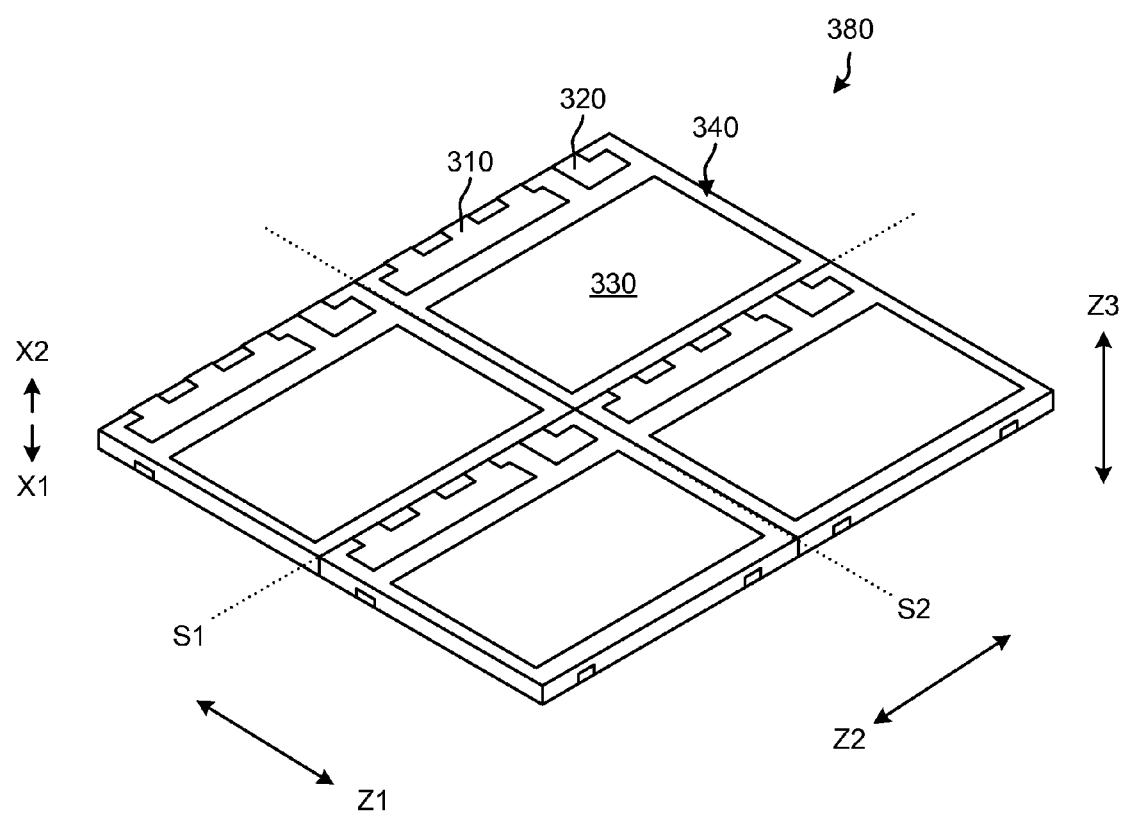

After the molding compound is flowed or injected, the molding compound may be cured, such as by using thermal processing (e.g. baking) or other processing operations (e.g., chemical processing). Once the molding compounding is cured, shown as molding compound 340 in FIG. 3E, the adhesive 370 (e.g., protective tape) may be removed, as shown in FIG. 3E.

The grouping 300, after molding, may be retained as a single packaged semiconductor device 380 including the four semiconductor dice 330. The packaged semiconductor device 380 shown in FIG. 3E may be referred to as a bridged device, or full-bridge device (e.g., none of the leadframes of the grouping are separated in the final packaged device). In such an approach, partial cuts may be made in the packaged semiconductor device 380 in order to sever tie bars 305 (protrusions), such as shown in FIG. 3A, connecting different leadframe sections, such as tie bars 305 between leadframe sections 310 (e.g., connected to source or emitter terminals) and leadframe sections 320 (e.g., connected to gate or source terminals).

In other approaches, the packaged semiconductor device 380 may be segmented (e.g., sawed, diced, singulated) along line S1 and/or line S2 to form four separate packaged semiconductor devices each having a single semiconductor die 330, or to form two packaged semiconductor devices each have two semiconductor dice 330, which may each be referred to as half-bridges.

FIGS. 4 through 6C are cross-sectional schematic diagrams illustrating various embodiments of leadframe portions that may be used to implement packaged semiconductor devices, such as those devices described herein. For instance, the leadframe portions illustrated in FIGS. 4 through 6C may be used to implement the leadframe portions 110, 210, 310, and may be used in conjunction with other corresponding (compatible) leadframe portions, such as in the devices described herein.

The leadframe portions illustrated in FIGS. 4 through 6C may be formed using various methods, such as those discussed above. For example, the leadframe portions illustrated in FIGS. 4 through 6C may be formed using one or more etch processes and/or one or more stamping (metal deformation) processes. In other embodiments, other variations of a leadframe portion may be used and the arrangement of a given leadframe portion and one or more semiconductor dice mounted on the leadframe may vary as compared to the embodiments illustrated in FIGS. 4 through 6C, depending on the specific implementation. For example, in some embodiments, an exposed (side X2) surface of a semiconductor die mounted on a leadframe portion may define a plane that is at a height that is higher than a height of a plane defined by a side X2 surface of a second segment of the leadframe portion to which it is attached.

Figure 4:
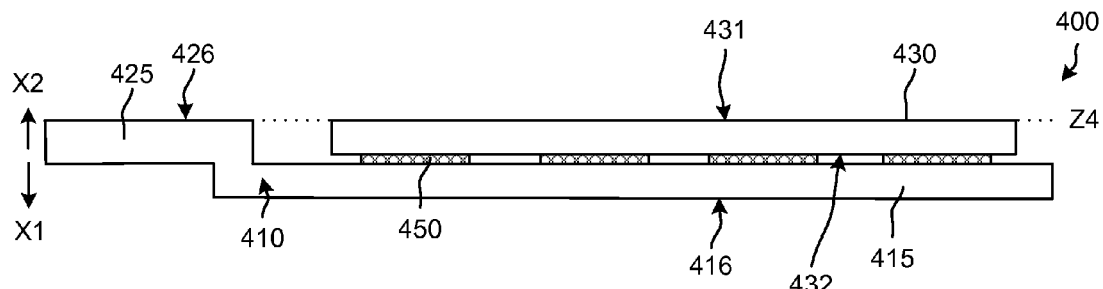
FIG. 4 is a cross-sectional diagram illustrating a leadframe portion and a semiconductor die, according to an implementation.

FIG. 4 is a cross-sectional diagram illustrating a leadframe and semiconductor die assembly 400 (also can be referred to as an assembly) that includes a leadframe portion 410 and a semiconductor die 430, according to an implementation. The leadframe portion 410 shown in FIG. 4 may be used to implement, for example, the leadframe portions 110, 210, 310, as well as other leadframe portions. As shown in FIG. 4, the leadframe portion 410 includes a first segment 415 and a second segment 425, that may be formed using an etch process (or processes), such as those described herein (e.g., in connection with FIG. 3A). A surface 432 of the semiconductor die 430 can be affixed (physically and electrically) to the first segment 415 of the leadframe portion 410 using one or more conductive contacts 450, such as those described herein. The first segment 415 is aligned a first plane parallel to a second plane along which the second segment 425 is aligned.

As illustrated in FIG. 4, a surface 426 of the second segment 425 may be coplanar (substantially coplanar) with a surface 431 of the semiconductor die 430, which may allow the surface 431 of the semiconductor die 430 and the surface 426 of the second segment 425 to be exposed through, and coplanar with, a molding compound (not shown) after the assembly 400 is molded, such as by using the approaches described herein. The coplanar surface is illustrated as plane Z4 in FIG. 4.

In other implementations, surface 426 of the second segment 425 and surface 431 of the semiconductor die 430 may not be coplanar. In other words, surface 426 of the second segment 425 may be aligned along (or disposed within) a first plane and a surface 431 of the semiconductor die 430 may be aligned along (or disposed within) a second plane parallel to (but not coincident with) the first plane.

In certain embodiments, the semiconductor die 430 may be attached to additional leadframe portions (not shown), such as in the embodiments illustrated in FIGS. 1 through 3E, for example. In other embodiments, additional semiconductor die may be attached to the leadframe portion 410, such as in the embodiments discussed below with respect to FIGS. 9A through 10B and 13.

Figure 5A:
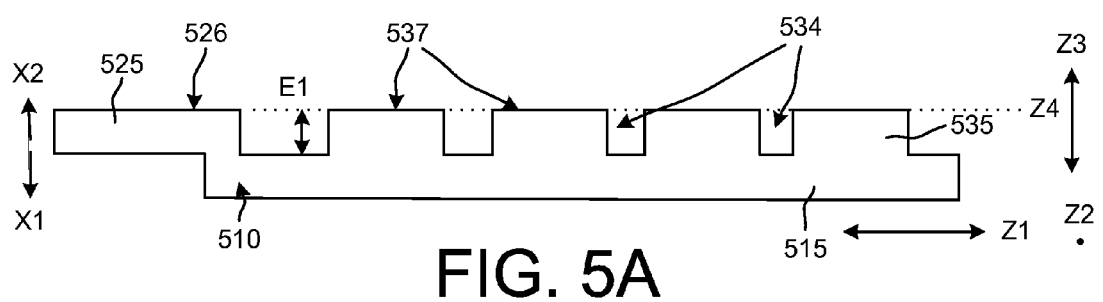
FIGS. 5A through 5C are cross-sectional diagrams illustrating a processing flow for producing a leadframe and semiconductor device die assembly, according to an implementation.
Figure 5B:
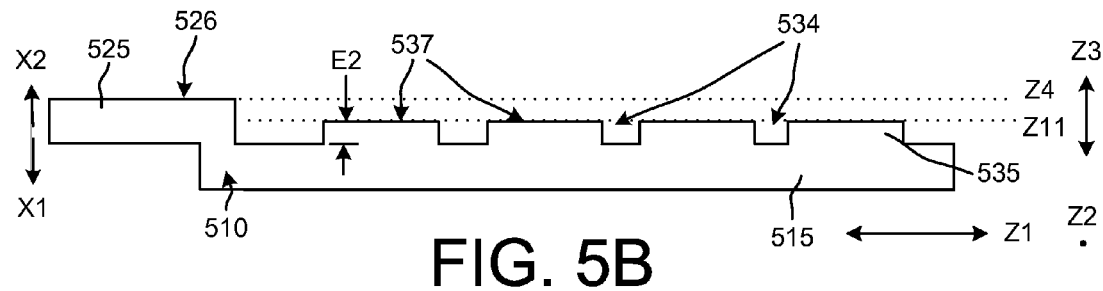
Figure 5C:
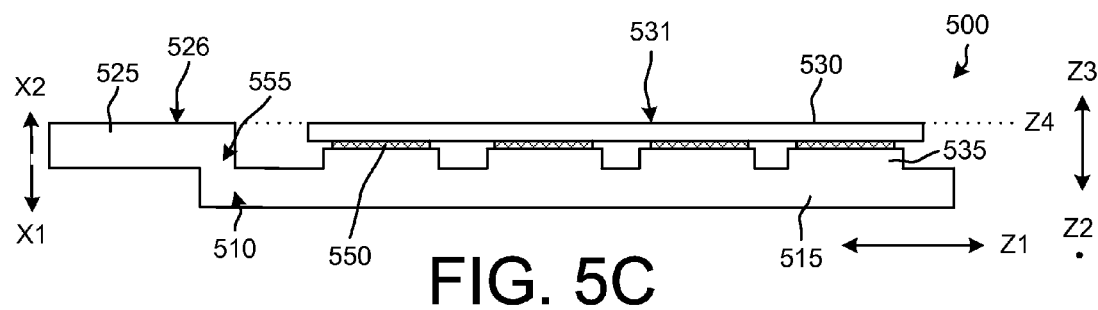

FIGS. 5A through 5C are cross-sectional, schematic diagrams illustrating a processing flow for producing a leadframe and semiconductor device assembly 500 (which may also be referred to as an assembly), according to an implementation. FIG. 5A illustrates a leadframe portion 510 that may be used to implement, for example, the leadframe portions 110, 210, 310, as well as other leadframe portions. As shown in FIG. 5A, the leadframe portion 510 includes a first segment 515 and a second segment 525. The first segment 515 is aligned along a first plane that is parallel to a second plane along which the second segment 525 is aligned.

The leadframe portion 510 may also include one or more pillars 535 that are defined during an etch process that is used to form the leadframe portion 510. Recesses 534 (also can be referred to as openings or as trenches) are disposed between the pillars 535. The recesses 534 can be referred to as being defined by the pillars 535. Arrangement and sizing of the pillars 535 (as well as pillars described herein with respect to other implementations) may, as with the arrangement of conductive contacts (such as described with respect to FIG. 3B) may prevent undesired tilt and/or rotation of a semiconductor die when affixed with the leadframe portion 510 (and one or more other leadframe portions).

In an example embodiment, the pillars 535 may be formed using an etch blocking mask that selectively prevents etching of a copper sheet (or other leadframe material). For instance, in a process for forming the leadframe portion 510, an etch blocking mask may be formed on a surface (e.g., on a side X2) of a copper sheet (or other leadframe material), where the etch blocking mask defines a top surface of the second segment 525 and top surfaces of the pillars 535. After forming the etch blocking mask, the surface (the side X2) of the sheet of leadframe material may be etched to a depth equal to a height of the pillars 535, such as shown in FIG. 5A, with the etch blocking mask preventing etching of the second segment 525 and the pillars 535. As shown in FIG. 5A, this etch process may result in surfaces 537 of the pillars 535 being coplanar (substantially coplanar) (e.g., along plane Z4) with a surface 526 of the second segment 525.

Although not shown, if a first surface of a semiconductor die were affixed with the pillars 535 of the leadframe portion 510 as illustrated in FIG. 5A, a second surface (an X2 side opposite the first surface) of the semiconductor die would not be coplanar with the surface 526 of the second segment 525. In order to make the second surface of the semiconductor die coplanar with the surface 526 of the second segment 525 (as illustrated in FIG. 5C), the height of the pillars 535 is reduced, such as illustrated in FIG. 5B.

A height of the pillars 535 (or depth of the recesses 534) has been reduced (e.g., recessed, modified) from a dimension E1 shown in FIG. 5A to a dimension E2 shown in FIG. 5B such that the surfaces 537 of the pillars define a plane Z11 parallel with and vertically below (along direction Z3) the plane Z4 defined by the surface 526 of the second segment 525. The height reduction of the pillars 535 may be achieved using a number of different approaches. For example, the height of the pillars 535 may be reduced using a grinding process on the pillars 535 to reduce them from the dimension E1 (e.g., as shown in FIG. 5A) to the dimension E2 (e.g., as shown in FIG. 5B). In other embodiments, a second blocking mask may be applied to the leadframe portion 510 shown in FIG. 5A, where the blocking mask is disposed on the surface 526 of the leadframe portion 510 (and over the recesses 534 of the leadframe portion 510) and not over the surfaces 537 of the pillars 535. In such approaches, the pillars 535 may then be etched to reduce them from the dimension E1 (FIG. 5A) to the dimension E2 (FIG. 5B).

As shown in FIG. 5C, after the height of the pillars 535 is reduced, a semiconductor die 530 can be affixed (physically and electrically) to the pillars 535 using one or more conductive contacts 550. As illustrated in FIG. 5C, due to the height of the pillars 535 being reduced, the surface 537 of the second segment 525 of the leadframe portion 510 may be coplanar (substantially coplanar) with a surface 531 of the semiconductor die 530 that is affixed to the pillars 535 (e.g., allowing the surface 531 of the semiconductor die 530 and the second segment 525 of the leadframe portion 510 to be exposed through, and be coplanar with, a molding compound (not shown) once the assembly 500 is molded). In certain embodiments, the semiconductor die 530 may be attached to additional leadframe portions (not shown), where the additional leadframe portions may also include pillars such as those illustrated in FIG. 5C. In other embodiments, additional semiconductor die may be attached to the leadframe portion 510.

In some implementations, the device 500 defines at least one pillar 535 coupled to the semiconductor die 530 via at least one conductive contact 530 where the leadframe portion 510 has a vertical segment 555 (aligned along direction Z3 and coupled between segment 515 and 525) extending contiguously from the first surface (side X2 surface) of the device 500 to the second surface (side X1 surface) of the device 500. The semiconductor die 530, the at least one pillar 535, the at least one conductive contact 530, and the leadframe portion 510 define a vertical stack (vertical stack aligned along direction Z3) having at thickness equal to a thickness of the vertical segment 555 of the leadframe portion 510.

Figure 6A:
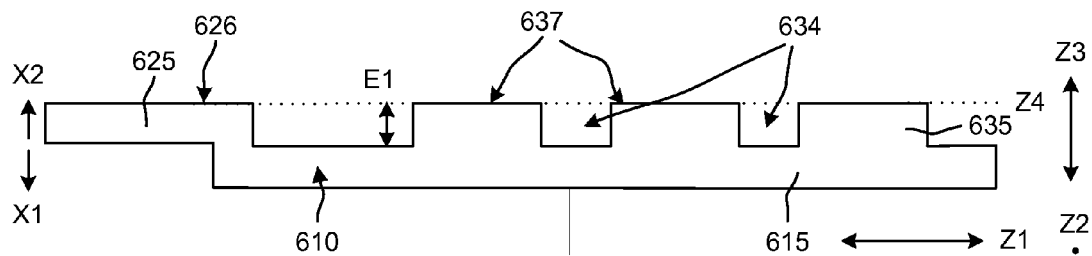
FIGS. 6A through 6C are cross-sectional diagrams illustrating a processing flow for producing a leadframe and semiconductor device die assembly, according to an implementation.
Figure 6B:
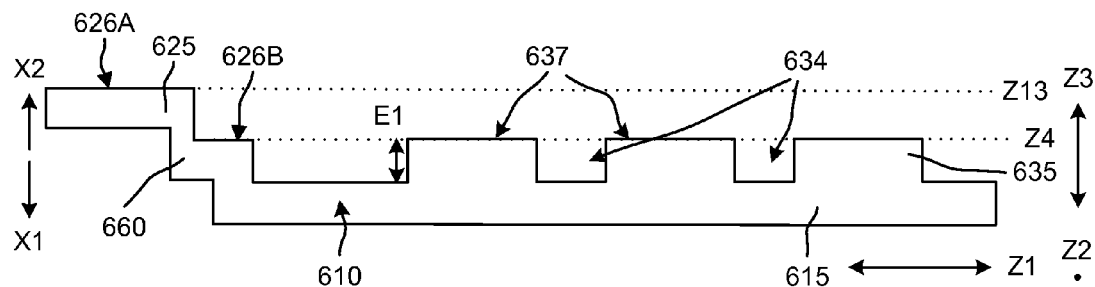
Figure 6C:
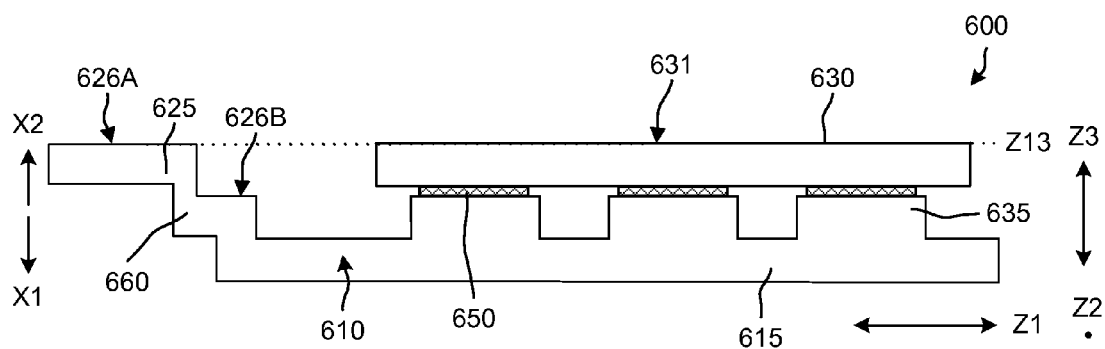

FIGS. 6A through 6C are cross-sectional, schematic diagrams illustrating a processing flow for producing a leadframe and semiconductor device assembly 600 (which may also be referred to as an assembly), according to an implementation. FIG. 6A illustrates a leadframe portion 610 that may be used to implement, for example, the leadframe portions 110, 210, 310, as well as other leadframe portions. As shown in FIG. 6A, the leadframe portion 610 includes a first segment 615 and a second segment 625. The first segment 615 is aligned a first plane parallel to a second plane along which the second segment 625 is aligned.

The leadframe portion 610 may also include one or more pillars 635 (with top surfaces 637) that are defined during an etch process that is used to form the leadframe portion 610. Recesses 634 (also can be referred to as openings or as trenches) are disposed between the pillars 635. The recesses 634 can be referred to as being defined by the pillars 635. In this example, and for purposes of illustration, the leadframe portion 610 shown in FIG. 6A may have a same configuration as the leadframe portion 510 shown in FIG. 5A, and may be formed using the approaches described above with respect to FIG. 5A. Accordingly, those details are not repeated again here with respect to FIG. 6A.

In contrast with FIG. 5B, rather than the reducing the height of the pillars 635 of the leadframe portion 610 (from the dimension E1), a metal deformation process (which may also be referred to as a push-down process, a stamping process, and so forth) may be performed on the second segment 625 of the leadframe portion 610 (at an intermediate point along a surface 626 of the second segment 625), such as illustrated by FIG. 6B. As shown in FIG. 6B, after the metal deformation process, the second segment 625 of the leadframe portion 610 has a metal deformation 660 that defines a first surface 626A and a second surface 626B from the surface 626 (and from the second segment 625), where the surface 626A defines a plane that has a height that is above a height of a plane defined by the surface 626B and top surfaces 637 of the pillars 635, as is shown by the dotted line in FIG. 6B. As shown in FIG. 6B, the top surfaces 637 of the pillars 635 and the surface 626B may have a same (substantially same height) and be aligned along the plane Z4.

As shown in FIG. 6C, after the metal deformation 660 is formed, so as to define the surface 626A and the surface 626B from the second segment 625 (and the surface 626), a semiconductor die 630 can be affixed (physically and electrically) to the pillars 635 using one or more conductive contacts 650 (which may be formed using the approaches described above with respect to FIGS. 2C through 2E and FIG. 3B, for example). Accordingly, a distance between the first plane along which the first segment 615 is aligned and the second plane along which the second segment 625 is aligned is increased.

As illustrated in FIG. 6C, due to the metal deformation 660 defining the surface 626A as being higher (along direction Z3) than the surface 626B, the surface 626A may be coplanar (substantially coplanar) with a surface 631 (upper surface) of the semiconductor die 630 that is affixed to the pillars 635 (e.g., allowing the surface 631 of the semiconductor die 630 and the surface 626A to be exposed through, and be coplanar with, a molding compound once the assembly 600 is molded). In certain embodiments, the semiconductor die 630 may be attached to additional leadframe portions (not shown), where the additional leadframe portions may also include pillars such as those illustrated in FIG. 6C. In other embodiments, additional semiconductor die may be attached to the leadframe portion 610.

In some implementations, the device 600 defines at least one pillar 635 coupled to the semiconductor die 630 via at least one conductive contact 630 where the leadframe portion 610 has a segment with the metal deformation 660 (coupled between segment 615 and 625) extending contiguously from the first surface (side X2 surface) of the device 600 to the second surface (side X1 surface) of the device 600. The semiconductor die 630, the at least one pillar 635, the at least one conductive contact 630, and the leadframe portion 610 define a vertical stack (vertical stack aligned along direction Z3) having at thickness equal to a thickness of the segment with the metal deformation 660 of the leadframe portion 610.

Figure 7A:
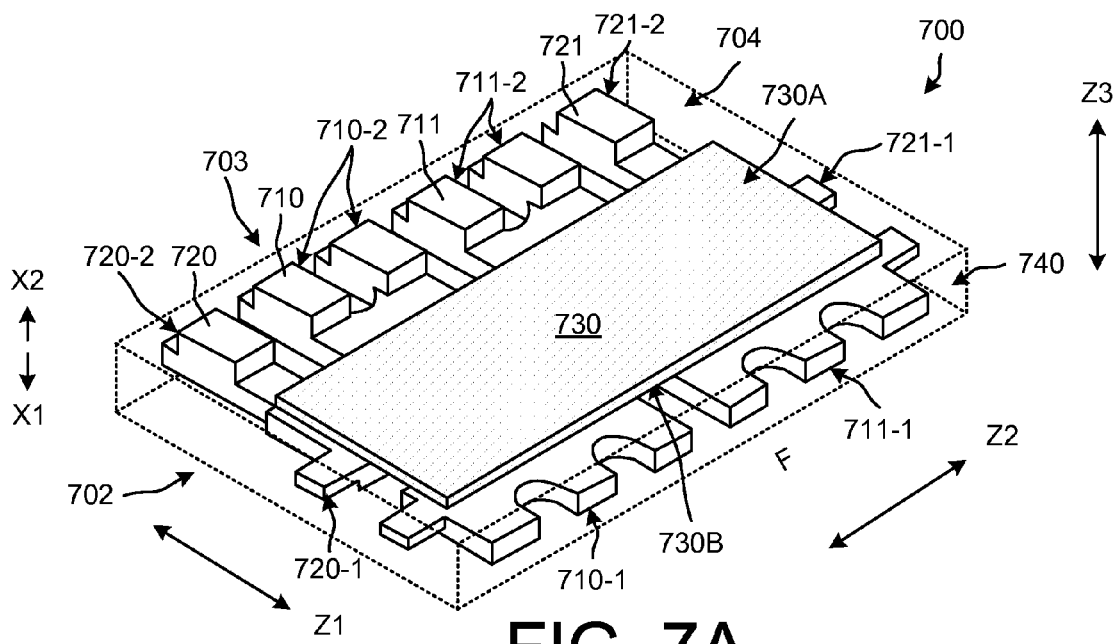
FIGS. 7A and 7B are drawings illustrating a packaged semiconductor device, according to an implementation.
Figure 7B:
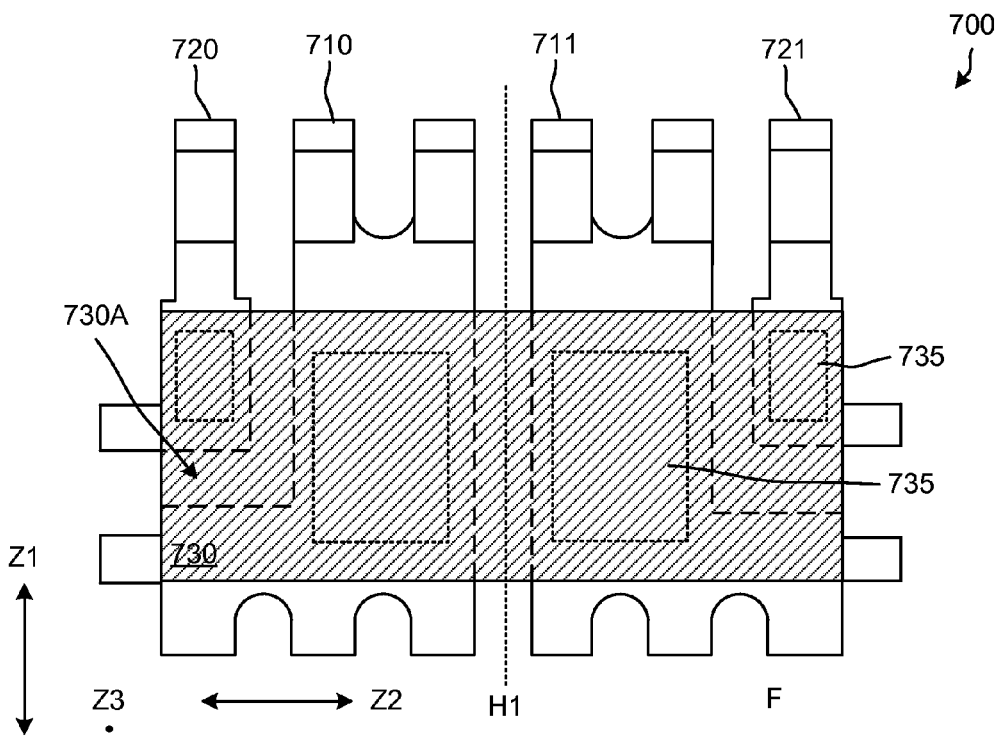

FIGS. 7A and 7B are drawings illustrating a packaged semiconductor device 700, according to an implementation. The relative orientation of the views of the device 700 shown in FIGS. 7A and 7B is shown by the reference character F in each drawing. As shown in FIG. 7A, the device 700 includes a first leadframe portion 710, a second leadframe portion 711, a third leadframe portion 720 and a fourth leadframe portion 721. The device 700 also includes a semiconductor die 730 and a molding compound 740 that, as described herein, may at least partially cover (or can encapsulate in some implementations) the leadframe portions 710, 711, 720, 721 (or portions thereof) and the semiconductor die 730 (or portions thereof).

In the example embodiment of FIG. 7A, each of the leadframe portions 710, 711, 720, 721 may have at least one exposed surface that is coplanar with a respective surface of the molding compound 740. For example, the leadframe portion 720 may have a first exposed surface on a side X2 (a top side) of the device 700, a second exposed surface on an edge 702 (e.g., side surface, left side surface) of the device 700 and a third exposed surface on an edge 703 (e.g., side surface, back side surface) of the device 700, such as illustrated in FIG. 7A. The other leadframe portions 710, 711, 721, in the device 700 shown in FIG. 7A, may likewise have multiple exposed surfaces (not labeled) that are coplanar with respective surfaces (e.g., side surfaces) of the molding compound 740 (e.g., on the top side, bottom side and/or edges (or side surfaces) of the device 700). Additionally, in the device 700, a surface 730A on the side X2 (which is the surface that is shown in FIG. 7A) of the semiconductor die 730 may also be exposed and coplanar with the molding compound 740 (and/or exposed surfaces of one or more of the leadframe portions 710, 711, 720, 721) on the surface of the device 700 on side X2. A surface 730B of the semiconductor die 730, which is opposite surface 730A and is facing toward side X1, cannot be seen in FIG. 7A.

In an example embodiment, the semiconductor die 730 of the device 700 may have multiple discrete semiconductor devices implemented therein. In one embodiment, the semiconductor die 730 may include two functionally independent (HV or LV) transistors, where the surface 730A of the semiconductor die 730 defines a common terminal of the two transistors. For instance, in an embodiment, the semiconductor die 730 may include two functionally independent FET devices, where the surface 730A of the semiconductor die 730 defines a common drain terminal for the FETs. In another embodiment, the semiconductor die 730 may include two functionally independent BJT devices, where the surface 730A of the semiconductor die 730 defines a common collector terminal for the BJTs. Accordingly, the device 700 may be referred to as having a common drain or a common collector configuration.

In other embodiments, other types of semiconductor devices may be implemented in the device 700. However, for purposes of illustration and clarity, in the following discussion, the device 700 (as well as the devices 800, 900, 1000 illustrated in FIGS. 8A through 10A) will be described as implementing FET devices, though other types of semiconductor devices (BJTs, IGBTS, diode, application-specific integrated circuits, and so forth) can also be implemented in the devices 700, 800, 900 and 1000.

As shown in FIG. 7B, the semiconductor die 730 of the device 700 may be coupled (electrically and physically) with each of the leadframe portions 710, 711, 720, 721. The semiconductor die 730 can be coupled to the leadframe portions 710, 711, 720, 721 via side 730B of the semiconductor die 730. In this embodiment, the leadframe portion 710 may be coupled with a source terminal of a first FET implemented in the semiconductor die 730 and the leadframe portion 720 may be coupled with a gate terminal of the first FET. Similarly, the leadframe portion 711 may be coupled with a source terminal of a second FET implemented in the semiconductor die 730 and the leadframe portion 721 may be coupled with a gate terminal of the second FET.

The exposed surfaces of the leadframe portions 710, 711, 720, 721 in the device 700 may operate as electrical contacts (terminals, pins, and so forth) to the respective source and gate terminals of the first and second FETs of the semiconductor die 730, which may be used to connect the FET devices implemented in the device 700 with other elements of an electrical circuit (e.g. on a PCB). Likewise, the surface 730A of the semiconductor die 730 may operate as a common electrical contact (common drain) to the drain terminals of both the first FET and the second FET, and can be used to connect the common drain terminal with other elements of an electrical circuit.

In the device 700, the semiconductor die 730 may be affixed to the leadframe portions 710, 711, 720, 721 using one or more pillars 735 (and/or corresponding conductive contacts and/or bumps, such as described herein) on each leadframe portion. For purposes of illustration, the implementations shown in FIGS. 7A-10B are described as included pillars 735 for affixing semiconductor dice with leadframe portions (to form conductive contacts. However, in other embodiments, various combinations of conductive contacts (formed from conductive material, such as solder) and/or pillars made be used when affixing semiconductor die with leadframe portions. While only a single pillar 735 is shown on each of the leadframe portions 710, 711, 720, 721 in FIG. 7B, in other embodiments, each leadframe portion may include multiple pillars (and/or one or more corresponding conductive contacts and/or bumps), such as the pillars of the leadframe portions 510, 610 illustrated in FIGS. 5 and 6 and/or the conductive contacts 350 of FIG. 3B.

As illustrated in FIG. 7B, the leadframe portions 710, 720 are mirrored along axis H1 with leadframe portions 711 and 721. Although not shown, in some implementations, the leadframe portions 710, 720, 711, 721 can be configured without being mirrored about axis H1. In such implementations, for example, leadframe portion 710 can have a different profile or footprint (when viewed in a plan view as shown in FIG. 7B) from leadframe portion 711. Similarly, in some implementations, for example, leadframe portion 720 can have a different profile or footprint from leadframe portion 721. Although not shown, the leadframe portions 710, 711, 720, 721 can be coupled with other similar leadframe portions in a grouping, such as the groupings described herein in connection with FIGS. 3A through 3E and FIGS. 15A through 16B.

In some implementations, the device 700 can include a leadframe that has a first portion 710, a second portion 720, a third portion 711 and a fourth portion 721. The first portion 710 can have a first segment 710-1 and a second segment 710-2, where the second segment 710-2 includes a first external contact. The second portion 720 can have a first segment 720-1 and a second segment 720-2, where the second segment 720-2 includes a second external contact. The third portion 711 can have a first segment 711-1 and a second segment 711-2, where the second segment 711-2 includes a third external contact. The fourth portion 721 can have a first segment 721-1 and a second segment 721-2, where the second segment 721-2 includes a fourth external contact. The first portion 710, the second portion 711, the third portion 720 and the fourth portion 721 can being physically (and electrically separate from one another).

In some implementations, the device 700 can include a semiconductor die 730 coupled with the first segment 710-1 of the first portion 710, the first segment 720-1 of the second portion 720, the first segment 711-1 of the third portion 711 and the first segment 721-1 of the fourth portion 720. The device 700 can also include a molding compound 740 covering at least part of the leadframe and at least part of the semiconductor die 730.

In some implementations, the semiconductor die 730 can include a first discrete transistor having a first terminal (e.g., a source terminal) coupled with the first segment 710-1 of the first portion 710 and a control terminal (e.g., a gate terminal) coupled with the first segment 720-1 of the second portion 720. The semiconductor die 730 can also include a second discrete transistor having a first terminal (e.g., a source terminal) coupled with the first segment 711-1 of the third portion 711 and a control terminal (e.g., a gate terminal) coupled with the first segment 721-1 of the fourth portion 721. The second discrete transistor can be operationally independent from the first discrete transistor on the semiconductor die 730. A substrate of the semiconductor die 730 can define a common second terminal (e.g., a common drain terminal) of the first discrete transistor and the second discrete transistor.

In some implementations, the first segment 710-1 of the first portion 710 can include a first pillar 735 and the first segment 711-1 of the second portion 711 can include a second pillar 735. The first segment 720-1 of the third portion 720 can include a third pillar 735 and the first segment 721-1 of the fourth portion 721 can include a fourth pillar 735. The semiconductor die 730 can be coupled with the leadframe on top surfaces of the first, second third and fourth pillars 735 using conductive contacts, such as those described herein.

Figure 8A:
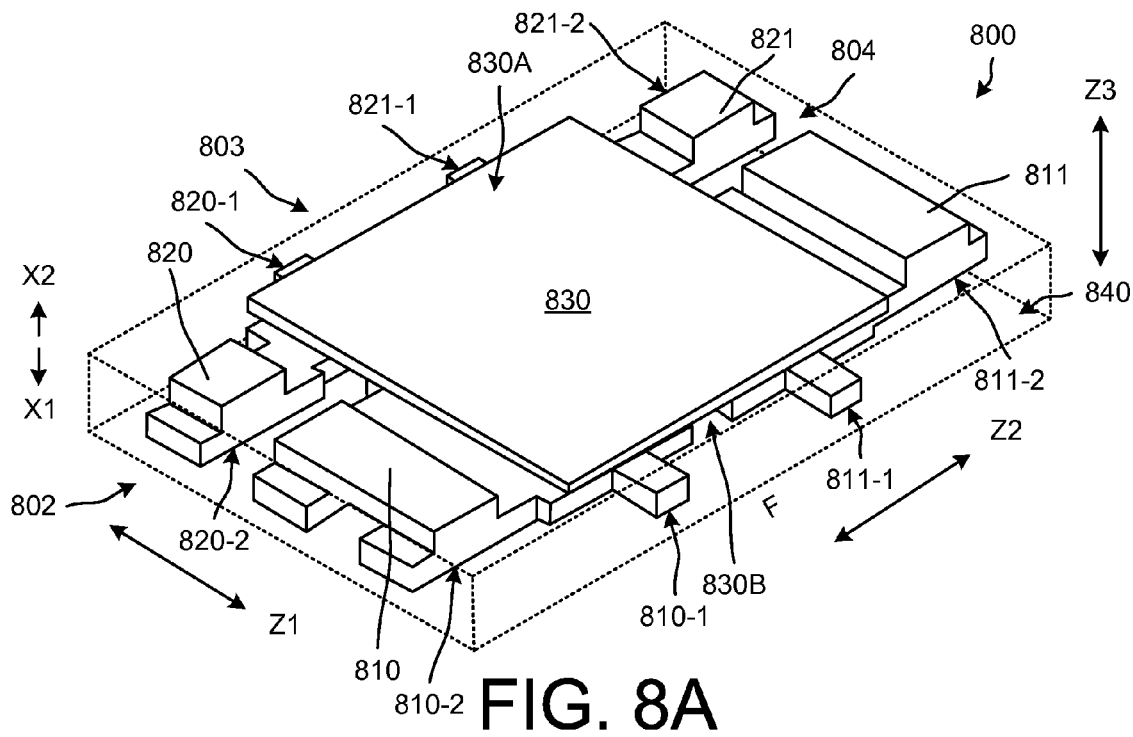
FIGS. 8A and 8B are drawings illustrating another packaged semiconductor device, according to an implementation.
Figure 8B:
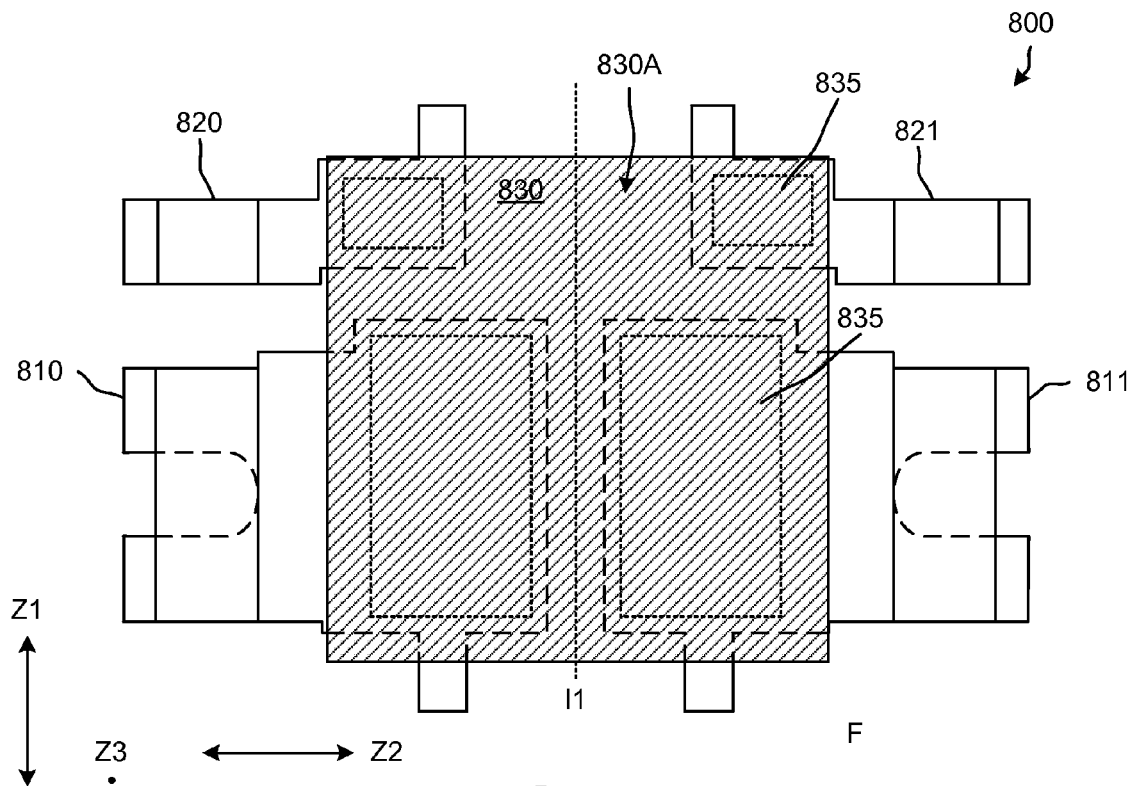

FIGS. 8A and 8B are drawings illustrating a packaged semiconductor device 800, according to an implementation. The relative orientation of the views of the device 800 shown in FIGS. 8A and 8B is shown by the reference character F in each drawing. The device 800 may be used to implement an alternative common drain configuration (or common collector configuration for BJTs) for a packaged semiconductor device (e.g., as compared with the device 700 shown in FIGS. 7A and 7B). As illustrated in FIG. 8A, the device 800 includes a first leadframe portion 810, a second leadframe portion 811, a third leadframe portion 820 and a fourth leadframe portion 821. The device 800 also includes a semiconductor die 830 and a molding compound 840 that, as described herein, may at least partially cover (or can encapsulate in some implementations) the leadframe portions 810, 811, 820, 821 (or portions thereof) and the semiconductor die 830 (or portions thereof).

As with the leadframe portions of the device 700, each of the leadframe portions 810, 811, 820, 821 of the device 800 may have at least one exposed surface that is coplanar with a respective surface of the molding compound 840. For example, the leadframe portion 820 may have a first exposed surface on a side X2 (a top side) of the device 800, a second exposed surface on an edge 802 (e.g., side surface, left side surface) of the device 800 and a third exposed surface on an edge 803 (e.g., side surface, back side surface) of the device 800, such as illustrated in FIG. 8A. As with the leadframe portions of the device 700, the other leadframe portions 810, 811, 821 may likewise have multiple exposed surfaces (not labeled) that are coplanar with respective surfaces (e.g., side surfaces) of the molding compound 840 in the device 800. Additionally, as with the semiconductor die 730 of the device 700, in the device 800, a surface 830A (which is the surface that is shown in FIG. 8A) of the semiconductor die 830 may also be exposed and coplanar with the molding compound 840 (and/or exposed surfaces of one or more of the leadframe portions 810, 811, 820, 821) on the device 800 on side X2.

In this example embodiment, the semiconductor die 830 of the device 800 may have two functionally independent (HV or LV) FET devices, where the surface 730A of the semiconductor die 830 defines a common drain terminal for the two FETs. As noted above, in other embodiment, the semiconductor die may include one or more different semiconductor devices than FET devices.

As shown in FIG. 8B, the semiconductor die 830 of the device 800 may be coupled (electrically and physically) with each of the leadframe portions 810, 811, 820, 821. The semiconductor die 830 can be coupled to the leadframe portions 810, 811, 820, 821 via a side 830B of the semiconductor die 830. The surface 830B of the semiconductor die 830 is facing toward side X1 of the device 800. In this embodiment, the leadframe portion 810 may be coupled with a source terminal of a first FET implemented in the semiconductor die 830 and the leadframe portion 820 may be coupled with a gate terminal of the first FET. Similarly, the leadframe portion 811 may be coupled with a source terminal of a second FET implemented in the semiconductor die 830 and the leadframe portion 821 may be coupled with a gate terminal of the second FET.

The exposed surfaces of the leadframe portions 810, 811, 820, 821 in the device 800 may operate as electrical contacts (terminals, pins, and so forth) to the respective source and gate terminals of the first and second FETs of the semiconductor die 830, which may be used to connect the FET devices implemented in the device 800 with other elements of an electrical circuit (e.g. on a PCB). Likewise, the side X2 (exposed) surface of the semiconductor die 830 may operate as a common electrical contact (common drain) to the drain terminals of both the first FET and the second FET, and can be used to connect the common drain terminal with other elements of an electrical circuit.

In the device 800, the semiconductor die 830 may be affixed to the leadframe portions 810, 811, 820, 821 using one or more pillars 835 (and/or corresponding conductive contacts and/or bumps, such as described herein) on each leadframe portion. While only a single pillar 835 is shown on each of the leadframe portions 810, 811, 820, 821 in FIG. 8B, in other embodiments, each leadframe portion may include multiple pillars (and/or or more corresponding conductive contacts and/or bumps), such as the pillars of the leadframe portions 510, 610 illustrated in FIGS. 5 and 6 and/or the conductive contacts 350 of FIG. 3B.

As illustrated in FIG. 8B, the leadframe portions 810, 820 are mirrored along axis I1 with leadframe portions 820 and 821. Although not shown, in some implementations, the leadframe portions 810, 820, 811, 821 can be configured without being mirror about axis I1. In such implementations, for example, leadframe portion 810 can have a different profile or footprint (when viewed in a plan view as shown in FIG. 8B) from leadframe portion 811. Similarly, in some implementations, for example, leadframe portion 820 can have a different profile or footprint from leadframe portion 821. Although not shown, the leadframe portions 810, 811, 820, 821 can be coupled with other similar leadframe portions in a grouping, such as the groupings described herein in connection with FIGS. 3A through 3E and FIGS. 15A through 16B.

In some implementations, the device 800 can include a leadframe that has a first portion 810, a second portion 820, a third portion 811 and a fourth portion 821. The first portion 810 can have a first segment 810-1 and a second segment 810-2, where the second segment 810-2 includes a first external contact. The second portion 820 can have a first segment 820-1 and a second segment 820-2, where the second segment 820-2 includes a second external contact. The third portion 811 can have a first segment 811-1 and a second segment 811-2, where the second segment 811-2 includes a third external contact. The fourth portion 821 can have a first segment 821-1 and a second segment 821-2, where the second segment 821-2 includes a fourth external contact. The first portion 810, the second portion 811, the third portion 820 and the fourth portion 821 can being physically (and electrically separate from one another).

In some implementations, the device 800 can include a semiconductor die 830 coupled with the first segment 810-1 of the first portion 810, the first segment 820-1 of the second portion 820, the first segment 811-1 of the third portion 811 and the first segment 821-1 of the fourth portion 820. The device 800 can also include a molding compound 840 covering at least part of the leadframe and at least part of the semiconductor die 830.

In some implementations, the semiconductor die 830 can include a first discrete transistor having a first terminal (e.g., a source terminal) coupled with the first segment 810-1 of the first portion 810 and a control terminal (e.g., a gate terminal) coupled with the first segment 820-1 of the second portion 820. The semiconductor die 830 can also include a second discrete transistor having a first terminal (e.g., a source terminal) coupled with the first segment 811-1 of the third portion 811 and a control terminal (e.g., a gate terminal) coupled with the first segment 821-1 of the fourth portion 821. The second discrete transistor can be operationally independent from the first discrete transistor on the semiconductor die 830. A substrate of the semiconductor die 830 can define a common second terminal (e.g., a common drain terminal) of the first discrete transistor and the second discrete transistor.

In some implementations, the first segment 810-1 of the first portion 810 can include a first pillar 835 and the first segment 811-1 of the second portion 811 can include a second pillar 835. The first segment 820-1 of the third portion 820 can include a third pillar 835 and the first segment 821-1 of the fourth portion 821 can include a fourth pillar 835. The semiconductor die 830 can be coupled with the leadframe on top surfaces of the first, second third and fourth pillars 835 using conductive contacts, such as those described herein.

Figure 9A:
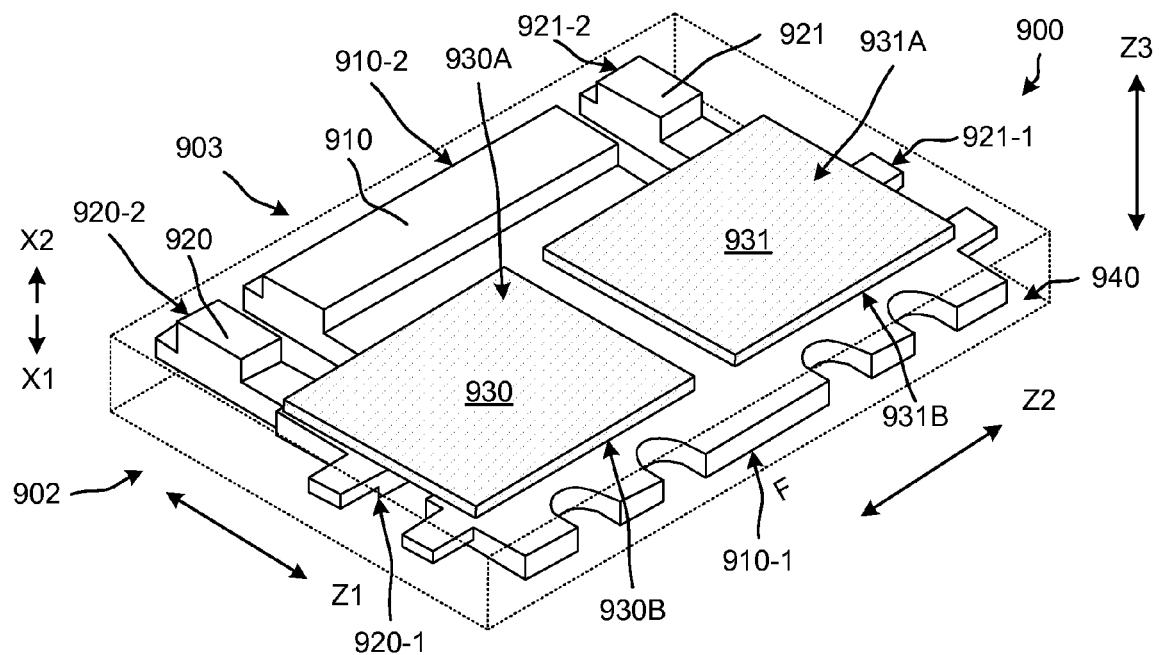
FIGS. 9A and 9B are drawings illustrating another packaged semiconductor device, according to an implementation.
Figure 9B:
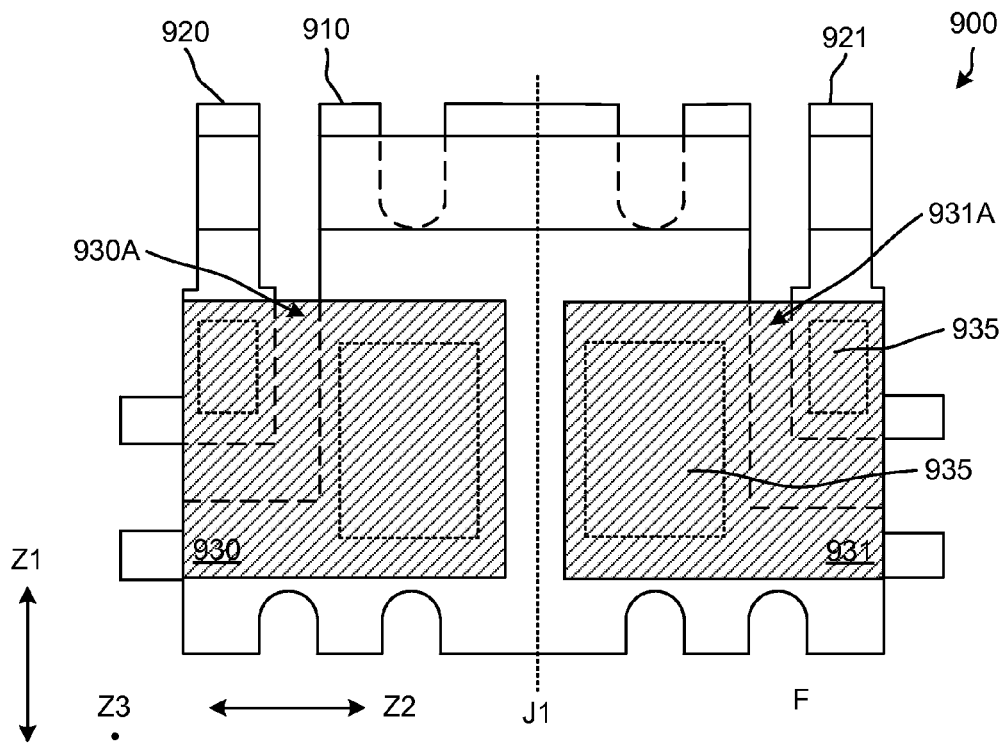

FIGS. 9A and 9B are drawings illustrating a packaged semiconductor device 900, according to an implementation. The relative orientation of the views of the device 900 shown in FIGS. 9A and 9B is shown by the reference character F in each drawing. As compared with the devices 700 and 800, the device 900 shown in FIGS. 9A and 9B (and the device 1000 shown in FIGS. 10A and 10B) may be used to implement multiple discrete semiconductor devices, such as (vertical) FET devices on separate semiconductor dice, with a common source configuration. As shown in FIG. 9A, the device 900 includes a first leadframe portion 910, a second leadframe portion 920 and a third leadframe portion 921. The device 900 also includes a first semiconductor die 930, a second semiconductor die 931 and a molding compound 940 that, as described herein, may at least partially cover (or can encapsulate in some implementations) the leadframe portions 910, 920A, 920B and the semiconductor die 930 and 931 (or portions thereof).

In the example embodiment of FIG. 9A, each of the leadframe portions 910, 920, 921 may have at least one exposed surface that is coplanar with a respective surface of the molding compound 940. For example, the leadframe portion 910 may have a first exposed surface on a side X2 (a top side) of the device 900, a second exposed surface on an edge 902 (e.g., side surface, left side surface) of the device 900 and a third exposed surface on an edge 903 (e.g., side surface, back side surface) of the device 900, such as illustrated in FIG. 9A. The other leadframe portions 920, 921, in the device 900 shown in FIG. 9A, may likewise have multiple exposed surfaces (not labeled) that are coplanar with respective surfaces (e.g., side surfaces) of the molding compound 940 (e.g., on the top side, bottom side and/or edges (or side surfaces) of the device 900). Additionally, in the device 900, a surface 930A on the side X2 (which is the surface that is shown in FIG. 9A) of the semiconductor die 930 and a surface 931A on the side X2 of the semiconductor die 931 may also be exposed and coplanar with the molding compound 940 (and/or exposed surfaces of one or more of the leadframe portions 910, 920, 921) on the surface of the device 900 on side X2. A surface 930B of the semiconductor die 930 and a surface 931B of the semiconductor die 931, which are respectively opposite surfaces 930A and 931A and are facing toward side X1, cannot be seen in FIG. 9A.

In an example embodiment, the semiconductor die 930, 931 of the device 900 may each have a discrete FET device implemented thereon. In other embodiments, the semiconductor die 930, 931 may have other types of semiconductor devices implemented thereon, such as BJTs, IGBTs, diodes, application-specific integrated circuits, among other types of semiconductor devices.

As shown in FIG. 9B, the semiconductor die 930 of the device 900 may be coupled (electrically and physically) with the leadframe portions 910 and 920, while the semiconductor die 931 may be coupled (electrically and physically) with the leadframe portions 910 and 921. In this embodiment, the leadframe portion 910 may function as a common source terminal for the respective (first and second) FETs of the semiconductor dice 930, 931. Further in the device 900, the leadframe portion 920 may be coupled with a gate terminal of the FET included on the semiconductor die 930. Similarly, the leadframe portion 921 may be coupled with a gate terminal of the FET included on the semiconductor die 931.

The exposed surfaces of the leadframe portions 910, 920, 921 in the device 900 may operate as electrical contacts (terminals, pins, and so forth) to the respective source and gate terminals of the first and second FETs of the semiconductor dice 930, 931, where the leadframe portion 910 defines a common source terminal. These terminals (contacts) defined by the leadframe portions 910, 920, 921 may be used to connect the FET devices implemented in the device 900 with other elements of an electrical circuit (e.g. on a PCB). Likewise, the respective side X2 surfaces 930A, 931A of the semiconductor dice 930, 931 may function as respective electrical contacts for the drain terminals of the first FET of semiconductor die 930 and the second FET of the semiconductor die 931. The side X2 surfaces of the semiconductor dice 930, 931 may be used to connect the drain terminals with each other and/or with other elements of an electrical circuit, such as by using signal lines (which may also be referred to as traces or wires) on a PCB.

In the device 900, the semiconductor die 930 may be affixed to the leadframe portions 910 and 920 using one or more pillars 935 (and/or one or more corresponding conductive contacts and/or bumps, such as those described herein) on each leadframe portion. Similarly, the semiconductor die 930 may be affixed to the leadframe portions 910 and 921 using one or more pillars 935 (and/or one or more corresponding conductive contacts and/or bumps) on each leadframe portion. While only a single pillar 935 is shown on each of the leadframe portions 910, 920 for attaching the semiconductor die 930, and a single pillar 935 is shown on each of the leadframe portions 910, 921 for attaching the semiconductor die 931, in other embodiments, each leadframe portion may include multiple pillars (and/or one or more corresponding conductive contacts and/or bumps) for affixing each of the semiconductor dice 930, 931, such as the pillars of the leadframe portions 510, 610 illustrated in FIGS. 5 and 6 and/or the conductive contacts 350 shown in FIG. 3B.

As illustrated in FIG. 9B, the leadframe portion 920 is mirrored along axis J1 with the leadframe portion 921 and leadframe portion 910 is symmetric about axis J1. Although not shown, in some implementations, the leadframe portions 910, 920, 921 can be configured without being mirrored or symmetric about axis J1. In such implementations, for example, leadframe portion 920 can have a different profile or footprint (when viewed in a plan view as shown in FIG. 9B) from leadframe portion 921. Similarly, in some implementations, for example, leadframe portion 910 can have a different profile or footprint than shown in FIG. 9B. Although not shown, the leadframe portions 910, 920, 921 can be coupled with other similar leadframe portions in a grouping, such as the groupings described herein in connection with FIGS. 3A through 3E and FIGS. 15A through 16B.

In some implementations, the device 900 can include a leadframe having a first portion 910, a second portion 920 and a third portion 921. The first portion 910 can include a first segment 910-1 and a second segment 910-2, where the second segment 910-2 includes a first external contact. An external contact can be defined by a surface of a leadframe segment that is exposed through (and coplanar with a surface of the molding compound 940 of the device 900. The second portion 920 can include a first segment 920-1 and a second segment 920-2, where the second segment 920-2 includes a second external contact. The third portion 921 can include a first segment 921-1 and a second segment 921-2, where the second segment 921-2 includes a third external contact. The first portion 910, the second portion 920 and the third portion 921 can be physically (and electrically) separate from one another.

In some implementations, the device 930 can include a first semiconductor die 930 coupled with the first segment 910-1 of the first portion 910 and the first segment 920-1 of the second portion 920. The device 930 can also include a second semiconductor die 931 coupled with the first segment 910-1 of the first portion 910 and the first segment 921-1 of the third portion 921. The device 900 can also include a molding compound 940 at least partially covering the leadframe, the first semiconductor die 930 and the second semiconductor die 931.

In some implementations, the first semiconductor die 930 can include a first discrete transistor having a first terminal (e.g., a source terminal) coupled with the first segment 910-1 of the first portion 910 and a control terminal (e.g., a gate terminal) coupled with the first segment 920-1 of the second portion 920. The second semiconductor die 931 can include a second discrete transistor having a first terminal (e.g., a source terminal) coupled with the first segment 910-1 of the first portion 910 and a control terminal (e.g., a gate terminal) coupled with the first segment 921-1 of the third portion 921. The first segment 910-1 of the first portion 910 can define a common first terminal (e.g., a common source terminal) of the first discrete transistor and the second discrete transistor.

In some implementations, the first segment 910-1 of the first portion can include a first pillar 935 and a second pillar 935. The first segment 920-1 of the second portion 920 can include a third pillar 935 and the first segment 921-1 of the third portion 921 can include a fourth pillar 935. The first semiconductor die 930 can be coupled with the leadframe on top surfaces of the first pillar 935 (of the first portion 910) and the third pillar 935 (of the second portion 920) using conductive contacts, such as those described herein. The second semiconductor die 931 can be coupled with the leadframe on top surfaces of the second pillar 935 (of the first portion 910) and the fourth pillar 935 (of the third portion 921) using conductive contacts, such as those described herein.

Figure 10A:
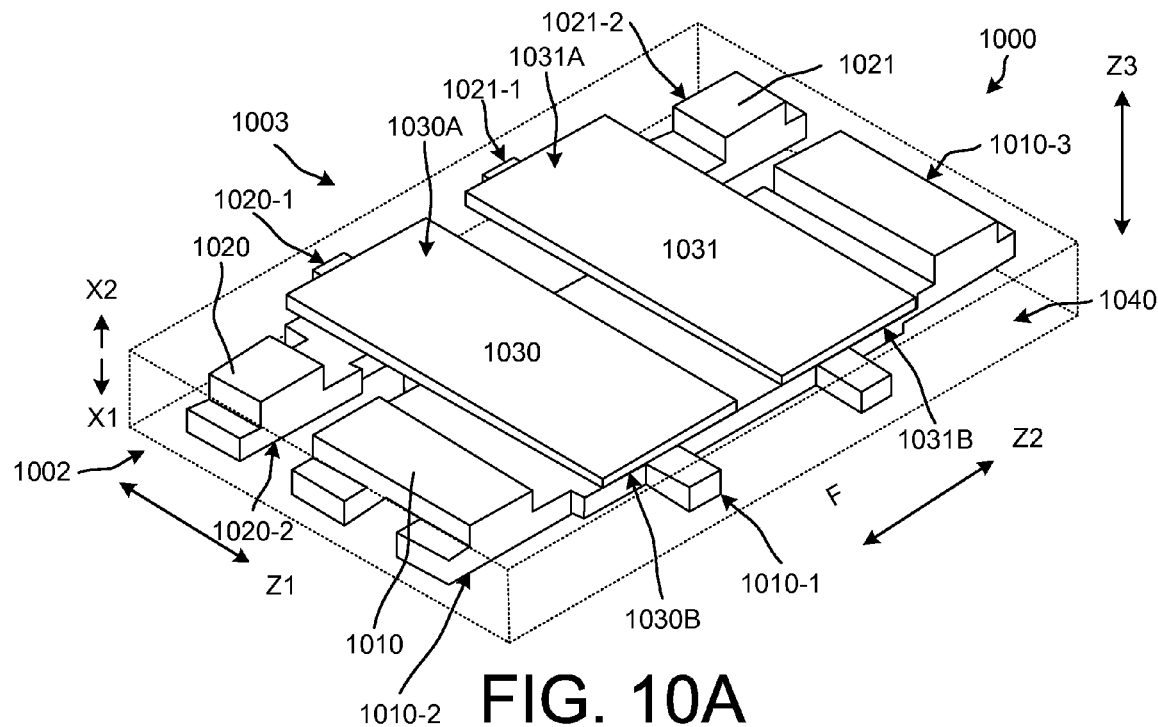
FIGS. 10A and 10B are drawings illustrating yet another packaged semiconductor device, according to an implementation.
Figure 10B:
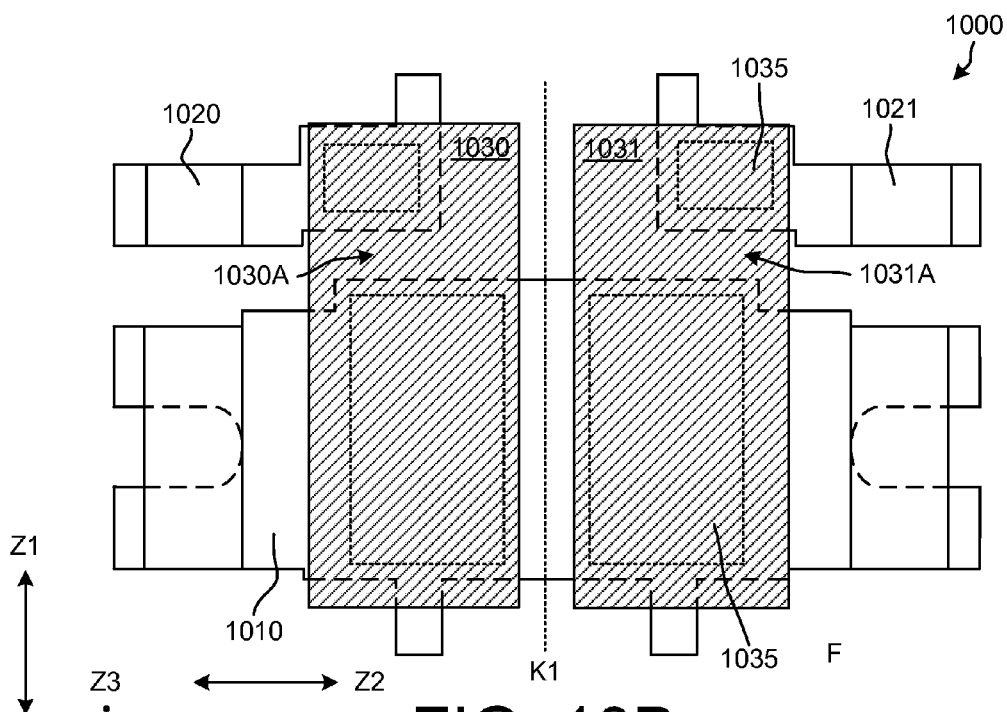

FIGS. 10A and 10B are drawings illustrating a packaged semiconductor device 1000, according to an implementation. The relative orientation of the views of the device 1000 shown in FIGS. 10A and 10B is shown by the reference character F in each drawing. The device 1000 may be used to implement an alternative common source configuration for a packaged semiconductor device (e.g., as compared with the device 900 shown in FIGS. 9A and 9B). As shown in FIG. 10A, the device 1000 includes a first leadframe portion 1010, a second leadframe portion 1020 and a third leadframe portion 1021. The device 1000 also includes a first semiconductor die 1030, a second semiconductor die 1031 and a molding compound 1040 that, as described herein, may at least partially cover (or can encapsulate in some implementations) the leadframe portions 1010, 1020, 1021 and the semiconductor die 1030 and 1031.

As with the device 900, each of the leadframe portions 1010, 1020, 1021 of the device 1000 may have at least one exposed surface that is coplanar with a respective surface of the molding compound 1040. For example, the leadframe portion 1020 may have a first exposed surface on a side X2 (a top side) of the device 1000, a second exposed surface on an edge 1002 (e.g., side surface, left side surface) of the device 1000 and a third exposed surface on an edge 1003 (e.g., side surface, back side surface) of the device 1000, such as illustrated in FIG. 10A. The other leadframe portions 1010, 1021, in the device 1000 shown in FIG. 10A, may likewise have multiple exposed surfaces (not labeled) that are coplanar with respective surfaces (e.g., side surfaces) of the molding compound 1040 (e.g., on the top side, bottom side and/or edges (or side surfaces) of the device 1000). Additionally, in the device 1000, a surface 1030A on the side X2 (which is the surface that is shown in FIG. 10A) of the semiconductor die 1030 and a surface 1031A on the side X2 of the semiconductor die 1031 may also be exposed and coplanar with the molding compound 1040 (and/or exposed surfaces of one or more of the leadframe portions 1010, 1020, 1021) on the surface of the device 1000 on side X2. A surface 1030B of the semiconductor die 1030 and a surface 1031B of the semiconductor die 1031, which are respectively opposite surfaces 1030A and 1031A and are facing toward side X1, cannot be seen in FIG. 10A.

In this example embodiment, similarly with the device 900, the semiconductor die 1030, 1031 of the device 1000 may each have a discrete FET device implemented thereon. In other embodiments, the semiconductor die 1030, 1031 may have other types of semiconductor device implemented thereon, such as BJTs, IGBTs, diodes, application-specific integrated circuits, among other types of semiconductor devices.

As shown in FIG. 10B, the semiconductor die 1030 of the device 1000 may be coupled (electrically and physically) with the leadframe portions 1010 and 1020, while the semiconductor 1031 may be coupled (electrically and physically) with the leadframe portions 1010 and 1021. In this embodiment, the leadframe portion 1010 may be function as a common source terminal for the two FETs of the semiconductor dice 1030, 1031. Further in the device 1000, the leadframe portion 1020 may be coupled with a gate terminal of the FET included on the semiconductor die 1030. Similarly, the leadframe portion 1021 may be coupled with a gate terminal of the FET included on the semiconductor die 1031.

The exposed surfaces of the leadframe portions 1010, 1020, 1021 in the device 1000 may operate as electrical contacts (terminals, pins, and so forth) with the respective source and gate terminals of the first and second FETs of the semiconductor die 1030, 1031, where the leadframe portion 1010 defines a common source terminal. These terminals (contacts) defined by the leadframe portions 1010, 1020, 1021 may be used to connect the FET devices implemented in the device 1000 with other elements of an electrical circuit (e.g. on a PCB). Likewise, the respective side X2 surfaces 1030A, 1031A of the semiconductor dice 1030, 1031 may function as respective electrical contacts for the drain terminals of the first FET of semiconductor die 1030 and the second FET of the semiconductor die 1031. The side X2 surfaces of the semiconductor dice 1030, 1031 may be used to connect the drain terminals with each other and/or with other elements of an electrical circuit, such as by using signal traces on a PCB.

In the device 1000, the semiconductor die 1030 may be affixed to the leadframe portions 1010 and 1020 using one or more pillars 1035 (and/or one or more corresponding conductive contacts and/or bumps, such as those described herein) on each leadframe portion. Similarly, the semiconductor die 1030 may be affixed to the leadframe portions 1010 and 1021 using one or more pillars 1035 (and/or one or more corresponding conductive contacts and/or bumps) on each leadframe portion. While only a single pillar 1035 is shown on each of the leadframe portions 1010 and 1020 for attaching the semiconductor die 1030, and a single pillar 1035 is shown on each of the leadframe portions 1010 and 1021 for attaching the semiconductor die 1031, in other embodiments, each leadframe portion may include multiple pillars (and/or one or more corresponding conductive contacts and/or bumps) for affixing each of the semiconductor die 1030, 1031, such as the pillars of the leadframe portions 510, 610 illustrated in FIGS. 5 and 6 and/or the conductive contacts 350 shown in FIG. 3B.

As illustrated in FIG. 10B, the leadframe portion 1020 is mirrored along axis K1 with the leadframe portion 1021 and leadframe portion 1010 is symmetric about axis K1. Although not shown, in some implementations, the leadframe portions 1010, 1020, 1021 can be configured without being mirrored or symmetric about axis J1. In such implementations, for example, leadframe portion 1020 can have a different profile or footprint (when viewed in a plan view as shown in FIG. 10B) from leadframe portion 1021. Similarly, in some implementations, for example, leadframe portion 1010 can have a different profile or footprint than shown in FIG. 10B. Although not shown, the leadframe portions 1010, 1020, 1021 can be coupled with other similar leadframe portions in a grouping, such as the groupings described herein in connection with FIGS. 3A through 3E and FIGS. 15A through 16B.

In some implementations, the device 1000 can include a leadframe having a first portion 1010, a second portion 1020 and a third portion 1021. The first portion 1010 can include a first segment 1010-1 and a second segment 1010-2, where the second segment 1010-2 includes a first external contact. The second portion 1020 can include a first segment 1020-1 and a second segment 1020-2, where the second segment 1020-2 includes a second external contact. The third portion 1021 can include a first segment 1021-1 and a second segment 1021-2, where the second segment 1021-2 includes a third external contact. The first portion 1010, the second portion 1020 and the third portion 1021 can be physically (and electrically) separate from one another.

In some implementations, the device 1030 can include a first semiconductor die 1030 coupled with the first segment 1010-1 of the first portion 1010 and the first segment 1020-1 of the second portion 1020. The device 1030 can also include a second semiconductor die 1031 coupled with the first segment 1010-1 of the first portion 1010 and the first segment 1021-1 of the third portion 1021. The device 1000 can also include a molding compound 1040 at least partially covering the leadframe, the first semiconductor die 1030 and the second semiconductor die 1031.

In some implementations, the first semiconductor die 1030 can include a first discrete transistor having a first terminal (e.g., a source terminal) coupled with the first segment 1010-1 of the first portion 1010 and a control terminal (e.g., a gate terminal) coupled with the first segment 1020-1 of the second portion 1020. The second semiconductor die 1031 can include a second discrete transistor having a first terminal (e.g., a source terminal) coupled with the first segment 1010-1 of the first portion 1010 and a control terminal (e.g., a gate terminal) coupled with the first segment 1021-1 of the third portion 1021. The first segment 1010-1 of the first portion 1010 can define a common first terminal (e.g., a common source terminal) of the first discrete transistor and the second discrete transistor.

In some implementations, the first segment 1010-1 of the first portion can include a first pillar 1035 and a second pillar 1035. The first segment 1020-1 of the second portion 1020 can include a third pillar 1035 and the first segment 1021-1 of the third portion 1021 can include a fourth pillar 1035. The first semiconductor die 1030 can be coupled with the leadframe on top surfaces of the first pillar 1035 (of the first portion 1010) and the third pillar 1035 (of the second portion 1020) using conductive contacts, such as those described herein. The second semiconductor die 1031 can be coupled with the leadframe on top surfaces of the second pillar 1035 (of the first portion 1010) and the fourth pillar 1035 (of the third portion 1021) using conductive contacts, such as those described herein.

Figure 11:
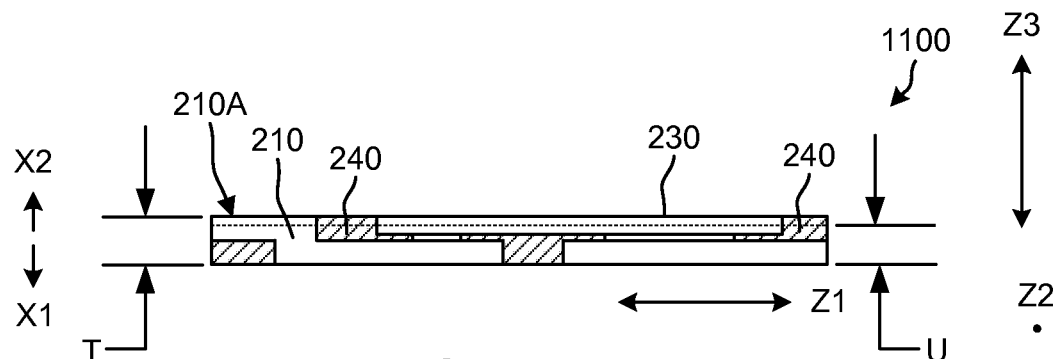
FIG. 11 is a cross-sectional diagram illustrating a process for producing a thinned packaged semiconductor device, according to an implementation.

FIG. 11 is a cross-sectional diagram illustrating a process for producing a thinned packaged semiconductor device 1100, according to an implementation. The device 1100 shown in FIG. 11 corresponds with the cross-sectional diagram of the device 200 shown in FIG. 2C. Accordingly, like reference numbers with FIG. 2C are used in FIG. 11 to reference the elements of the device 1100.

In an example embodiment, the packaged semiconductor device 1100, after completing a molding process (e.g., flowing/injecting molding compound and curing the molding compound), may be thinned from a thickness T to a thickness U corresponding with the dotted line in FIG. 11 and indicated by the dimension lines. Such thinning may be performed in a number of ways including, for example, a chemical process and/or a mechanical process. For example, the device 1100 may be thinned by grinding a side X2 surface of the device 1100 to thin the leadframe portion 210, the molding compound 240 and the semiconductor die 230 until a desired thickness is achieved. In one embodiment, the device 1100 may be thinned so the semiconductor 230 die has a thickness of approximately 10 µm. Such thinning may improve performance of a semiconductor device that is implemented in the semiconductor die 230. For instance, in an embodiment where a FET device is implemented in the semiconductor die 230, depending on the voltage rating of the FET device, a reduction in an on-resistance (Rdson) of the FET of approximately 30% may be achieved (e.g., as compared with a FET device implemented in a semiconductor die having a thickness of 50 µm). In some embodiment, a semiconductor die may be thinned by 40-60% of its original thickness. Such an approach may also improve a figure of merit of the FET device, as the thinning process would not substantially change (affect) other performance parameters of the FET device (e.g., other than Rdson).

Figure 12A:
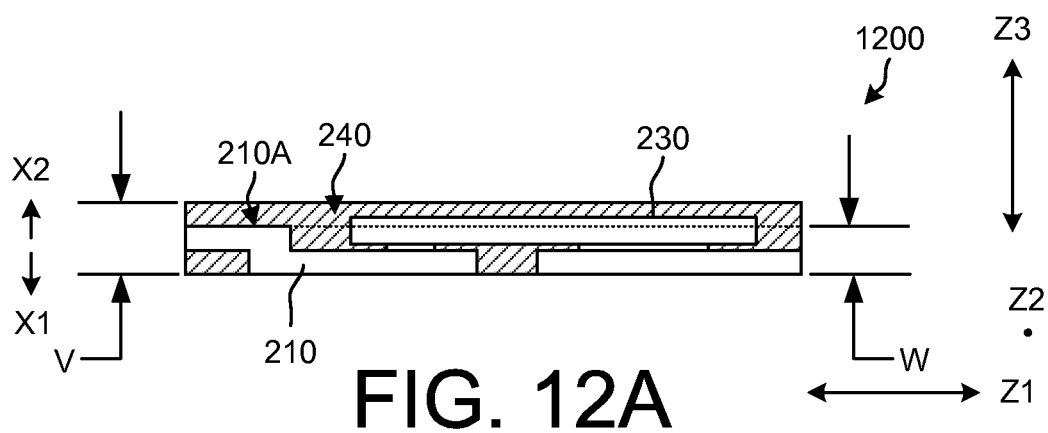
FIGS. 12A and 12B are cross-sectional diagrams illustrating a process for thinning a packaged semiconductor device, according to an implementation.
Figure 12B:
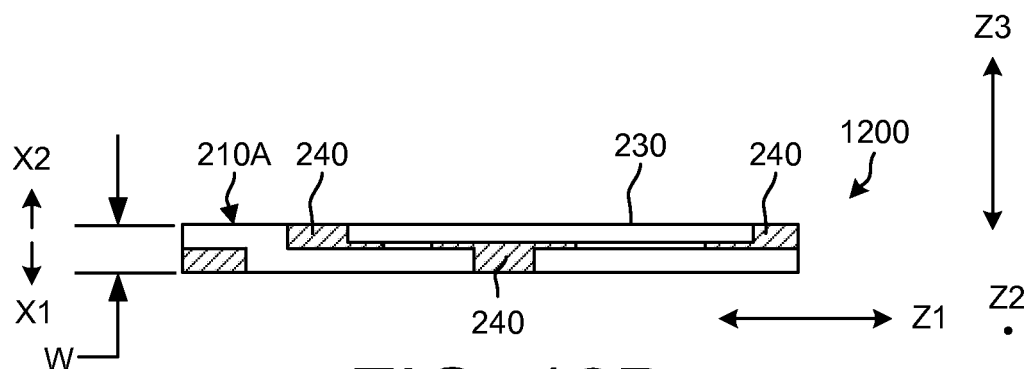

FIGS. 12A and 12B are cross-sectional diagrams illustrating a process for thinning a packaged semiconductor device 1200 from a thickness V to a thickness W (indicated by dimension lines in FIGS. 12A, 12B), according to an implementation. The device 1200 shown in FIGS. 12A, 12B has a similar arrangement as the cross-sectional diagram of the device 200 shown in FIG. 2C. Accordingly, like reference numbers with FIG. 2C are used in FIGS. 12A and 12B to reference the elements of the device 1200.

In contrast with the device 200 of FIG. 2C, as may be seen in FIG. 12A, before thinning the device 1200, a side X2 surface of the semiconductor die 230 of the device 1200 defines a plane that is above a surface 210A of the leadframe portion 210, as illustrated by the dotted line in FIG. 12A. Also in contrast with the device 200 of FIG. 2C, before thinning from the thickness V, the device 1200, as illustrated in FIG. 12, includes molding compound 240 disposed over a side X2 surface (e.g., a top surface) of the device 1200 (e.g., the molding compound 240 is disposed over the surface 210A of the leadframe portion 210 and disposed over a side X2 facing surface of the semiconductor die 230).

In an example embodiment, the packaged semiconductor device 1200, after completing the molding process (e.g., flowing/injecting molding compound and curing the molding compound), may be thinned (from the thickness V), as shown in FIG. 12B, by removing molding compound from the upper surface of the device 1200 to expose (and thin) the leadframe portion 210, and to expose (and thin) the semiconductor die 230. Such thinning may be accomplished in a number of ways, such as those described above with respect to FIG. 11. As illustrated in FIG. 12B, thinning the device 12B to the thickness W (which is coincident with the dotted line in FIG. 12A) may also result in the surface 210A of the thinned leadframe portion 210 and the side X2 facing surface of the thinned semiconductor die 230 being coplanar (substantially coplanar).

In this example, the device 1200 may be thinned until a desired thickness (the thickness W) is achieved, such as those thicknesses discussed herein. As discussed with respect to the device 1100, the device 1200 may be thinned, as shown in FIG. 12B, so the semiconductor 230 die has a thickness of approximately 10 µm. Such thinning may improve performance of a semiconductor device that is implemented in the semiconductor die 230, such as by reducing Rdson and increasing a figure of merit of a FET device implemented in the semiconductor die 230.

Figure 13:
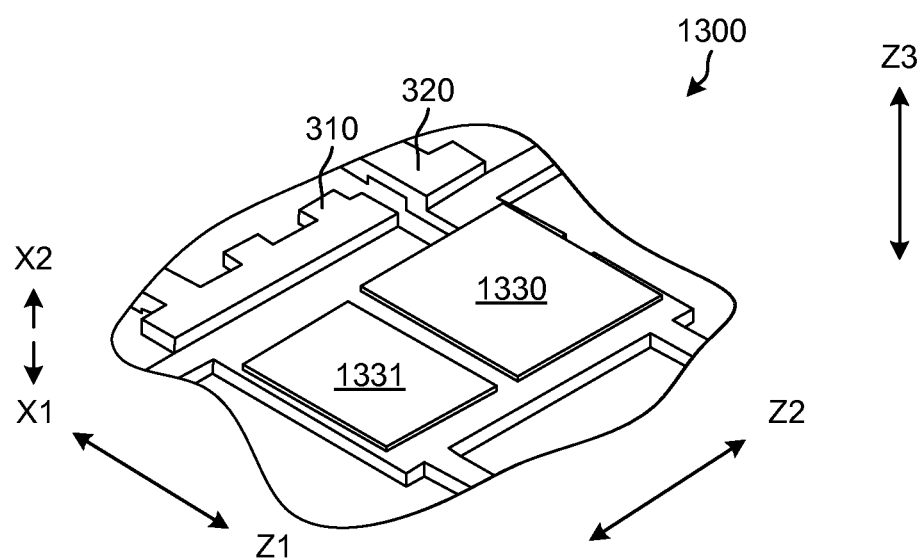
FIG. 13 is a diagram illustrating a packaged semiconductor device that includes multiple semiconductor dice, according to an implementation.

FIG. 13 is a diagram illustrating a packaged semiconductor device 1300, according to an implementation. As shown in FIG. 13, the device 1300 includes a first leadframe portion 310 and a second leadframe portion 320, such as illustrated in FIGS. 3A through 3E and discussed above. The device 1300 also includes a first semiconductor die 1330 and a second semiconductor die 1331. In this embodiment, the semiconductor die 1330 may have a discrete transistor (e.g., a FET, a BJT, an IGBT, a superjunction FET, a SiC BJT, or other transistor) implemented therein, and the second semiconductor die 1331 may have a diode (other discrete semiconductor device) implemented therein. In other embodiments, other types of semiconductor device than those discussed herein may be implemented in the semiconductor dice 1330, 1331.

As shown in FIG. 13, the semiconductor die 1330 may be coupled with the first leadframe portion 310 and the second leadframe portion 320. For instance, the leadframe portion 310 may define an electrical contact to a source terminal of a FET implemented in the semiconductor die 1330, while the leadframe portion 320 may define an electrical contact to a gate terminal of the FET. Further in the device 1300, the semiconductor die 1331 is coupled (electrically and physically) with the leadframe portion 310.

Also in this embodiment, the leadframe portion 310 may define a contact with an anode of the diode implemented in the semiconductor die 1330. Accordingly, in the device 1300, the leadframe portion 310 may define a common electrical connection (contact, terminal and so forth) to the source terminal of the FET of the semiconductor die 1330 and to the anode of the diode of the semiconductor die 1331. In other words, in the device 1300 the source of the FET and the anode of the diode may be electrically shorted together by the leadframe portion 310. The device 1300 may be molded using the techniques described herein to produce a package semiconductor device that includes the leadframe portions 310, 320 and the semiconductor die 1330, 1331.

In the device 1300, a side X2 surface of the semiconductor die 1330 may define a drain contact for the FET implemented therein, while a side X2 surface of the semiconductor die 1331 may define a cathode contact for the diode implemented therein. The X2 side surfaces of the semiconductor die 1330, 1331 may be used to couple those terminals with other elements of an electrical circuit, such as when implementing the device 1300 on a PCB.

Figure 14A:
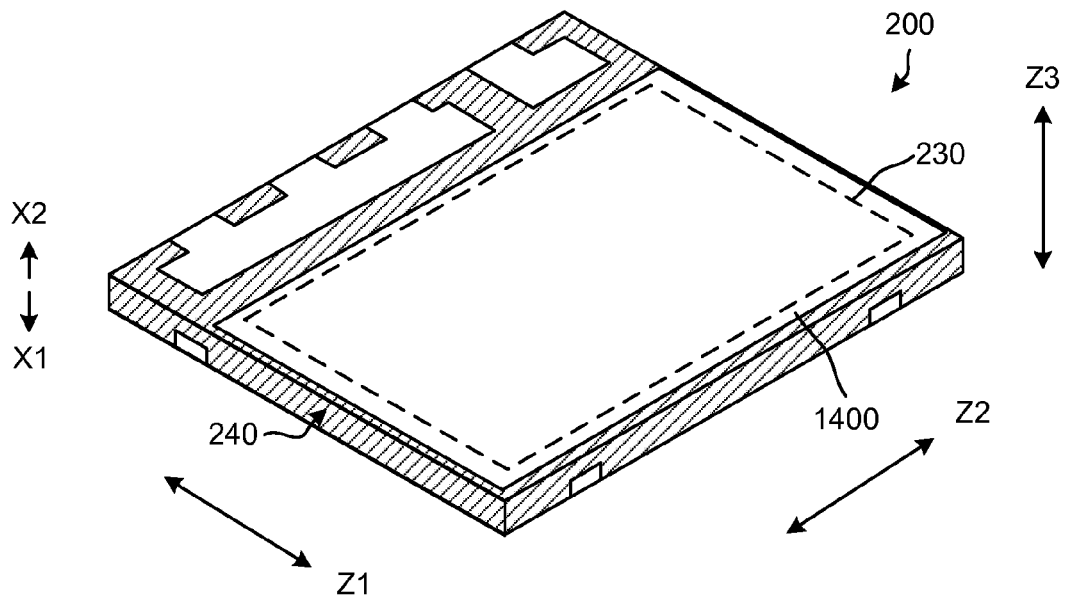
FIGS. 14A and 14B are diagrams illustrating plating methods for packaged semiconductor devices, according to two implementations.
Figure 14B:
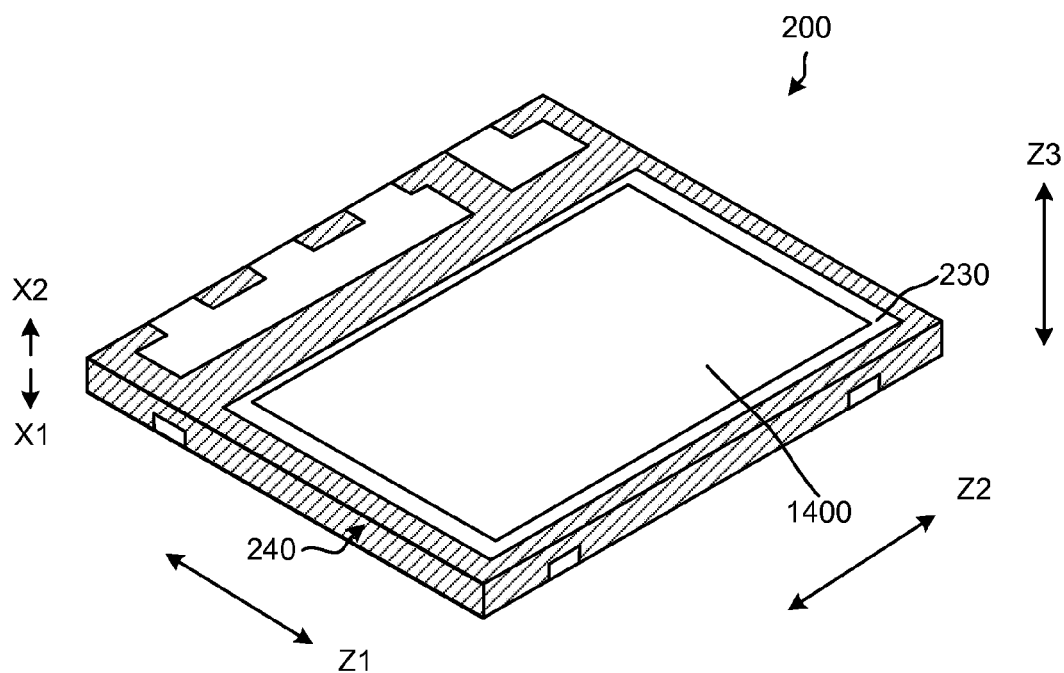

FIGS. 14A and 14B are diagrams illustrating plating methods for packaged semiconductor devices, according to two implementations. In FIGS. 14A, 14B, the device 200 is illustrated in a same orientation as shown in FIG. 2B. In FIG. 14A, a first plating approach is illustrated. The device 200 in FIG. 14A may be plated (on a side X2 surface) with a layer of low resistivity material 1400 (such as gold, or other appropriate material). As shown in FIG. 14A, the layer of low resistivity material 1400 may cover the side X2 surface of the semiconductor die 230 and also extend beyond the perimeter of the semiconductor die 230 and onto the molding compound 240 on the X2 side of the device 200. In other words, the low resistivity material layer 1400 may have a width and length that are, respectively, greater than a width and length of the side X2 surface of the semiconductor die 230 and may cover the side X2 surface of the semiconductor die 230 and a portion of the molding compound 240 on the side X2 surface of the device 200.

In other embodiments, the semiconductor die 230 in the device 200 shown in FIG. 14A may have a smaller area than shown in FIG. 14A, while in still other embodiments, multiple semiconductor dice may be disposed under the low resistivity material layer 1400. The low resistivity material layer 1400 may be used when forming electrical contacts with other elements of an electrical circuit in which the device 200 is implemented.

Such embodiments may be advantageous, as the arrangement of electrical contacts of such packaged semiconductor devices may be the same for semiconductor die of different sizes and/or for different combinations of multiple semiconductor dice, which may reduce the need for PCB layout changes (e.g., for different generations, or types of devices) and/or simplify PCB design (e.g., as a standard electrical contact arrangement may be used).

FIG. 14B illustrates a second plating approach for the device 200. As shown in FIG. 14B, the semiconductor die 230 of the device 200 may be plated (electroplated, sputtered, and so forth) with a layer of low resistivity material 1400 (such as gold, or other appropriate material), which may be done as part of a semiconductor wafer manufacturing process.

As shown in FIG. 14B, the layer of low resistivity material 1400 may cover only a portion of the side X2 surface of the semiconductor die 230 and may not extend beyond the perimeter of the semiconductor die 230. In other words, the low resistivity material layer 1400 in FIG. 14B may have a width and length that are, respectively, less than a width and length of the side X2 surface of the semiconductor die 230. The plating approaches illustrated in FIGS. 14A, 14B may be applied to other package semiconductor devices and/or other plating methods may be used to form the low resistivity material layer 1400.

Figure 15A:
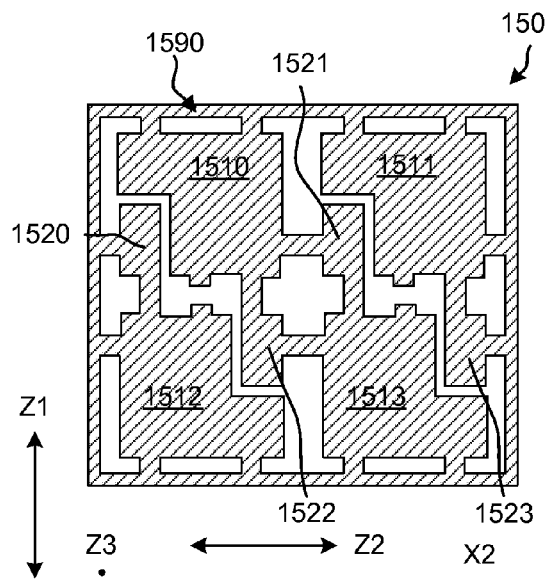
FIGS. 15A and 15B are schematic diagrams illustrating bridged semiconductor devices, according to an implementation.
Figure 15B:
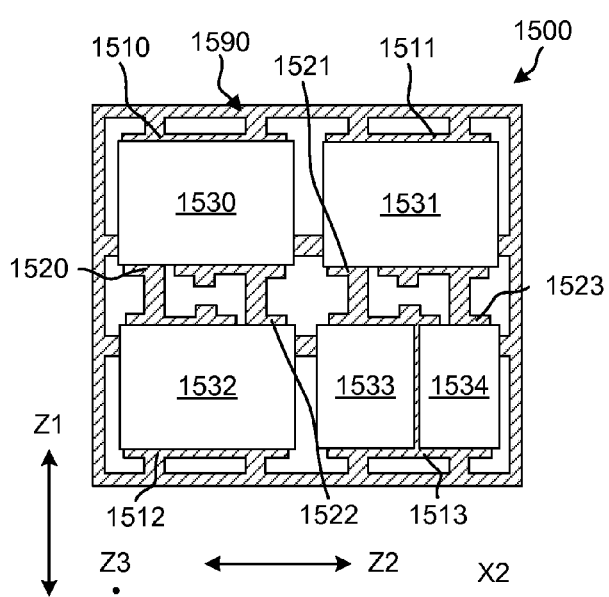

FIGS. 15A and 15B are schematic diagrams illustrating a group of bridged semiconductor devices 1500 (which may also be referred to as a group or grouping), according to an implementation. As shown in FIG. 15A, the group 1500 includes four leadframes. In the group 1500, a first leadframe includes a first leadframe portion 1510 and a second leadframe portion 1520; a second leadframe includes a first leadframe portion 1511 and a second leadframe portion 1521; a third leadframe includes a first leadframe portion 1512 and a second leadframe portion 1522; and a fourth leadframe includes a first leadframe portion 1513 and a second leadframe portion 1523.

The grouping 1500 also includes a frame 1590 (which may be referred to as an outer frame or structural support frame) that is disposed around the four leadframes of the group 1500. The frame 1590 may be removed from the group 1500 during a singulation (e.g., saw) process. Depending on the implementation, the singulation process may also be used to separate the leadframes of the group 1500 (and their semiconductor devices) into single packaged semiconductor devices or half-bridge devices, such as discussed above. Additionally, the singulation process may be used to sever unwanted tie bar connections (such as tie bars 305 discussed above in connection with FIGS. 3A, 3B) between bridged devices of the group 1500. For purposes of clarity, the tie bars are not labeled in FIGS. 15A through 16B.

Figure 16A:
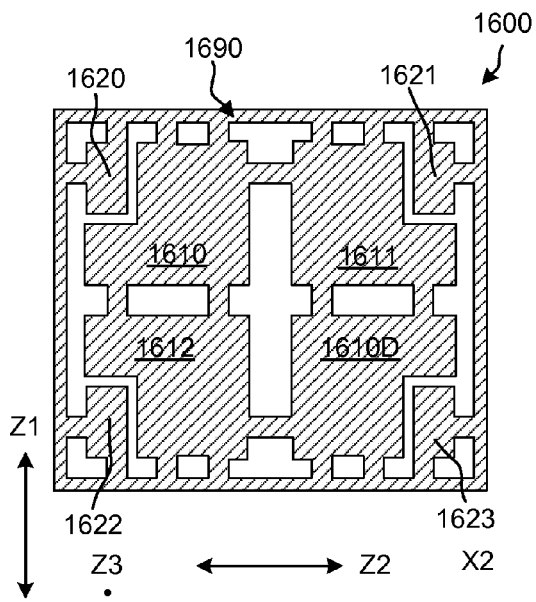
FIGS. 16A and 16B are schematic diagrams illustrating additional bridged semiconductor devices, according to an implementation.
Figure 16B:
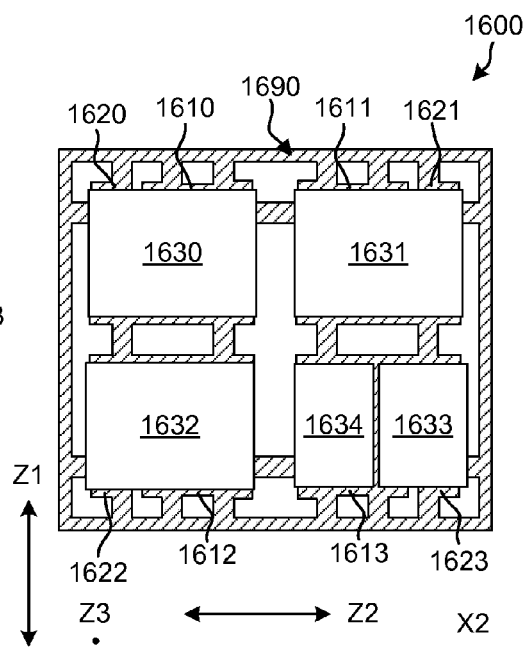

As may be seen in FIG. 15A as compared with FIG. 3A, the leadframes of the group 1500 are similar to the leadframes shown in FIG. 3A, with the top two leadframes being rotated 180 degrees as compared with the leadframes of FIG. 3A. In other embodiments, such as illustrated in FIGS. 16A and 16B, other arrangements of the leadframes of a group may be used. In still other embodiments, the leadframes of a group may be different sizes and may each include different leadframe portions. For example, the group 1500 could include leadframes having a single configuration, or could contain leadframes having two, three or four different configurations. In certain embodiments, the group 1500 may include additional leadframes or fewer leadframes.

As shown in FIG. 15B, a first semiconductor die 1530 may be coupled (electrically and physically) with the leadframe portion 1510 and the leadframe portion 1520. The semiconductor die 1530 (along with the other semiconductor die illustrated in FIG. 15 B) may include a discrete transistor or other semiconductor device, such as described herein. Likewise, a second semiconductor die 1531 may be coupled with the leadframe portion 1511 and the leadframe portion 1521 and a third semiconductor die 1532 may be coupled with the leadframe portion 1512 and the leadframe portion 1522. Further, as illustrated in FIG. 15 B, a fourth semiconductor die 1533 may be coupled with the leadframe portion 1513 and the leadframe portion 1523 and a fifth semiconductor die 1530E may also be coupled with the leadframe portion 1513 (similar to the device 1300 illustrated in FIG. 13 and discussed above).

After attaching the semiconductor dice 1530, 1531, 1532, 1533, 1534, the group 1500 may be molded (using the approaches described herein), after which the frame (outer frame) 1590 may be removed and any desired singulation of the semiconductor devices of the group 1500 may be performed.

FIGS. 16A and 16B are schematic diagrams illustrating a group of bridged semiconductor devices 1600 (which may also be referred to as a group or grouping), according to an implementation. As with the group 1500 shown in FIG. 15A, the group 1600 of FIG. 16A includes four leadframes. In the group 1600, a first leadframe includes a first leadframe portion 1610 and a second leadframe portion 1620; a second leadframe includes a first leadframe portion 1611 and a second leadframe portion 1621; a third leadframe includes a first leadframe portion 1612 and a second leadframe portion 1622; and a fourth leadframe includes a first leadframe portion 1613 and a second leadframe portion 1623. The grouping 1600 also includes a frame (outer frame or structural support frame) 1690 that is disposed around the four leadframes of the group 1600. As with the frame 1500, the frame 1690 may be removed from the group 1600 during a singulation (e.g., saw) process. Depending on the implementation, the singulation process may also be used to separate the leadframes of the group 1600 (and their semiconductor devices) into single packaged semiconductor devices or half-bridge devices, such as discussed above. Additionally, the singulation process may be used to sever unwanted tie bar connections (not labeled) between bridged devices of the group 1600.

As may be seen in FIG. 16A, the leadframes of the group 1600 are arranged such that the two leadframes on the right of the group 1600 are mirror images of the two leadframes on the left of the group 1600. Further, the two leadframes on the top of the group 1600 are mirror images of the two leadframes on the bottom of the group 1600. In other embodiments, other arrangements of the leadframes are possible. In still other embodiments, the leadframes of a group may be different sizes and may each include different leadframe portions (and numbers of leadframe portions). For example, the group 1600, as with the group 1500, could include leadframes having a single configuration, or could contain leadframes having two, three or four different configurations. In certain embodiments, the group 1600 may include additional leadframes or fewer leadframes.

As shown in FIG. 16B, a first semiconductor die 1630 may be coupled (electrically and physically) with the leadframe portion 1610 and the leadframe portion 1620. The semiconductor die 1630 (along with the other semiconductor die illustrated in FIG. 16B) may include a discrete transistor or other semiconductor device, such as those described herein. Likewise, a second semiconductor die 1631 may be coupled with the leadframe portion 1611 and the leadframe portion 1621 and a third semiconductor die 1632 may be coupled with the leadframe portion 1612 and the leadframe portion 1622. Further, as illustrated in FIG. 16B, a fourth semiconductor die 1633 may be coupled with the leadframe portion 1613 and the leadframe portion 1623, and a fifth semiconductor die 1634 may also be coupled with the leadframe portion 1613 (similar to the device 1300 illustrated in FIG. 13 and discussed above).

After attaching the semiconductor die 1630, 1631, 1632, 1633, 1634, the group 1600 may be molded (using the approaches described herein), after which the frame (outer frame) 1690 may be removed and any desired singulation of the semiconductor devices of the group 1600 may be performed.

Figure 17:
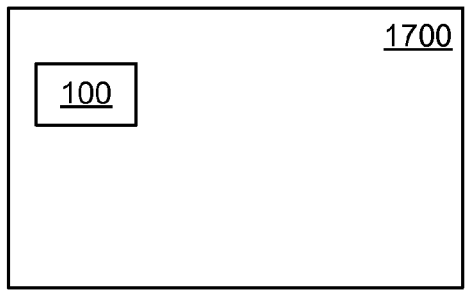
FIG. 17 is a diagram that illustrates the device shown in FIG. 1 included in a computing device.

Implementations of the various devices (e.g., device 100, device 200, device 300, device 500, device 600, device 700, device 800, device 900, device 1000, device 1100, device 1200, device 1300, device 1500, device 1600, and/or so forth) (e.g., packages) described herein can be included in a variety of devices or systems. FIG. 17 is a diagram that illustrates the device 100 shown in, for example, FIGS. 1A through 1E included in an electronic device 1700. The electronic device 1700 can be, or can include, for example, a laptop-type device with a traditional laptop-type form factor. In some implementations, the electronic device 1700 can be, or can include, for example, a wired device and/or a wireless device (e.g., Wi-Fi enabled device), a computing entity (e.g., a personal computing device), a server device (e.g., a web server), a mobile or cellular phone, an audio device, a motor control device, a power supply (e.g., an off-line power supply), a personal digital assistant (PDA), a tablet device, e-reader, a television, an automobile, and/or so forth. In some implementations, the electronic device 1700 can be, or can include, for example, a display device (e.g., a liquid crystal display (LCD) monitor, for displaying information to the user), a keyboard, a pointing device (e.g., a mouse, a trackpad, by which the user can provide input to the computer).

In some implementations, the electronic device 1700 can be, or can include, for example, a back-end component, a data server, a middleware component, an application server, a front-end component, a client computer having a graphical user interface or a Web browser through which a user can interact with an implementation, or any combination of such back-end, middleware, or front-end components. The device 100 (and/or the electronic device 1700) described herein may be interconnected by any form or medium of digital data communication, e.g., a communication network. Examples of communication networks include a local area network (LAN) and a wide area network (WAN), e.g., the Internet.

It may also be understood that when an element is referred to as being on another element or substrate, it can be directly on the other element or substrate, or intervening elements may also be present. It will also be understood that when an element, such as a layer, a region, or a substrate, is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element, there are no intervening elements present. Although the terms directly on, directly connected to, or directly coupled to may not be used throughout the detailed description, elements that are shown in the figures as being directly on, directly connected or directly coupled can be referred to as such. The claims of the application may be amended to recite exemplary relationships described in the specification or shown in the figures.

Figure 18:
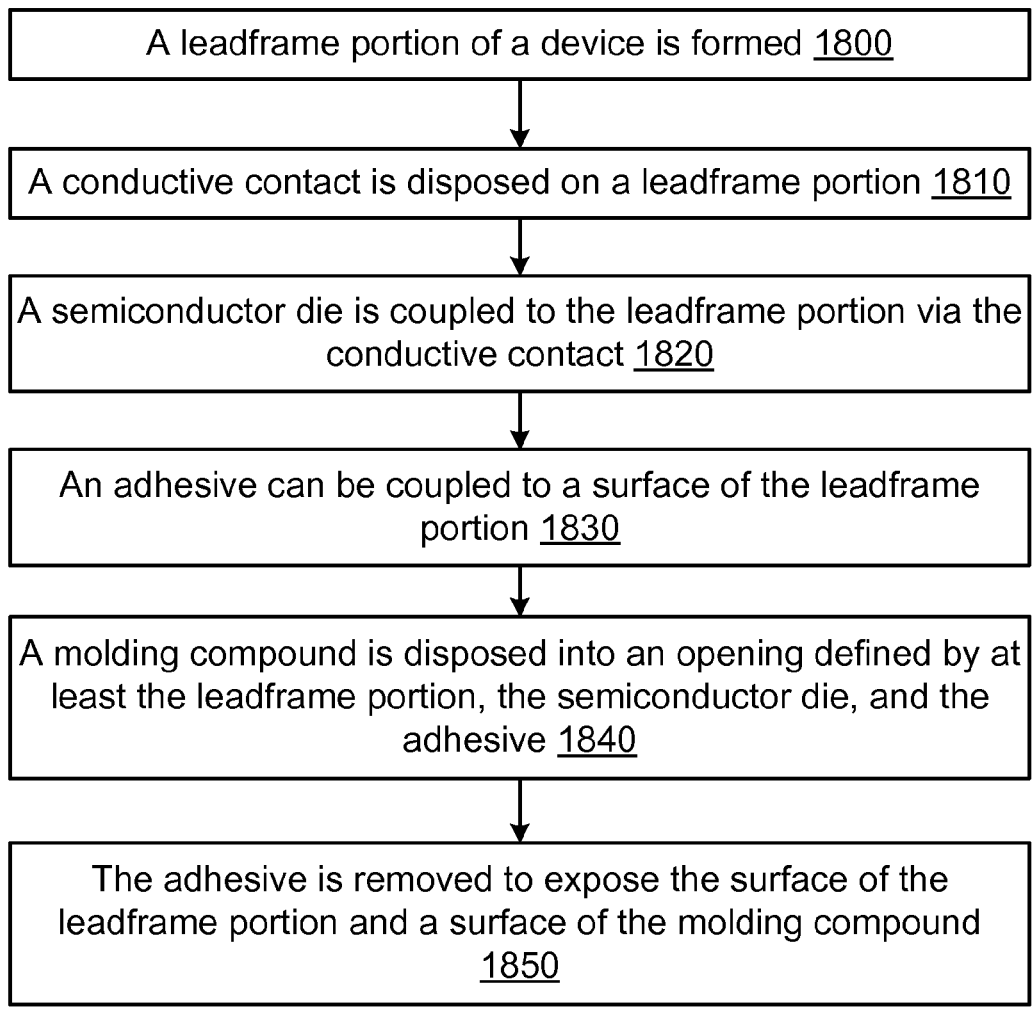
FIG. 18 is a diagram illustrating a flowchart for producing a packaged semiconductor device, according to an implementation.

FIG. 18 is a diagram illustrating a flowchart for producing a packaged semiconductor device, according to an implementation. The process illustrated by FIG. 18 can be used to produce any of the packaged semiconductor devices (e.g., packaged semiconductor device 300 shown in FIGS. 3A through 3E) described above.

As shown in FIG. 18, a leadframe portion of a device is formed (block 1800). The leadframe portion can be included in a leadframe, which can be included in a grouping of leadframes that can be similar to any of the leadframe groupings described above (e.g., group 300 shown in FIG. 3A). In some implementations, the portion of the leadframe can be formed using, for example, an etch process, stamp process, a masking process, and/or so forth. In some implementations, a frame can be disposed around, or coupled to, at least a portion of the leadframe portion. In some implementations, one or more pillars can be formed on one or more surfaces of the leadframe portion. In some implementations, the leadframe portion can include more than one leadframe portions.

After forming the leadframe portion, a conductive contact is disposed on a leadframe portion (block 1810). The conductive contact (e.g., solder, conductive epoxy) can be disposed in alignment with a bond pad on a semiconductor die or semiconductor dice to be attached to the leadframe portion of the leadframe. In some implementations, the conductive contact can be disposed on a pillar defined by at least a portion of the leadframe portion. In some implementations, the conductive contact can be further processed (e.g., reflowed) after being disposed on the leadframe portion included in the leadframe.

A semiconductor die is coupled to the leadframe portion via the conductive contact (block 1820). In some implementations, a terminal of the semiconductor die can be coupled to the leadframe portion. In some implementations, the semiconductor die can include one or more different types of semiconductor devices.

As shown in FIG. 18, an adhesive is coupled to a surface of the leadframe portion (block 1830). In such implementations, the adhesive, which can be, for example, a tape, can also be coupled to a surface of the semiconductor die. In some implementations, the adhesive can be coupled to the surface of the semiconductor die and/or to the surface of the leadframe portion to prevent a molding compound from covering the surface of the semiconductor die and/or the surface of the leadframe portion.

A molding compound is disposed (e.g., injected, flowed) into an opening defined by at least the leadframe portion, the semiconductor die, and the adhesive (block 1840). In some implementations, after the molding compound is disposed, the molding compound may be cured, such as by using thermal processing (e.g. baking) or other processing operations (e.g., chemical processing).

After the molding compound has been disposed, the adhesive is removed to expose the surface of the leadframe portion and a surface of the molding compound (block 1850). If the leadframe portion is coupled via, for example, a tie bar to another leadframe portion associated with another device, the tie bar (and portions of the molding compound that may be around the tie bar) can be cut.

Although not shown in FIG. 18, in some implementations, after completing a molding process, the device can optionally be thinned (to decrease a thickness). Such thinning may be performed in a number of ways including, for example, a chemical process and/or a mechanical process. As a specific example, thinning can be performed by grinding a top surface of the device to thin (e.g., decrease a thickness of) the leadframe portion, the molding compound, and the semiconductor die until a desired thickness is achieved. An example of such a thinning process is described and shown in connection with, for example, FIG. 11.

In some implementations, the molding process can be performed (without an adhesive) so that the semiconductor die is completely encapsulated within the molding compound. The molding compound can then be thinned using a variety of methods including, for example, a chemical process and/or a mechanical process. In some implementations, the molding can be thinned until the surface of the leadframe portion and/or the surface of the semiconductor die is exposed. An example of such a thinning process is described and shown in connection with, for example, FIGS. 12A and 12B.

FIG. 19 is a flowchart that illustrates a method for producing a leadframe portion of a device, according to an implementation. A leadframe portion including a first segment and a second segment including a pillar is formed (block 1900). The pillar can be formed using an etch process (e.g., an etch process including a blocking mask, a selective etching process) that is used to form at least a portion of the leadframe portion. A recess (which can also be referred to as an opening or as a trench) can be between the pillar and another pillar.

The pillar of the second segment of the leadframe portion is modified (block 1910). In some implementations, a height of the pillar can be reduced using, for example, an etch process (e.g., an etch process including a blocking mask, a selective etching process).

After the pillar has been modified, a semiconductor die is coupled to (e.g., physically coupled to and electrically coupled to) the pillar using a conductive contact (1920). Due to the pillar being modified, a surface of the first segment of the leadframe portion can be coplanar (substantially coplanar) with a surface of the semiconductor die disposed on the pillar of the second segment. This can result in the surface of the semiconductor die and the first segment of the leadframe portion to be exposed through, and be coplanar with, a molding compound after the assembly is molded.

FIG. 20 is a flowchart that illustrates another method for producing a leadframe portion of a device, according to an implementation. A leadframe portion including a first segment and a second segment including a pillar is formed (block 2000). The pillar can be formed using an etch process (e.g., an etch process including a blocking mask, a selective etching process) that is used to form at least a portion of the leadframe portion. A recess (which can also be referred to as an opening or as a trench) can be between the pillar and another pillar.

A portion of the leadframe is bent (2010). The portion of the leadframe can be bent using, for example, a metal deformation process (which may also be referred to as a push-down process, a stamping process, and so forth). In some implementations, a portion of the second segment can be bent. In some implementations, a portion of the first segment can be bent. After the bending is performed, the first segment (or the second segment) of the leadframe portion can have stair shape including at least one step.

Accordingly, a height of a surface of the pillar of the second segment of the leadframe portion with respect to a surface of the first segment of the leadframe portion can be modified. In other words, a first plane along which the first segment is aligned can be moved away from (e.g., increased in distance relative to) a second plane along which the second segment is aligned when the portion of the lead frame is bent.

A semiconductor die is coupled to (e.g., physically coupled to and electrically coupled to) the pillar using a conductive contact (2020). Due to the lower height of the pillar relative to the first segment, a surface of the first segment of the leadframe portion can be coplanar (substantially coplanar) with a surface of the semiconductor die disposed on the pillar of the second segment. This can result in the surface of the semiconductor die and the first segment of the leadframe portion to be exposed through, and be coplanar with, a molding compound after the assembly is molded.

In a general aspect, a packaged semiconductor device can include a leadframe including a first portion having a first segment and a second segment, the second segment of the first portion including a first external contact; a second portion having a first segment and a second segment, the second segment of the second portion including a second external contact; a third portion having a first segment and a second segment, the second segment of the third portion including a third external contact; and a fourth portion having a first segment and a second segment, the second segment of the fourth portion including a fourth external contact. The first portion, the second portion, the third portion and the fourth portion can be physically separate from one another. The packaged semiconductor device can also include a semiconductor die coupled with the first segment of the first portion, the first segment of the second portion, the first segment of the third portion and the first segment of the fourth portion, and a molding compound covering at least part of the leadframe and at least part of the semiconductor die.

Implementations can include one or more of the following features. For instance, the semiconductor die can include a first discrete transistor having a first terminal coupled with the first segment of the first portion and a control terminal coupled with the first segment of the second portion and a second discrete transistor having a first terminal coupled with the first segment of the third portion and a control terminal coupled with the first segment of the fourth portion. The second discrete transistor can be operationally independent from the first discrete transistor on the semiconductor die. A substrate of the semiconductor die can define a common second terminal of the first discrete transistor and the second discrete transistor.

The first external contact, the second external contact, the third external contact and the fourth external contact can be exposed through the molding compound. At least a part of the first external contact can include a severed leadframe tie bar. A surface of the first segment of the first portion can be exposed through the molding compound. A surface of the first segment of the second portion can be exposed through the molding compound. A surface of the first segment of the third portion can be exposed through the molding compound. A surface of the first segment of the fourth portion can be exposed through the molding compound. A surface of the semiconductor die can be exposed through the molding compound. The surface of the semiconductor die can define a common drain terminal of a first discrete field effect transistor (FET) device and a second discrete FET device included on the semiconductor die.

The first segment of the first portion can include a first pillar. The first segment of the second portion can include a second pillar. The first segment of the third portion can include a third pillar. The first segment of the fourth portion can include a fourth pillar. The semiconductor die can be coupled with the leadframe on top surfaces of the first pillar, the second pillar, the third pillar and the fourth pillar using conductive contacts.

The packaged semiconductor device can further include a conductive material layer disposed on an exposed surface of the semiconductor die, the conductive material layer extending onto the molding compound.

In a general aspect, a packaged semiconductor device can include a leadframe including a first portion having a first segment and a second segment, the second segment of the first portion including a first external contact; a second portion having a first segment and a second segment, the second segment of the second portion including a second external contact; and a third portion having a first segment and a second segment, the second segment of the third portion including a third external contact. The first portion, the second portion and the third portion can be physically separate from one another. The packaged semiconductor device can further include a first semiconductor die coupled with the first segment of the first portion and the first segment of the second portion and a second semiconductor die coupled with the first segment of the first portion and the first segment of the third portion. The packaged semiconductor device can further include a molding compound at least partially covering the leadframe, the first semiconductor die and the second semiconductor die.

Implementations can include one or more of the following features. For instance, the first semiconductor die can include a first discrete transistor having a first terminal coupled with the first segment of the first portion and a control terminal coupled with the first segment of the second portion. The second semiconductor die can include a second discrete transistor having a first terminal coupled with the first segment of the first portion and a control terminal coupled with the first segment of the third portion. The first segment of the first portion can define a common first terminal of the first discrete transistor and the second discrete transistor.

The first portion of the leadframe can define a common source terminal of a first discrete field effect transistor (FET) device included on the first semiconductor die and a second discrete FET device included on the second semiconductor die.

A surface of the first segment of the first portion can be exposed through the molding compound. A surface of the first segment of the second portion can be exposed through the molding compound. A surface of the first segment of the third portion can be exposed through the molding compound. A surface of the first semiconductor die can be exposed through the molding compound. A surface of the second semiconductor die can be exposed through the molding compound. The first external contact, the second external contact and the third external contact can be exposed through the molding compound.

The first segment of the first portion can include a first pillar and a second pillar. The first segment of the second portion can include a third pillar. The first segment of the third portion can include a fourth pillar. The first semiconductor die can be coupled with the leadframe on top surfaces of the first pillar and the third pillar using conductive contacts. The second semiconductor die can be coupled with the leadframe on top surfaces of the second pillar and the fourth pillar using conductive contacts.

At least a part of the first external contact can include a severed leadframe tie bar. At least a part of the second external contact can include a severed leadframe tie bar. At least a part of the third external contact can include a severed leadframe tie bar.

Some implementations may be implemented using various semiconductor processing and/or packaging techniques. Some implementations may be implemented using various types of semiconductor processing techniques associated with semiconductor substrates including, but not limited to, for example, Silicon (Si), Galium Arsenide (GaAs), Silicon Carbide (SiC), and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

The invention claimed is:

1. A package, comprising:
 a semiconductor die having a first terminal on a first side of the semiconductor die and a second terminal on a second side of the semiconductor die;
 a leadframe portion including:
  a die attach paddle, a first surface of the die attach paddle being electrically coupled to the second terminal of the semiconductor die; and
  a step-shaped portion extending from an end of the die attach paddle; and
 a molding compound,
 the first terminal on the first side of the semiconductor die, an exposed surface of the step-shaped portion, and a first surface of the molding compound being substantially coplanar and defining at least a portion of a first surface of the package,
 a second surface of the molding compound and a second surface of the die attach paddle defining at least a portion of a second surface of the package parallel to the first surface of the package, the second surface being on an opposite side of the package from the first surface of the package.

2. The package of claim 1, wherein the leadframe portion is a first leadframe portion, the package further comprising:
 a second leadframe portion electrically coupled to a third terminal on the second side of the semiconductor die, the second leadframe portion having a first surface included in the first surface of the package and having a second surface included in the second surface of the package.

3. The package of claim 1, wherein the leadframe portion is a first leadframe portion, the package further comprising:
 a second leadframe portion electrically coupled to a third terminal on the second side of the semiconductor die, the second leadframe portion being insulated from the first leadframe portion by at least a portion of the molding compound.

4. The package of claim 1, wherein the first surface of the package is a substantially planar surface, and the second surface of the package is a substantially planar surface.

5. The package of claim 1, further comprising:
a conductive contact disposed between the leadframe portion and the semiconductor die,
the leadframe portion being electrically coupled to the second terminal of the semiconductor die via the conductive contact.

6. The package of claim 1, wherein the first surface of the die attach paddle is aligned along a first plane, the second surface is aligned along a second plane and the exposed surface of the step-shaped is aligned along a third plane,
the first plane, the second plane and the third plane being parallel to one another and separated from one another.

7. The package of claim 1, wherein the leadframe portion has a surface defining a plurality of pillars and a plurality of recesses.

8. The package of claim 1, wherein the leadframe portion defines a pillar coupled to the semiconductor die via a conductive contact, the leadframe portion has a vertical segment extending contiguously from the first surface of the package to the second surface of the package,
the semiconductor die, the pillar, the conductive contact, and the leadframe portion defining a vertical stack having a thickness equal to a thickness of the vertical segment of the leadframe portion.

9. An apparatus, comprising:
a package having:
a first surface,
a second surface parallel to the first surface, the second surface being on a side of the package opposite the first surface, and
a third surface orthogonal to the first surface and orthogonal to the second surface;
a semiconductor die having a first terminal with a surface included in the first surface of the package and having a second terminal disposed in an interior portion of the package; and
a leadframe portion having:
a step-shaped portion including:
a first contact surface that is included in the first surface of the package, and
a second contact surface that is included in the third surface of the package;
a die attach paddle extending from the step-shaped portion, the die attach paddle having:
a first surface that is electrically coupled to the second terminal of the semiconductor die; and
a second surface, parallel to the first surface, that is included in a the second surface of the package,
the first contact surface of the step-shaped portion and the surface of the semiconductor die included in the first surface of the package being substantially coplanar.

10. The apparatus of claim 9, wherein the leadframe portion is a first leadframe portion,
the apparatus further comprising:
a second leadframe portion electrically coupled to a third terminal of the semiconductor die, the second leadframe portion having:
a first surface included in the first surface of the package;
a second surface included in the second surface of the package; and
a third surface included in the third surface of the package.

11. The apparatus of claim 9, wherein the leadframe portion is a first leadframe portion, the package having a fourth surface orthogonal to the first surface, to the second surface and to the third surface,
the apparatus further comprising:
a second leadframe portion electrically coupled to a third terminal of the semiconductor die, the second leadframe portion having:
a first surface included in the first surface of the package;
a second surface included in the second surface of the package; and
a third surface included the fourth surface of the package.

12. The apparatus of claim 9, wherein the third surface of the leadframe portion is associated with a tie bar of the leadframe portion.

13. The apparatus of claim 9, wherein the leadframe portion has a surface defining a plurality of pillars and a plurality of recesses.

14. The apparatus of claim 9, wherein the semiconductor die is a first semiconductor die,
the apparatus further comprising:
a second semiconductor die having a terminal electrically coupled to the leadframe portion.

15. The apparatus of claim 9, wherein the first terminal of the semiconductor die is a drain terminal of the semiconductor die.

16. An apparatus, comprising:
a package having a first surface on a first side and a second surface parallel to the first surface, the second surface being on a second side of the package opposite the first side of the package;
a first plurality of contact surfaces disposed within the first surface of the package, the first plurality of contacts including a semiconductor die contact and a leadframe step-portion contact, the semiconductor die contact and the leadframe step-portion contact being substantially coplanar;
a second plurality of contact surfaces disposed within the second surface of the package, the second plurality of contact surface including at least one leadframe contact; and
a semiconductor die including:
a first terminal electrically coupled to a first contact surface from the first plurality of contact surfaces and electrically coupled to a first contact surface from the second plurality of contact surfaces, and
a second terminal electrically coupled to a second contact surface from the first plurality of contact surfaces and electrically coupled to a second contact surface from the second plurality of contact surfaces.

17. The apparatus of claim 16, wherein the semiconductor die includes a third terminal disposed within the second surface of the package.

18. The apparatus of claim 16, further comprising:
a molding compound, at least a portion of the semiconductor die being included in the molding compound,
the first terminal being a source terminal of the semiconductor die,
the second terminal being a gate terminal of the semiconductor die, and
the semiconductor die including a drain terminal exposed through the molding compound.

19. The apparatus of claim 16, wherein the first plurality of contact surfaces defines a pattern different from a pattern defined by the second plurality of contact surfaces.

20. The apparatus of claim 16, wherein the first contact surface from the first plurality of contact surfaces and the first contact surface from the second plurality of contact surfaces are included in a first leadframe portion, and the second contact surface from the first plurality of contact surfaces and the second contact surface from the second plurality of contact surfaces are included in a second leadframe portion.

* * * * *